(12) United States Patent
Suzuki

(10) Patent No.: US 12,482,774 B2
(45) Date of Patent: Nov. 25, 2025

(54) SEMICONDUCTOR MEMORY DEVICE

(71) Applicant: Kioxia Corporation, Tokyo (JP)

(72) Inventor: Masato Suzuki, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 730 days.

(21) Appl. No.: 17/809,945

(22) Filed: Jun. 30, 2022

(65) Prior Publication Data

US 2023/0307394 A1 Sep. 28, 2023

(30) Foreign Application Priority Data

Feb. 22, 2022 (JP) ................................ 2022-026244

(51) Int. Cl.
| | | |
|---|---|---|
| *H01L 23/00* | (2006.01) | |
| *H01L 23/544* | (2006.01) | |
| *H01L 25/065* | (2023.01) | |
| *H01L 25/18* | (2023.01) | |

(52) U.S. Cl.
CPC ............ *H01L 24/08* (2013.01); *H01L 23/544* (2013.01); *H01L 25/0657* (2013.01); *H01L 25/18* (2013.01); *H01L 2223/5446* (2013.01); *H01L 2224/08145* (2013.01); *H01L 2924/1431* (2013.01); *H01L 2924/14511* (2013.01)

(58) Field of Classification Search
CPC ........... H01L 23/544; H01L 2223/5446; H01L 24/08; H01L 2224/08145; H01L 25/0657; H01L 25/18
See application file for complete search history.

(56) References Cited

U.S. PATENT DOCUMENTS 5,552,345 A * 9/1996 Schrantz ................. H01L 21/78
438/464
10,115,680 B2 10/2018 Kusakabe
10,276,585 B2 4/2019 Utsumi
(Continued)

FOREIGN PATENT DOCUMENTS

| FR | 3028328 A1 * | 5/2016 | ............. H01L 22/14 |
|---|---|---|---|
| JP | 2015-41743 A | 3/2015 | |
| JP | 2018-26518 A | 2/2018 | |

OTHER PUBLICATIONS

Machine translation, Arnaud, French Pat. Pub. No. FR 3028328A1, translation date: Mar. 29, 2205, Clarivate Analytics, all pages. (Year: 2025).*

*Primary Examiner* — Victoria K. Hall
(74) *Attorney, Agent, or Firm* — Oblon, McClelland, Maier & Neustadt, L.L.P.

(57) ABSTRACT

A semiconductor memory device includes a first wafer and a second wafer. The first wafer and the second wafer include memory regions, and kerf regions including a first region and a second region. The first wafer includes a semiconductor substrate, and electrodes. The electrodes are not disposed in the first region, or the semiconductor substrate has a surface on a side of the second wafer including a first portion disposed in the first region and a second portion, and the first portion is farther from the second wafer than the second portion. The second wafer includes layers including conductive layers. At least parts of the layers each include a third portion disposed in the second region and a fourth portion. The third portion is farther than the first wafer than the fourth portion. The first region does not overlap with the second region.

19 Claims, 91 Drawing Sheets

(56) References Cited

U.S. PATENT DOCUMENTS

| | | | |
|---|---|---|---|
| 10,504,852 B1* | 12/2019 | Chen | H01L 25/0657 |
| 12,364,029 B2* | 7/2025 | Shin | H10F 39/8063 |
| 2008/0191310 A1* | 8/2008 | Wu | H10D 84/038 |
| | | | 257/508 |
| 2015/0155263 A1* | 6/2015 | Farooq | H01L 24/29 |
| | | | 438/109 |
| 2018/0175006 A1* | 6/2018 | Yan | H01L 23/585 |
| 2021/0202456 A1* | 7/2021 | Kim | H01L 25/50 |
| 2022/0059481 A1* | 2/2022 | Shibata | H01L 25/0657 |
| 2022/0068829 A1* | 3/2022 | Park | H01L 23/544 |
| 2022/0085091 A1* | 3/2022 | Shin | H10F 39/809 |
| 2022/0285234 A1* | 9/2022 | Yokomizo | H01L 24/80 |
| 2023/0178493 A1* | 6/2023 | Huang | H01L 23/544 |
| | | | 257/734 |
| 2023/0402394 A1* | 12/2023 | Shan | H01L 25/18 |

* cited by examiner

SEMICONDUCTOR MEMORY DEVICE

CROSS-REFERENCE TO RELATED APPLICATIONS

This application is based upon and claims the benefit of Japanese Patent Application No. 2022-026244, filed on Feb. 22, 2022, the entire contents of which are incorporated herein by reference.

BACKGROUND

Field

Embodiments described herein relate generally to a semiconductor memory device.

Description of the Related Art

There has been known a semiconductor memory device that includes a substrate, a plurality of conductive layers stacked in a direction intersecting with a surface of this substrate, a semiconductor layer opposed to these plurality of conductive layers, and a gate insulating layer disposed between the conductive layers and the semiconductor layer. The gate insulating layer includes a memory portion that can store data, and the memory portion is, for example, an insulating electric charge accumulating layer of silicon nitride (SiN) or the like and a conductive electric charge accumulating layer, such as a floating gate.

DETAILED DESCRIPTION

Figure 1:
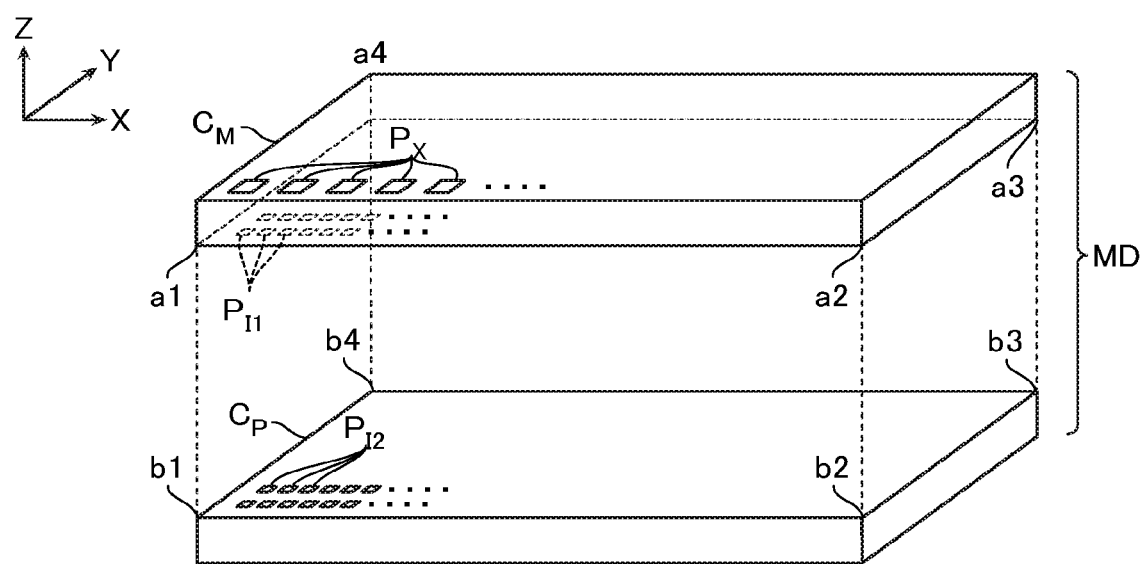
FIG. 1 is a schematic exploded perspective view illustrating an exemplary configuration of a semiconductor memory device according to a first embodiment.

A semiconductor memory device according to one embodiment comprises a first wafer and a second wafer bonded via a plurality of bonding electrodes. The first wafer and the second wafer include: a plurality of memory regions including a plurality of memory cell arrays or a plurality of peripheral circuits connected to the plurality of memory cell arrays; and a plurality of kerf regions each disposed between each two of the plurality of memory regions, the plurality of kerf regions including a first region and a second region not used for inputting/outputting a voltage or a signal to/from the memory cell array. The first wafer includes: a semiconductor substrate; and an electrode layer including a plurality of electrodes disposed in one of the plurality of memory regions, the plurality of electrodes being opposed to the semiconductor substrate in a first direction intersecting with a surface of the semiconductor substrate. The plurality of electrodes are not disposed in the first region, or the semiconductor substrate has a surface on a side of the second wafer including a first portion disposed in the first region and a second portion surrounding the first portion viewing from the first direction, the first portion is farther from the second wafer than the second portion is, and a step is disposed between the first portion and the second portion. The second wafer includes: a plurality of layers arranged in the first direction, the plurality of layers including a plurality of first conductive layers disposed in one memory region of the plurality of memory regions; and a plurality of semiconductor columns disposed in the one memory region, the plurality of semiconductor columns extending in the first direction, the plurality of semiconductor columns being opposed to the plurality of first conductive layers. A plurality of first layers as at least parts of the plurality of layers each include a third portion disposed in the second region and a fourth portion surrounding the third portion viewing from the first direction. The third portion is farther from the first wafer than the fourth portion is, and a step is disposed between the third portion and the fourth portion. The first region and the second region are disposed at positions where the first region and the second region do not overlap viewing from the first direction.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die after dicing and may mean a wafer before dicing. In the former case, it may mean a memory die after packaging and may mean a memory die before packaging. In the latter case, it may mean a wafer before bonding and may mean a wafer after bonding.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, when it is referred that a circuit or the like "electrically conducts" two wirings or the like, it may mean, for example, that this circuit or the like includes a transistor or the like, this transistor or the like is disposed in a current path between the two wirings, and this transistor or the like is turned ON.

In this specification, a predetermined direction parallel to a surface of the substrate is referred to as an X-direction, a direction parallel to the surface of the substrate and perpendicular to the X-direction is referred to as a Y-direction, and a direction perpendicular to the surface of the substrate is referred to as a Z-direction.

In this specification, a direction along a predetermined plane is referred to as a first direction, a direction intersecting with the first direction along this predetermined plane is referred to as a second direction, and a direction intersecting with this predetermined plane is referred to as a third direction in some cases. These first direction, second direction, and third direction may correspond to any of the X-direction, the Y-direction, and the Z-direction and do not need to correspond to these directions.

When expressions such as "upper" and "lower" are used in this specification, for example, among two chips or two wafers included in a memory die, a wafer, or the like, one provided with an external pad electrode connectable to a bonding wire may be an upper side and one not provided with such an external pad electrode may be a lower side. Furthermore, when referring to a configuration included in a memory die, a wafer, or the like, for example, a direction away from the semiconductor substrate included in the lower side wafer along the Z-direction may be referred to as above and a direction approaching the semiconductor substrate included in the lower side wafer along the Z-direction may be referred to as below. A lower surface and a lower end of a certain configuration may mean a surface and an end portion on the semiconductor substrate side included in the lower side wafer of this configuration. An upper surface and an upper end of a certain configuration may mean a surface and an end portion on a side opposite to the semiconductor substrate included in the lower side wafer of this configuration. A surface intersecting with the X-direction or the Y-direction may be referred to as a side surface and the like.

In this specification, when referring to a "width", a "length", a "thickness", or the like in a predetermined direction of a configuration, a member, or the like, this may mean a width, a length, a thickness, or the like in a cross-sectional surface or the like observed with a Scanning electron microscopy (SEM), a Transmission electron microscopy (TEM), or the like.

First Embodiment

[Structure of Memory Die MD]

FIG. 1 is a schematic exploded perspective view illustrating an exemplary configuration of a semiconductor memory device according to the embodiment. As illustrated in FIG. 1, a memory die MD includes a chip $C_M$ on a memory cell array side and a chip $C_P$ on a peripheral circuit side.

The Chip $C_M$ has an upper surface on which a plurality of external pad electrodes $P_X$ connectable to a plurality of bonding wires (not illustrated) are disposed. The chip $C_M$ has a lower surface on which a plurality of bonding electrodes $P_{I1}$ are disposed. The chip $C_P$ has an upper surface on which a plurality of bonding electrodes $P_{I2}$ are disposed. Hereinafter, for the chip $C_M$, a surface on which the plurality of bonding electrodes $P_{I1}$ are disposed is referred to as a front surface and a surface on which the plurality of external pad electrodes $P_X$ are disposed is referred to as a back surface. For the chip $C_P$, a surface on which the plurality of bonding electrodes $P_{I2}$ are disposed is referred to as a front surface and a surface on the opposite side of the front surface is referred to as a back surface. In the illustrated example, the front surface of the chip $C_P$ is arranged above the back surface of the chip $C_P$, and the back surface of the chip $C_M$ is arranged above the front surface of the chip $C_M$.

The chip $C_M$ and the chip $C_P$ are arranged such that the front surface of the chip $C_M$ is opposed to the front surface of the chip $C_P$. The plurality of bonding electrodes $P_{I1}$ are disposed corresponding to the respective plurality of bonding electrodes $P_{I2}$ and are arranged at positions bondable to the plurality of bonding electrodes $P_{I2}$. The bonding electrodes $P_{I1}$ and the bonding electrodes $P_{I2}$ function as bonding electrodes that bond the chip $C_M$ and the chip $C_P$ and electrically conduct them.

Note that, in the example in FIG. 1, the chip $C_M$ has corner portions a1, a2, a3, a4 that correspond to respective corner portions b1, b2, b3, b4 of the chip $C_P$.

Figure 2:
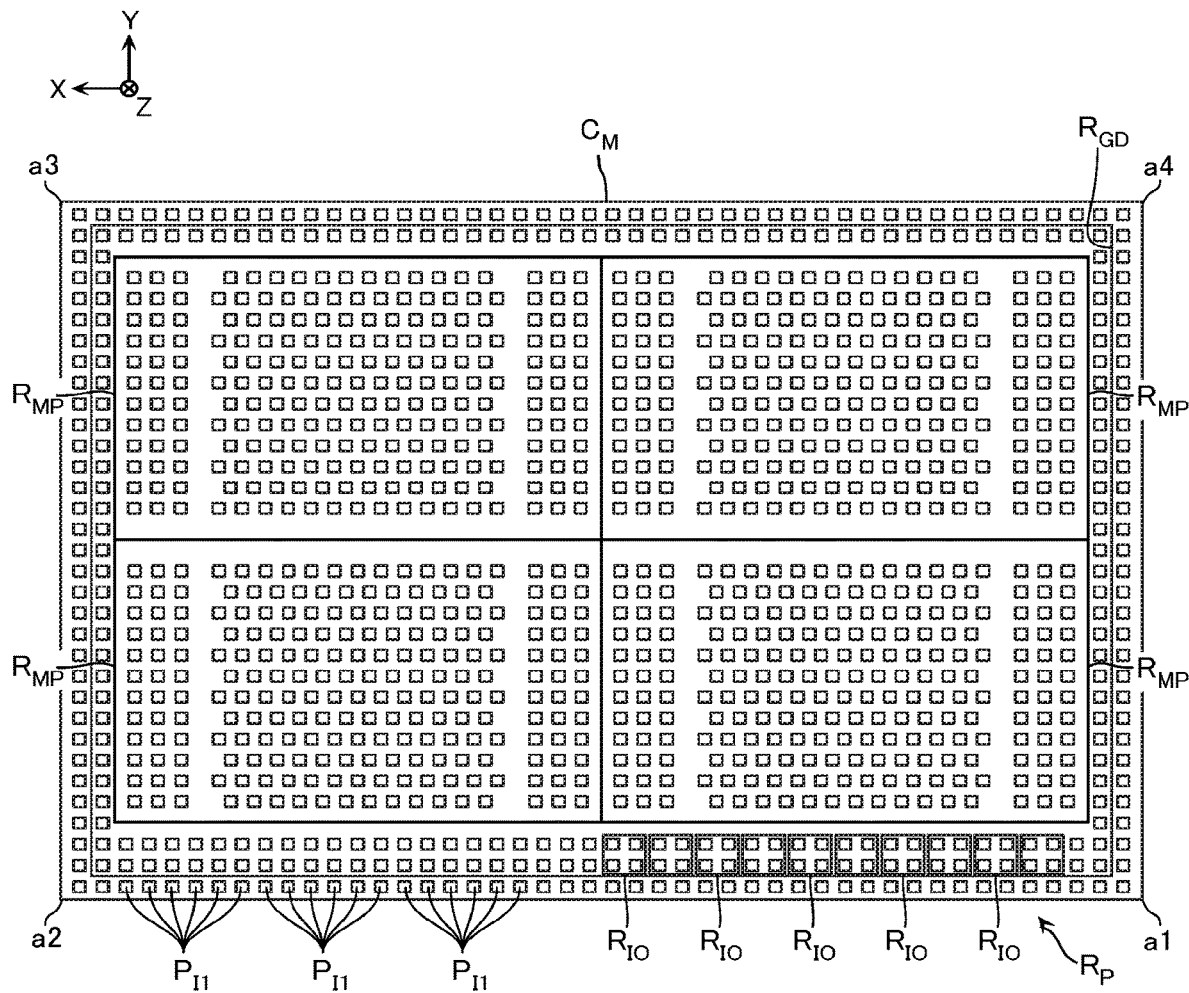
FIG. 2 is a schematic bottom view illustrating an exemplary configuration of a chip $C_M$.
Figure 3:
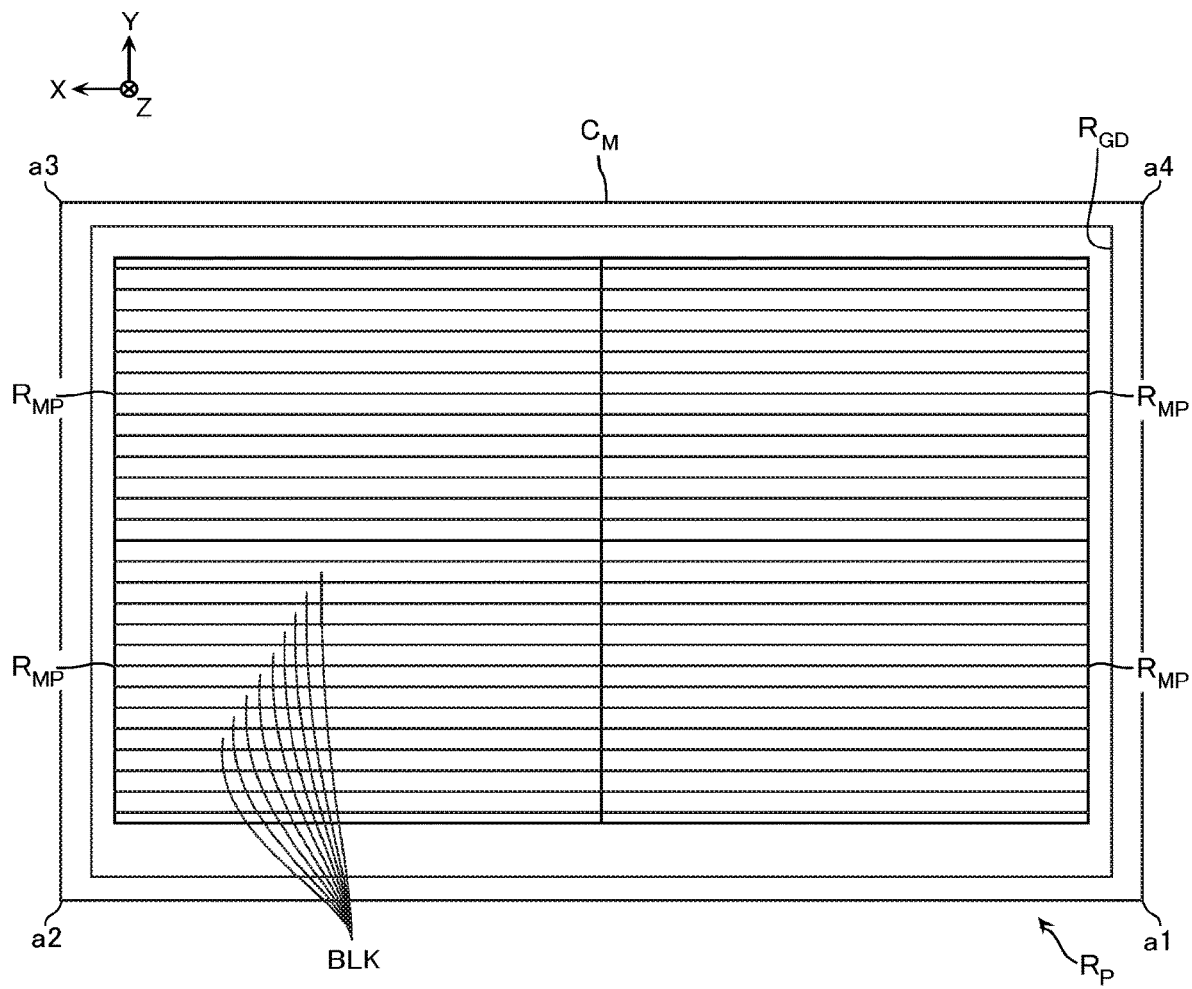
FIG. 3 is a schematic bottom view illustrating the exemplary configuration of the chip $C_M$.

FIG. 2 and FIG. 3 are schematic bottom views illustrating an exemplary configuration of the chip $C_M$.

Figure 4:
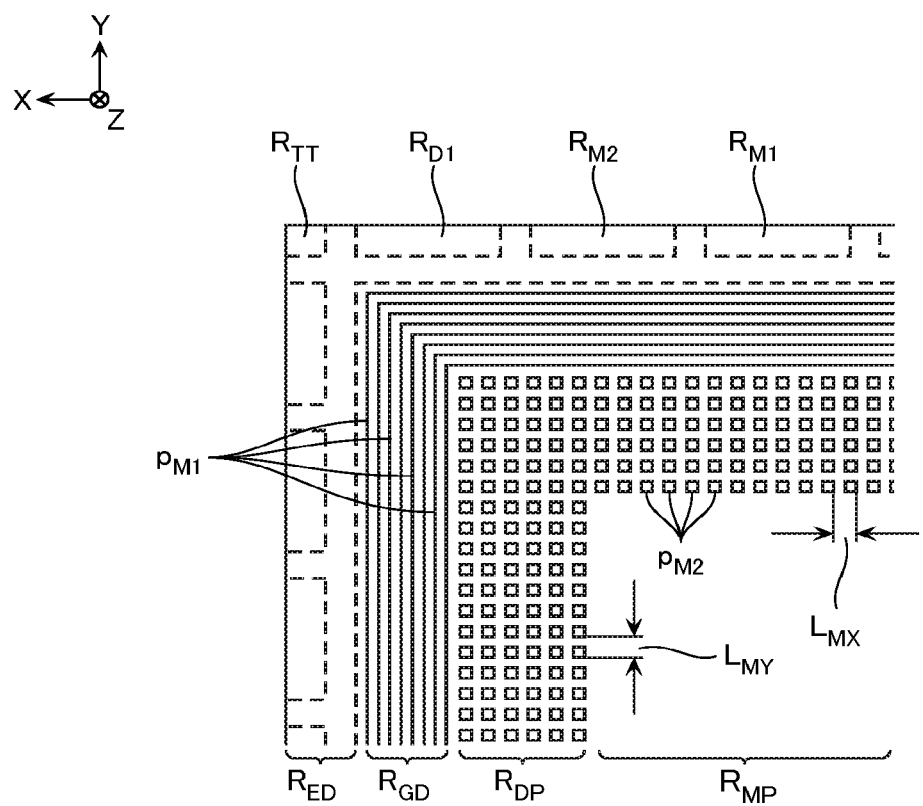
FIG. 4 is a schematic bottom view illustrating an enlarged part of FIG. 2.
Figure 5:
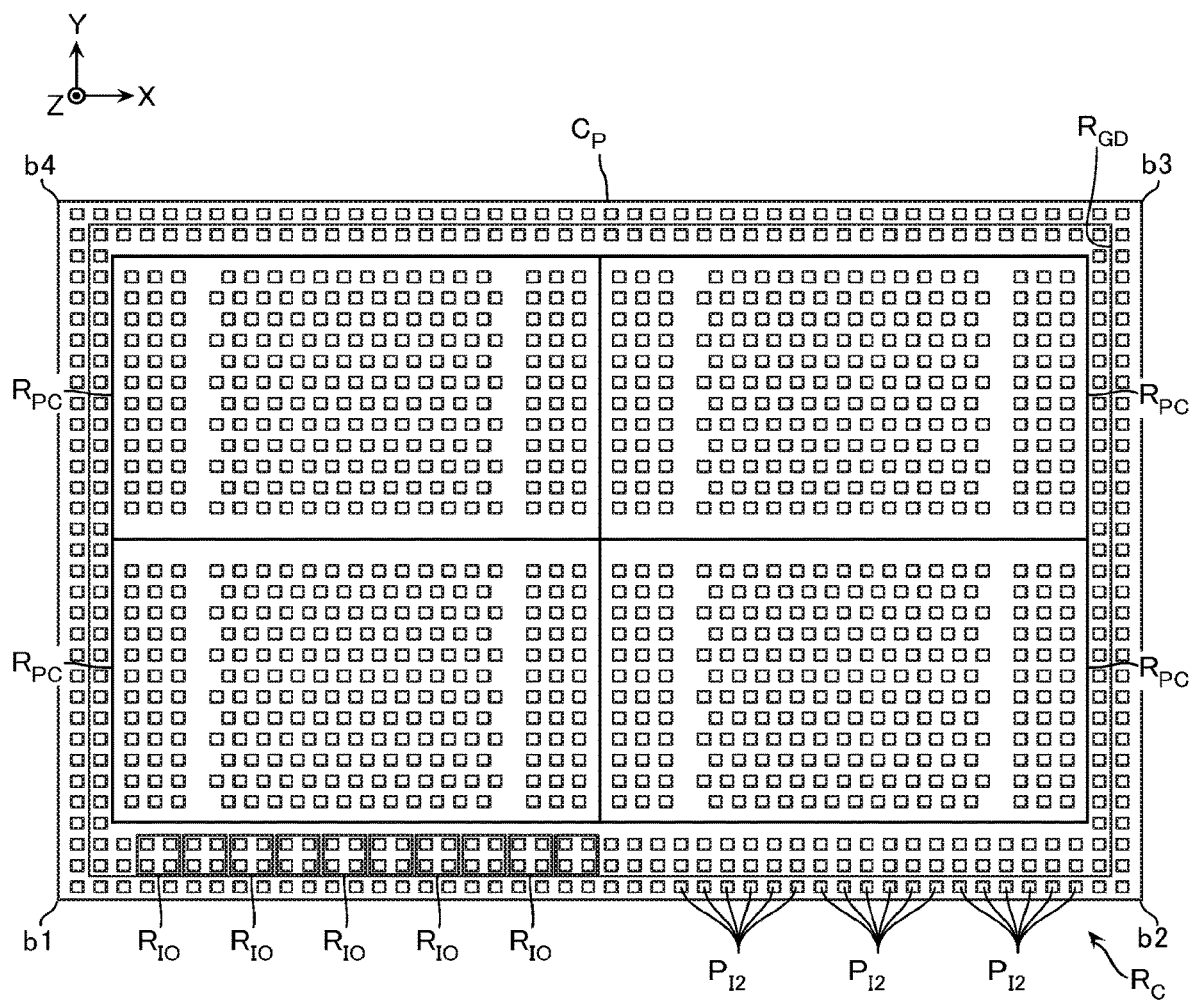
FIG. 5 is a schematic plan view illustrating an exemplary configuration of a chip $C_P$.
Figure 6:
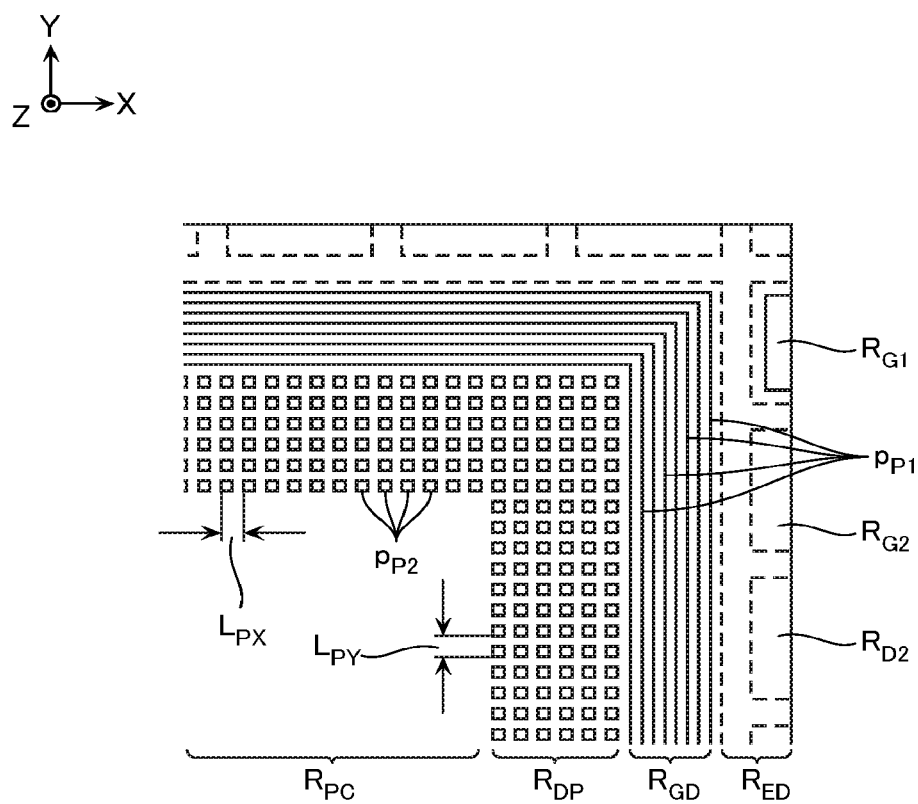
FIG. 6 is a schematic plan view illustrating an enlarged part of FIG. 5.
Figure 7:
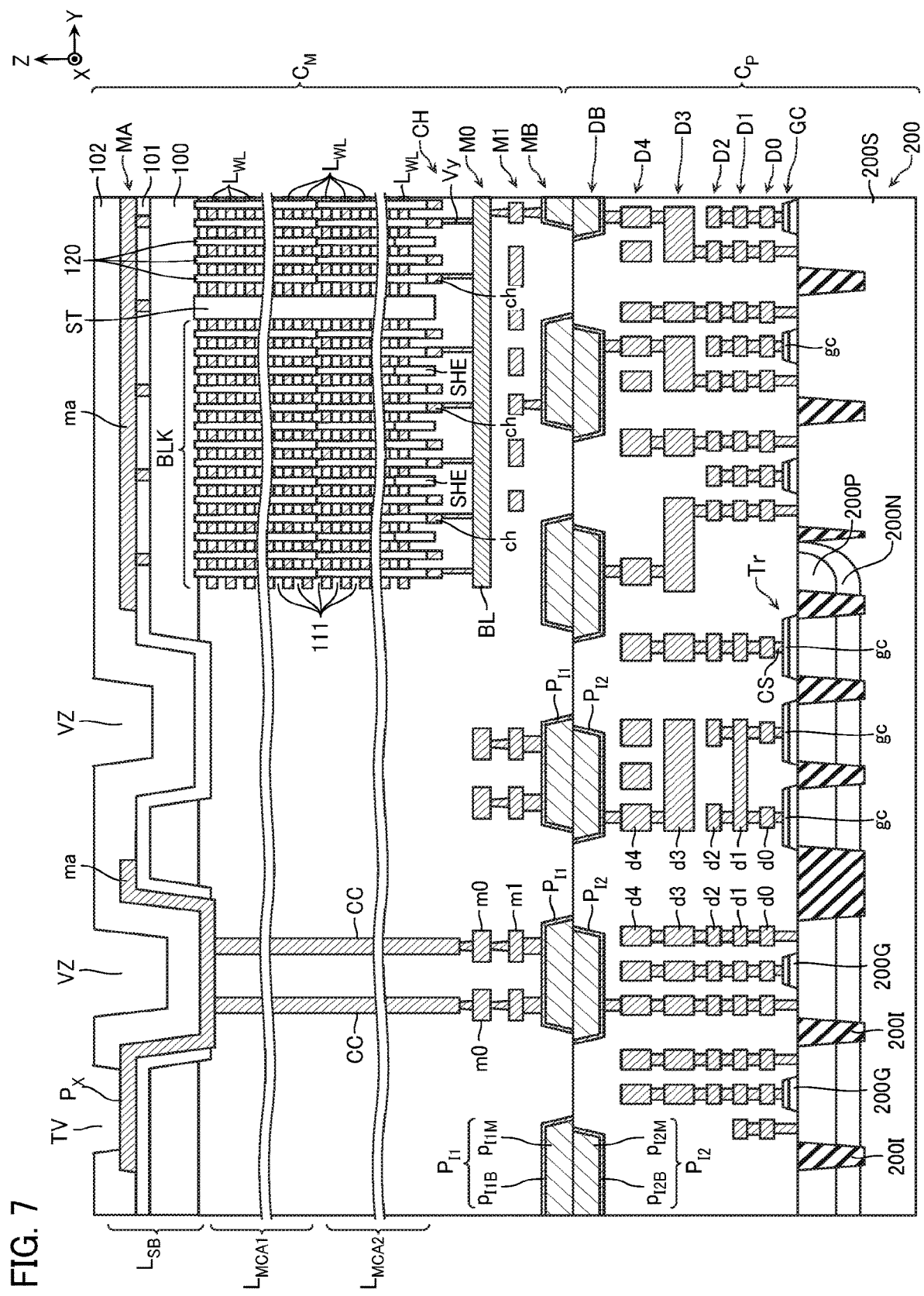
FIG. 7 is a schematic cross-sectional view illustrating a part of a configuration of a memory die MD.
Figure 8:
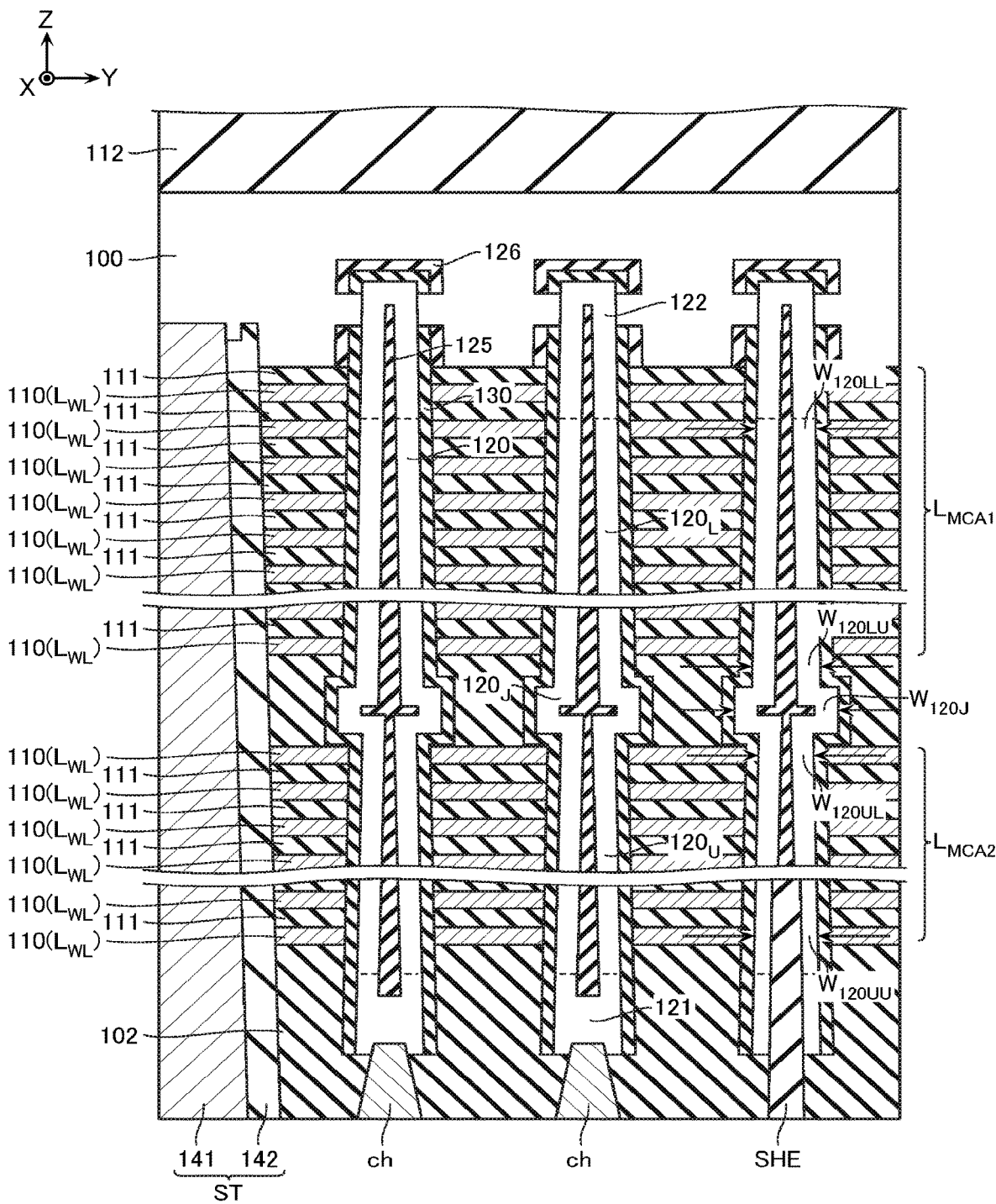
FIG. 8 is a schematic cross-sectional view illustrating an enlarged part of FIG. 7.
Figure 9:
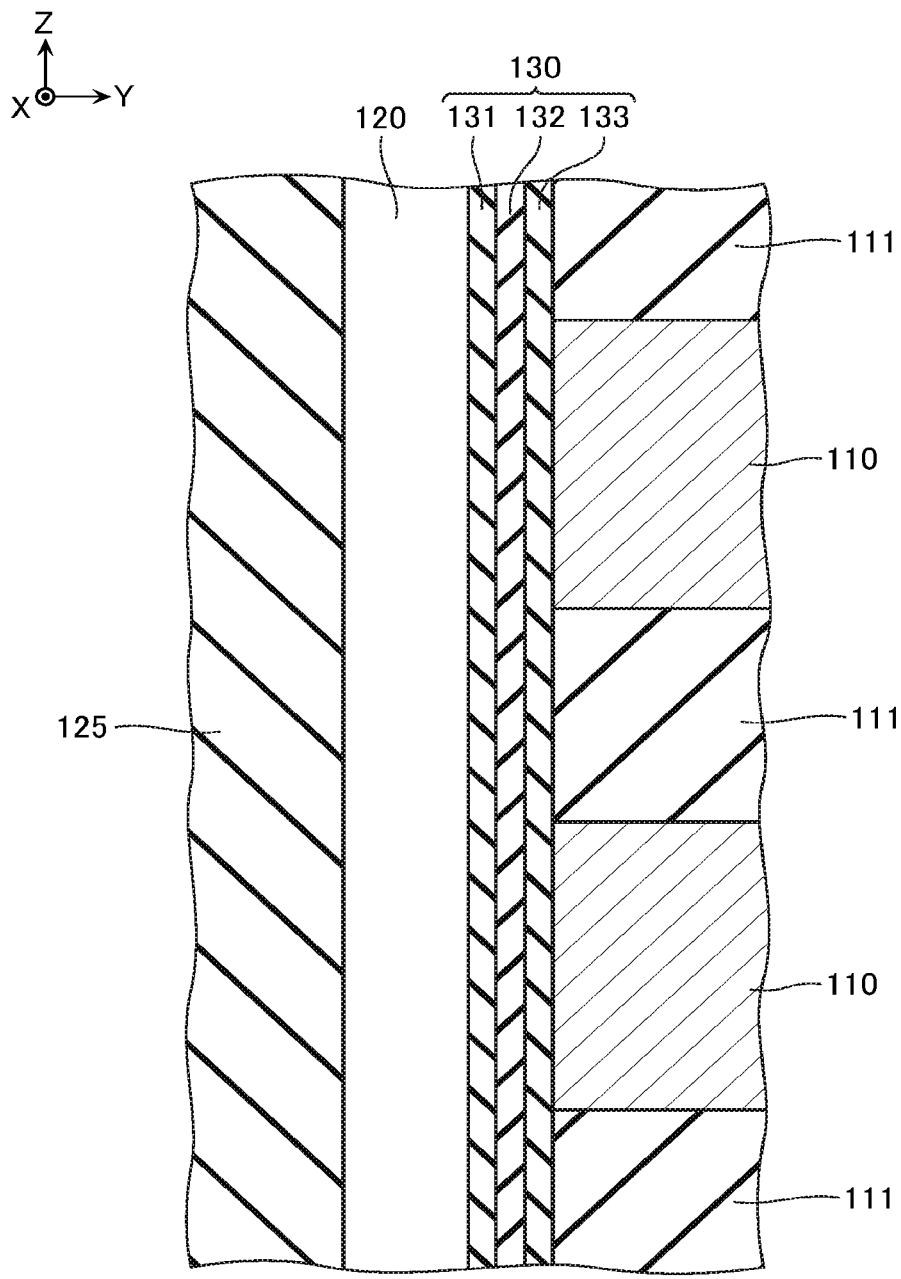
FIG. 9 is a schematic cross-sectional view illustrating an enlarged part of FIG. 8.

FIG. 3 omits a part of the configuration, such as the bonding electrodes $P_{I1}$. FIG. 4 is a schematic bottom view illustrating an enlarged part of FIG. 2. FIG. 4 illustrates a pattern applicable to wiring layers (wiring layers CH, M0, M1 described later) inside the chip $C_M$. FIG. 5 is a schematic plan view illustrating an exemplary configuration of the chip $C_P$. FIG. 6 is a schematic plan view illustrating an enlarged part of FIG. 5. FIG. 6 illustrates a pattern applicable to configurations (a surface of a semiconductor substrate 200 described later, an electrode layer GC described later, and wiring layers D0, D1, D2, D3, D4 described later) inside the chip $C_P$. FIG. 7 is a schematic cross-sectional view illustrating a part of a configuration of the memory die MD. FIG. 8 is a schematic cross-sectional view illustrating an enlarged part of FIG. 7. FIG. 9 is a schematic cross-sectional view illustrating an enlarged part of FIG. 8. Note that, while FIG. 9 illustrates a YZ cross-sectional surface, a structure similar to that in FIG. 9 is observed when a cross-sectional surface (such as an XZ cross-sectional surface) other than the YZ cross-sectional surface along a central axis of a semiconductor layer 120 is observed.

[Structure of Chip $C_M$]

The chip $C_M$ includes, for example, as illustrated in FIG. 2, four memory plane regions $R_{MP}$ arranged in the X-direction and the Y-direction. The chip $C_M$ includes a peripheral region $R_P$ disposed on one end side in the Y-direction with respect to the four memory plane regions $R_{MP}$. The peripheral region $R_P$ includes a plurality of input/output regions $R_{IO}$ arranged in the X-direction. The chip $C_M$ is provided with a guard ring region $R_{GD}$ that surrounds these four memory plane regions $R_{MP}$ and plurality of input/output regions $R_{IO}$. As illustrated in FIG. 4, outside of the guard ring region $R_{GD}$, an edge region $R_{ED}$ is disposed. Between the guard ring region $R_{GD}$ and the memory plane regions $R_{MP}$, a dummy pattern region $R_{DP}$ is disposed.

The chip $C_M$ includes, for example, as illustrated in FIG. 7, a substrate body structure $L_{SB}$, memory cell array layers $L_{MCA1}$, $L_{MCA2}$ disposed below the substrate body structure $L_{SB}$, and a plurality of wiring layers CH, M0, M1, MB that are disposed below the memory cell array layers $L_{MCA1}$, $L_{MCA2}$ and have mutually different levels. The memory cell array layers $L_{MCA1}$, $L_{MCA2}$ each include a plurality of word line layers $L_{ML}$ arranged in the Z-direction. Between the plurality of word line layers $L_{WL}$ arranged in the Z-direction, insulating layers 111 of silicon oxide ($SiO_2$) or the like are disposed.

[Structure of Substrate Body Structure $L_{SB}$ of Chip $C_M$]

For example, as illustrated in FIG. 7, the substrate body structure $L_{SB}$ includes a conductive layer 100 disposed on an upper surface of the memory cell array layer $L_{MCA1}$, an insulating layer 101 disposed on an upper surface of the conductive layer 100, a back side wiring layer MA disposed on an upper surface of the insulating layer 101, and an insulating layer 102 disposed on an upper surface of the back side wiring layer MA.

The conductive layer 100, for example, may include a semiconductor layer of, for example, silicon (Si) to which N-type impurities, such as phosphorus (P), or P-type impurities, such as boron (B), are implanted, may contain metal, such as tungsten (W), or may contain silicide, such as tungsten silicide (WSi).

The conductive layer 100 functions as a part of a source line of a NAND flash memory. Four conductive layers 100 are disposed corresponding to the four memory plane regions $R_{MP}$ (FIG. 2) arranged in the X-direction and the Y-direction. The memory plane regions $R_{MP}$ have end portions in the X-direction and Y-direction where regions VZ that do not include the conductive layer 100 are disposed.

The insulating layer 101 contains, for example, silicon oxide ($SiO_2$).

The back side wiring layer MA includes a plurality of wirings ma. These plurality of wirings ma may contain, for example, aluminum (Al).

Parts of the plurality of wirings ma functions as parts of the source lines of the NAND flash memory. Four wirings ma are disposed corresponding to the four memory plane regions $R_{MP}$ (FIG. 2) arranged in the X-direction and the Y-direction. These wirings ma are electrically connected to the respective conductive layers 100.

Parts of the plurality of wirings ma function as the external pad electrodes $P_X$. The plurality of these wirings ma are disposed corresponding to the plurality of input/output regions $R_{IO}$(FIG. 2) arranged in the X-direction. These wirings ma are connected to via-contact electrodes CC in the memory cell array layers $L_{MCA1}$, $L_{MCA2}$ in the regions VZ not including the conductive layer 100. Parts of the wirings ma are exposed to the outside of the memory die MD via openings TV provided in the insulating layer 102.

The insulating layer 102 is a passivation layer containing, for example, a resin material, such as polyimide, in an upper layer.

[Structures of Memory Cell Array Layers $L_{MCA1}$, $L_{MCA2}$ of Chip $C_M$ in Memory Plane Region $R_{MP}$]

For example, as illustrated in FIG. 3, in the memory cell array layers $L_{MCA1}$, $L_{MCA2}$, a plurality of memory blocks BLK arranged in the Y-direction are disposed. As illustrated in FIG. 7, between two memory blocks BLK adjacent in the Y-direction, an inter-block structure ST is disposed.

The memory block BLK includes, for example, as illustrated in FIG. 8, a plurality of conductive layers 110 arranged in the Z-direction corresponding to the plurality of word line layers $L_{WL}$, a plurality of semiconductor layers 120 extending in the Z-direction, a respective plurality of gate insulating films 130 disposed between the plurality of conductive layers 110 and the plurality of semiconductor layers 120.

The conductive layer 110 has an approximately plate shape extending in the X-direction. The conductive layer 110 may include, for example, a stacked film of a barrier conductive film of, for example, titanium nitride (TiN) and a metal film of, for example, tungsten (W). The conductive layer 110 may contain, for example, polycrystalline silicon containing impurities, such as phosphorus (P) or boron (B).

Among the plurality of conductive layers 110, one or a plurality of conductive layers 110 positioned as the uppermost layer function as a select gate line of the NAND flash memory and gate electrodes of a plurality of select transistors connected to the select gate line. These plurality of conductive layers 110 are electrically independent in every memory block BLK.

A plurality of conductive layers 110 positioned below them function as word lines of the NAND flash memory and gate electrodes of a plurality of memory cells (memory transistors) connected to the word line. These plurality of conductive layers 110 are each electrically independent in every memory block BLK.

One or a plurality of conductive layers 110 positioned below them function as a select gate line of the NAND flash memory and gate electrodes of a plurality of select transistors connected to the select gate line. These plurality of conductive layers 110 have widths in the Y-direction smaller than those of the other conductive layers 110. Between two conductive layers 110 adjacent in the Y-direction, an insulating layer SHE of, for example, silicon oxide ($SiO_2$) is disposed.

The semiconductor layers 120 are arranged in a predetermined pattern in the X-direction and the Y-direction. The semiconductor layers 120 function as channel regions of the memory cells and the select transistors of the NAND flash memory. The semiconductor layer 120 contains, for example, polycrystalline silicon (Si). The semiconductor layer 120 has an approximately cylindrical shape and has a center portion provided with an insulating layer 125 of, for example, silicon oxide.

The semiconductor layer 120 includes a semiconductor region $120_L$ included in the memory cell array layer $L_{MCA1}$ and a semiconductor region $120_U$ included in the memory cell array layer $L_{MCA2}$. The semiconductor layer 120 includes a semiconductor region $120_J$ connected to a lower end of the semiconductor region $120_L$ and an upper end of the semiconductor region $120_U$, an impurity region 122 connected to an upper end of the semiconductor region $120_L$, and an impurity region 121 connected to a lower end of the semiconductor region $120_U$.

The semiconductor region $120_L$ has an approximately cylindrical shape extending in the Z-direction. The semiconductor region $120_L$ has an outer peripheral surface surrounded by the plurality of conductive layers 110 each included in the memory cell array layer $L_{MCA1}$ and is opposed to these plurality of conductive layers 110. Note that the semiconductor region $120_L$ has a width $W_{120LL}$ in a diameter direction at an upper end portion smaller than a width $W_{120LU}$ in the diameter direction at a lower end of the semiconductor region $120_L$.

The semiconductor region $120_U$ has an approximately cylindrical shape extending in the Z-direction. The semiconductor region $120_U$ has an outer peripheral surface surrounded by the plurality of conductive layers 110 each included in the memory cell array layer $L_{MCA2}$ and is opposed to these plurality of conductive layers 110. Note that the semiconductor region $120_U$ has a width $W_{120UL}$ in a diameter direction at an upper end portion smaller than a width $W_{120UU}$ in the diameter direction at a lower end of the semiconductor region $120_U$ and the above-described width $W_{120LU}$.

The semiconductor region $120_J$ is disposed below the plurality of conductive layers 110 each included in the memory cell array layer $L_{MCA1}$ and is disposed above the plurality of conductive layers 110 included in the memory cell array layer $L_{MCA2}$. Note that the semiconductor region 120 has a width $W_{120J}$ in a diameter direction larger than the above-described widths $W_{120LU}$, $W_{120UU}$.

The impurity region 122 is connected to the above-described conductive layer 100. In the example in FIG. 8, a boundary line between the semiconductor region $120_L$ and the impurity region 122 is indicated by a dashed line. The impurity region 122 contains, for example, N-type impurities, such as phosphorus (P), or P-type impurities, such as boron (B).

The impurity region 121 contains, for example, N-type impurities, such as phosphorus (P). In the example in FIG. 8, a boundary line between the semiconductor region $120_U$ and the impurity region 121 is indicated by a dashed line. The impurity region 121 is connected to a bit line BL via a via-contact electrode ch and a via-contact electrode Vy (FIG. 7).

The gate insulating film 130 has an approximately cylindrical shape covering the outer peripheral surface of the semiconductor layer 120. The gate insulating film 130 includes a tunnel insulating film 131, an electric charge accumulating film 132, and a block insulating film 133 stacked between the semiconductor layer 120 and the conductive layers 110, for example, as illustrated in FIG. 9. The tunnel insulating film 131 and the block insulating film 133 contain, for example, silicon oxide ($SiO_2$). The electric charge accumulating film 132 includes, for example, a film that can accumulate electric charge, such as of silicon nitride (SiN). The tunnel insulating film 131, the electric charge accumulating film 132, and the block insulating film 133 have approximately cylindrical shapes, and extend in the Z-direction along the outer peripheral surface of the semiconductor layer 120 excluding a contact portion between the semiconductor layer 120 and the conductive layer 100. As illustrated in FIG. 8, between the gate insulating film 130 and the conductive layer 100, an insulating layer 126 of, for example, silicon oxide ($SiO_2$) is disposed.

Note that FIG. 9 illustrates the example in which the gate insulating film 130 includes the electric charge accumulating film 132 of, for example, silicon nitride. However, the gate insulating film 130 may include a floating gate of, for example, polycrystalline silicon containing, for example, N-type or P-type impurities.

The inter-block structure ST includes, for example, as illustrated in FIG. 8, a conductive layer 141 extending in the Z-direction and in the X-direction, and an insulating layer 142 disposed on a side surface of the conductive layer 141. The conductive layer 141 is connected to the conductive layer 100. The conductive layer 141 may include, for example, a stacked film of a barrier conductive film of, for example, titanium nitride (TiN) and a metal film of, for example, tungsten (W). The conductive layer 141 functions, for example, as a part of the source line of the NAND flash memory.

[Structure of Memory Cell Array Layers $L_{MCA1}$, $L_{MCA2}$ of Chip $C_M$ in Peripheral Region $R_P$]

In the peripheral region $R_P$, for example, as illustrated in FIG. 7, the plurality of via-contact electrodes CC are disposed corresponding to the external pad electrodes $P_X$. These plurality of via-contact electrodes CC are connected to the wirings ma that function as the external pad electrodes $P_X$ at upper ends.

[Structure of Wiring Layers CH, M0, M1, MB of Chip $C_M$]

For example, as illustrated in FIG. 7, the plurality of wirings included in the wiring layers CH, M0, M1, MB are, for example, electrically connected to at least one of the configurations of the memory cell array layers $L_{MCA1}$, $L_{MCA2}$ and the configuration inside the chip $C_P$.

The wiring layer CH includes the plurality of via-contact electrodes ch as the plurality of wirings. These plurality of via-contact electrodes ch may include, for example, a stacked film of a barrier conductive film of, for example, titanium nitride (TiN) and a metal film of, for example, tungsten (W). The via-contact electrodes ch are disposed corresponding to the plurality of semiconductor layers 120, and are connected to the lower ends of the plurality of semiconductor layers 120.

The wiring layer M0 includes a plurality of wirings m0. These plurality of wirings m0 may include, for example, a stacked film of a barrier conductive film of, for example, titanium nitride (TiN) and a metal film of, for example, copper (Cu). Note that parts of the plurality of wirings m0 function as the bit lines BL. The bit lines BL, for example, are arranged in the X-direction and extend in the Y-direction.

The wiring layer M1, for example, as illustrated in FIG. 7, includes a plurality of wirings m1. These plurality of wirings m1 may include, for example, a stacked film of a barrier conductive film of, for example, titanium nitride (TiN) and a metal film of, for example, tungsten (W).

The wiring layer MB includes the plurality of bonding electrodes $P_1$. These plurality of bonding electrodes $P_{f1}$ may include, for example, a stacked film of a barrier conductive film $p_{f1B}$ of, for example, titanium nitride (TiN) and a metal film $p_{f1M}$ of, for example, copper (Cu).

Note that, as illustrated in FIG. 4, in the guard ring region $R_{GD}$, the wiring layers CH, M0, M1 may be formed with line and space patterns $p_{M1}$ extending along four sides of the memory die MD. In the dummy pattern region $R_{DP}$, the wiring layers CH, M0, M1 may be formed with a plurality of island-shaped dummy patterns $p_{M2}$ arranged in the X-direction and the Y-direction. FIG. 4 exemplary illustrates the plurality of dummy patterns $p_{M2}$ arranged at a pitch $L_{MX}$ in the X-direction and arranged at a pitch $L_{MY}$ in the Y-direction. The wiring layer MB may be formed with at least parts of the line and space patterns $p_{M1}$.

[Structure of Chip $C_P$]

The chip $C_P$, for example, as illustrated in FIG. 5, includes four peripheral circuit regions $R_{PC}$ arranged in the X and Y-directions corresponding to the memory plane regions $R_{MP}$. The chip $C_P$ includes a circuit region $R_C$ disposed in a region opposed to the peripheral region $R_P$. The circuit region $R_C$ includes the plurality of input/output regions $R_{IO}$ arranged in the X-direction. The chip $C_P$ is provided with the guard ring region $R_{GD}$ surrounding these four peripheral circuit regions $R_P c$ and the input/output regions $R_{IO}$. As illustrated in FIG. 6, outside of the guard ring region $R_{GD}$, the edge region $R_{ED}$ is disposed. Between the guard ring region $R_{GD}$ and the peripheral circuit regions $R_{PC}$, the dummy pattern region $R_{DP}$ is disposed.

The chip $C_P$ includes, for example, as illustrated in FIG. 7, the semiconductor substrate 200, an electrode layer GC disposed above the semiconductor substrate 200, and a plurality of wiring layers D0, D1, D2, D3, D4, DB that are disposed above the electrode layer GC and have mutually different levels.

[Structure of Semiconductor Substrate 200 of Chip $C_P$]

The semiconductor substrate 200 contains, for example, P-type silicon (Si) containing P-type impurities, such as boron (B). The semiconductor substrate 200 has a surface on which, for example, an N-type well region 200N containing N-type impurities, such as phosphorus (P), a P-type well region 200P containing P-type impurities, such as boron (B), a semiconductor substrate region 200S not provided with the N-type well region 200N or the P-type well region 200P, and an insulating region 200I are disposed. The N-type well region 200N, the P-type well region 200P, and the semiconductor substrate region 200S each function as parts of a plurality of transistors Tr configuring the peripheral circuit, a plurality of capacitors, and the like.

Note that, as illustrated in FIG. 6, in the guard ring region $R_{GD}$, the surface of the semiconductor substrate 200 may be formed with line and space patterns $p_{P1}$ extending along the four sides of the memory die MD using the semiconductor substrate region 200S and the insulating region 200I. In the dummy pattern region $R_{DP}$ (FIG. 6), the surface of the semiconductor substrate 200 may be formed with a plurality of island-shaped dummy patterns $p_{P2}$ arranged in the X-direction and in the Y-direction. FIG. 6 illustrates the plurality of dummy patterns $p_{P2}$ arranged at a pitch $L_{PX}$ in the X-direction and arranged at a pitch $L_{PY}$ in the Y-direction.

[Structure of Electrode Layer GC of Chip $C_P$]

For example, as illustrated in FIG. 7, the electrode layer GC is disposed on an upper surface of the semiconductor substrate 200 via insulating layers 200G. The electrode layer GC includes a plurality of electrodes gc opposed to the surface of the semiconductor substrate 200 in the Z-direction. Each of the regions of the semiconductor substrate 200 and the plurality of electrodes gc included in the electrode layer GC are each connected to a via-contact electrode CS.

The N-type well region 200N, the P-type well region 200P, and the semiconductor substrate region 200S of the semiconductor substrate 200 each function as channel regions of the plurality of transistors Tr, ones of the electrodes of the plurality of capacitors, and the like configuring the peripheral circuit.

The plurality of electrodes gc included in the electrode layer GC each function as gate electrodes of the plurality of transistors Tr, the other electrodes of the plurality of capacitors, and the like configuring the peripheral circuit.

The via-contact electrode CS extends in the Z-direction and is connected to the semiconductor substrate 200 or the upper surface of the electrode gc at a lower end. A connecting portion between the via-contact electrode CS and the semiconductor substrate 200 is provided with an impurity region containing the N-type impurities or the P-type impurities. The via-contact electrode CS may include, for example, a stacked film of a barrier conductive film of, for example, titanium nitride (TiN) and a metal film of, for example, tungsten (W).

Note that, the electrode layer GC may also be formed with the patterns $p_{P1}$, $p_{P2}$ described with reference to FIG. 6.

[Structure of Wiring Layers D0, D1, D2, D3, D4, DB of Chip CE]

For example, as illustrated in FIG. 7, the plurality of wirings included in the wiring layers D0, D1, D2, D3, D4, DB are, for example, electrically connected to at least one of the configurations of the memory cell array layers $L_{MCA1}$, $L_{MCA2}$ and the configuration in the chip $C_P$.

The wiring layers D0, D1, D2 include a respective plurality of wirings d0, d1, d2. These plurality of wirings d0, d1, d2 may include, for example, a stacked film of a barrier conductive film of, for example, titanium nitride (TiN) and a metal film of, for example, tungsten (W).

The wiring layers D3, D4 include a respective plurality of wirings d3, d4. These plurality of wirings d3, d4 may include, for example, a stacked film of a barrier conductive film of, for example, titanium nitride (TiN) and a metal film of, for example, copper (Cu).

The wiring layer DB includes the plurality of bonding electrodes $P_{f2}$. These plurality of bonding electrodes $P_{f2}$ may include for example, a stacked film of a barrier conductive film $P_{f2B}$ of, for example, titanium nitride (TiN) and a metal film $P_{f2M}$ of, for example, copper (Cu).

Here, if the metal films $p_{f1M}$, $P_{f2M}$ of, for example, copper (Cu) are used for the bonding electrode $P_1$ and the bonding electrode $P_{f2}$, the metal film $p_{f1M}$ and the metal film $p_{f2M}$ become one metal film, which makes it difficult to confirm the boundary from one another. However, a distortion of a shape of the bonding electrodes $P_1$ and the bonding electrodes $P_{f2}$ caused by a misalignment of bonding and a misalignment of the barrier conductive films $p_{f1B}$, $P_{f2B}$ (generation of discontinuous portions on side surfaces) ensure confirming the bonding structure. When the bonding electrodes $P_{f1}$ and the bonding electrodes $P_{f2}$ are formed by damascene method, the respective side surfaces have tapered shapes. In view of this, a shape of a cross-sectional surface along the Z-direction in a portion where the bonding electrodes $P_{f1}$ and the bonding electrodes $P_{f2}$ are bonded has a non-rectangular shape with a sidewall not providing a straight line. When the bonding electrodes $P_{f1}$ and the bonding electrodes $P_{f2}$ are bonded, there is provided a structure in which the bottom surface, side surfaces, and upper surface of the respective Cu forming them are covered with the barrier metal. In contrast to this, in the wiring layer using a typical Cu, an insulating layer (SiN, SiCN, or the like) having a Cu oxidation prevention function is disposed on the upper surface of the Cu, and no barrier metal is disposed on the upper surface. In view of this, it is possible to distinguish from the general wiring layer even without the misalignment in bonding.

Note that the wiring layers D0, D1, D2, D3, D4 may be formed with the patterns $p_{P1}$, $p_{P2}$ described with reference to FIG. 6. The wiring layer DB may be formed with at least parts of the patterns $p_{P1}$ described with reference to FIG. 6.

[Manufacturing Method]

Figure 10:
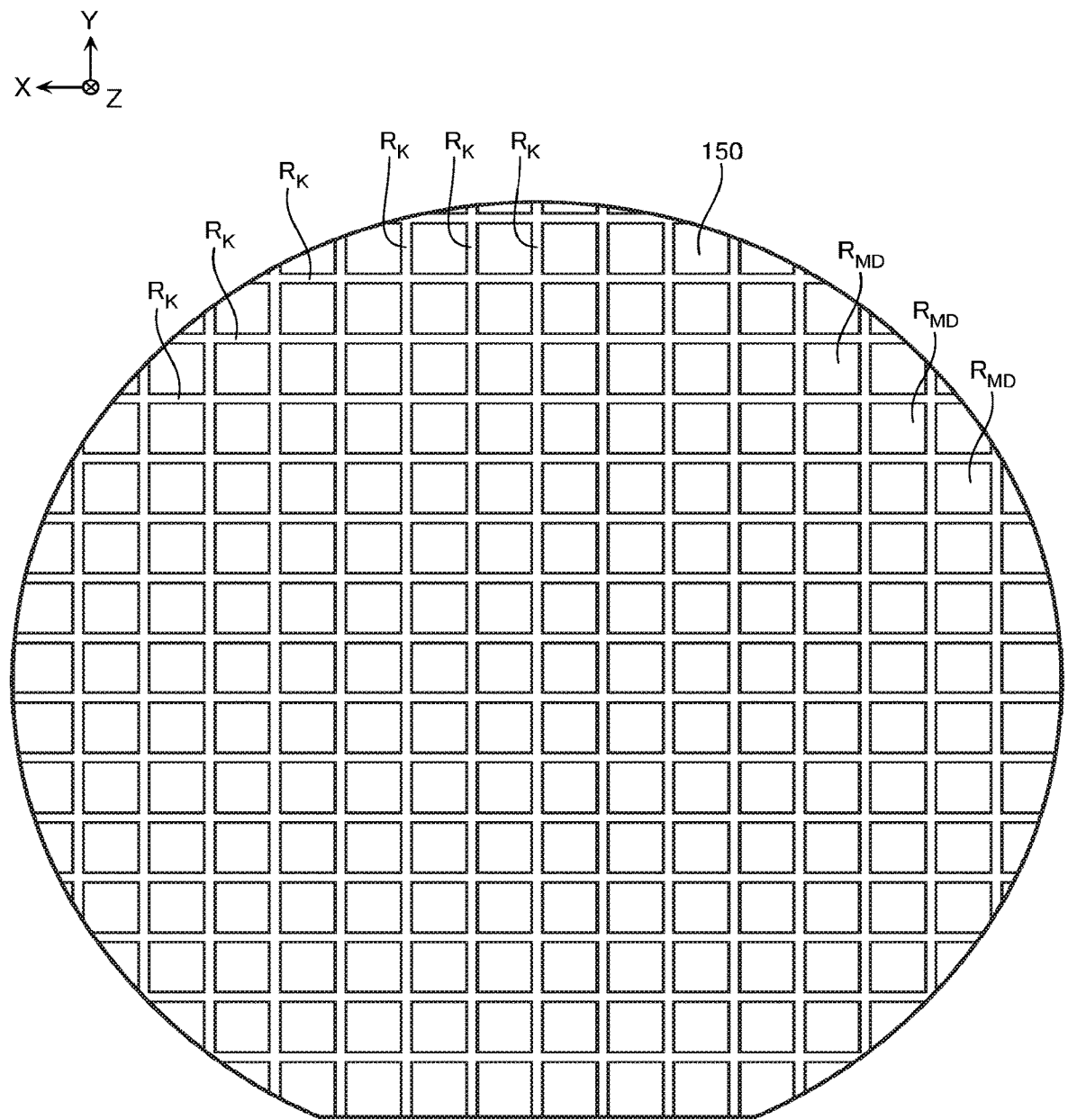
FIG. 10 is a schematic bottom view for describing a method for manufacturing the semiconductor memory device according to the first embodiment.
Figure 11:
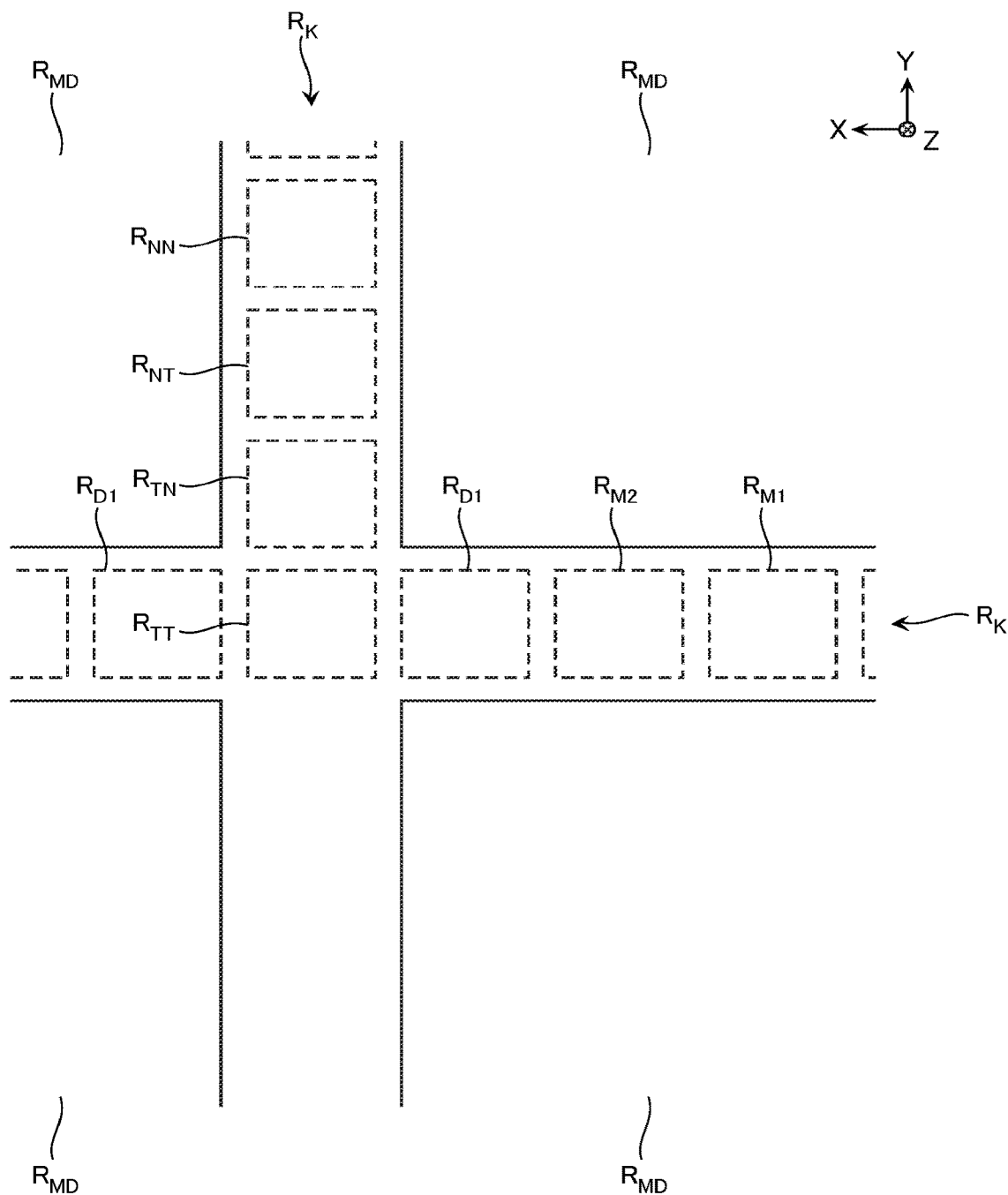
FIG. 11 is a schematic bottom view for describing the same manufacturing method.
Figure 43:
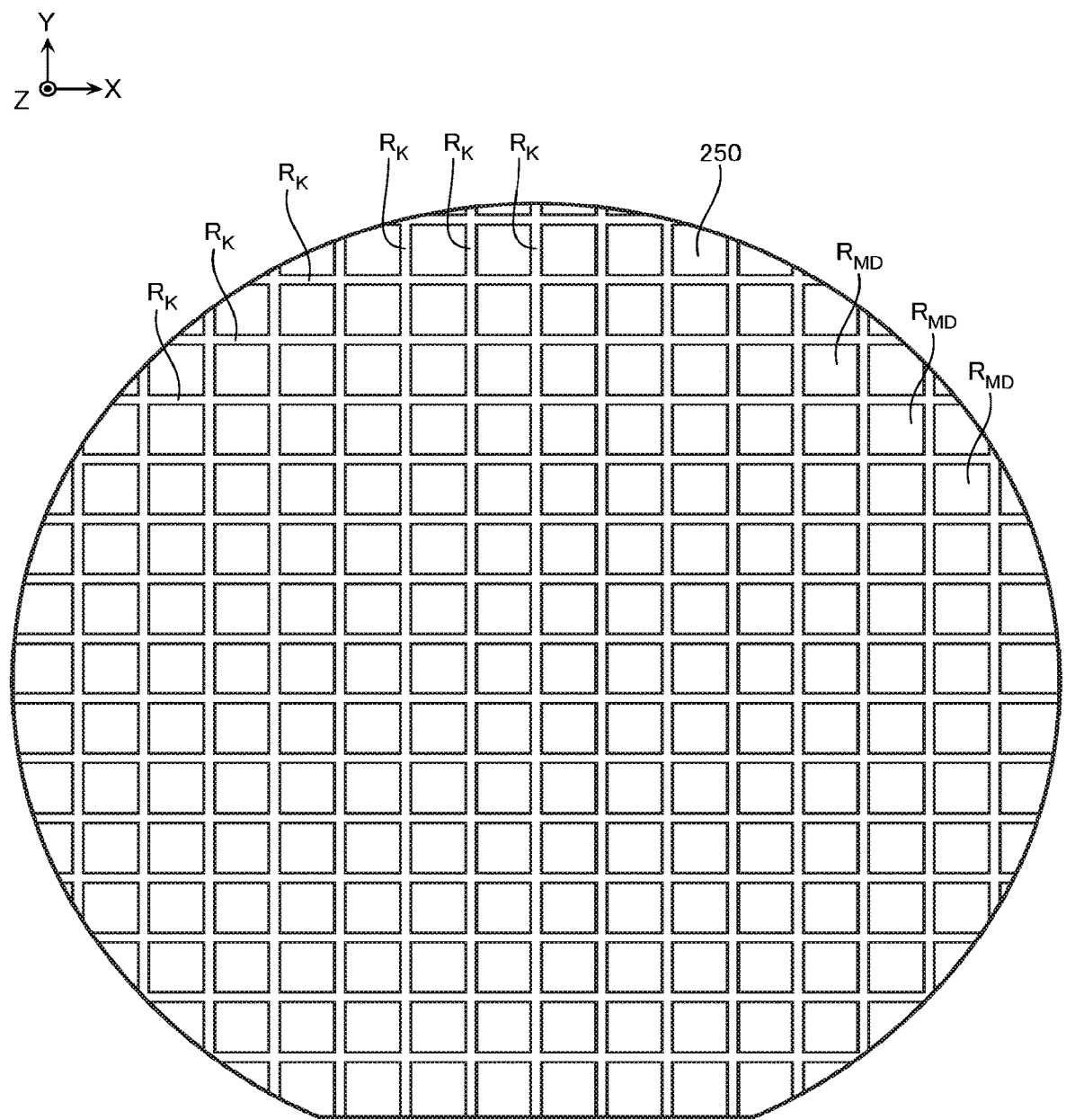
FIG. 43 is a schematic plan view for describing the same manufacturing method.
Figure 44:
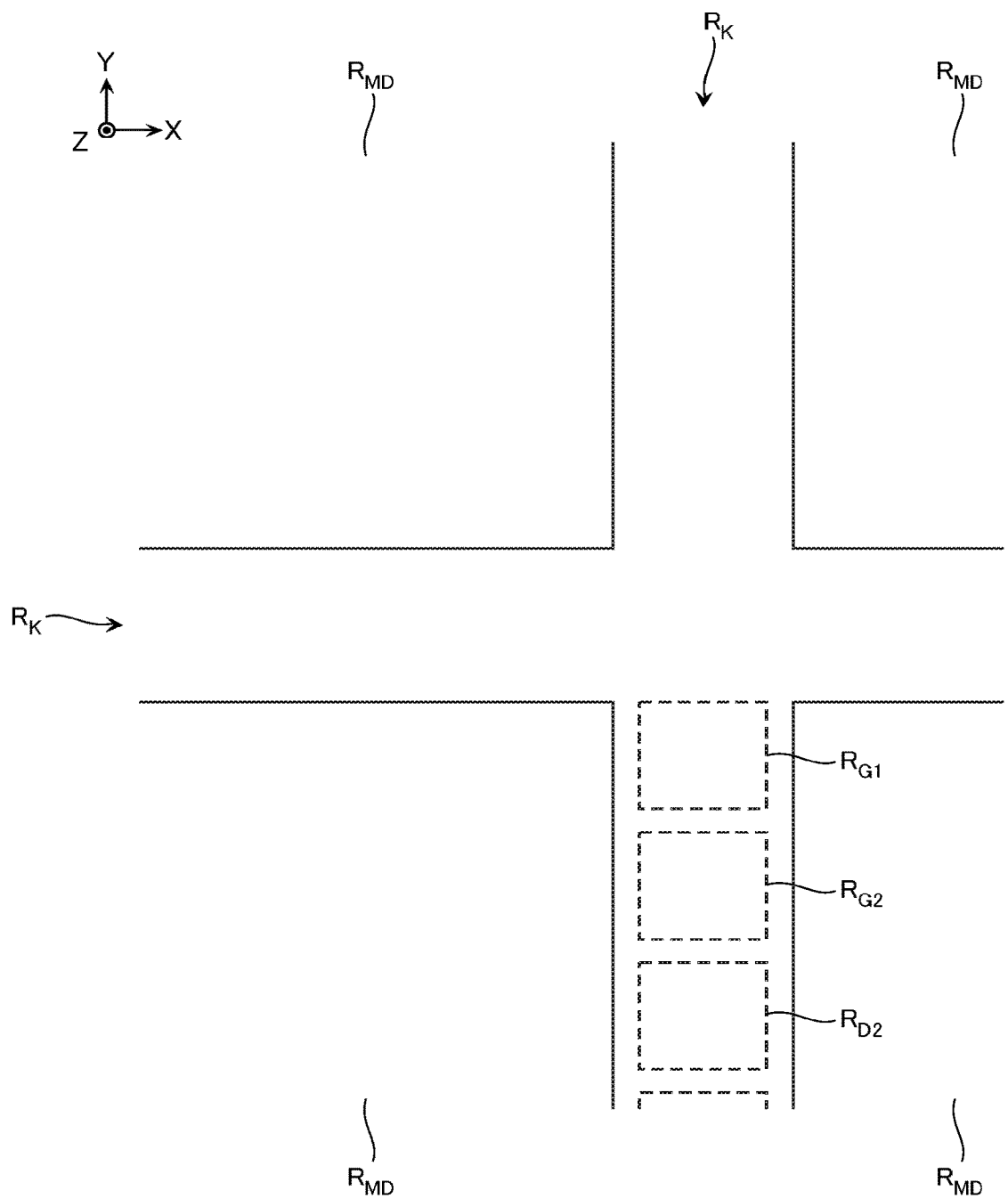
FIG. 44 is a schematic plan view for describing the same manufacturing method.
Figure 62:
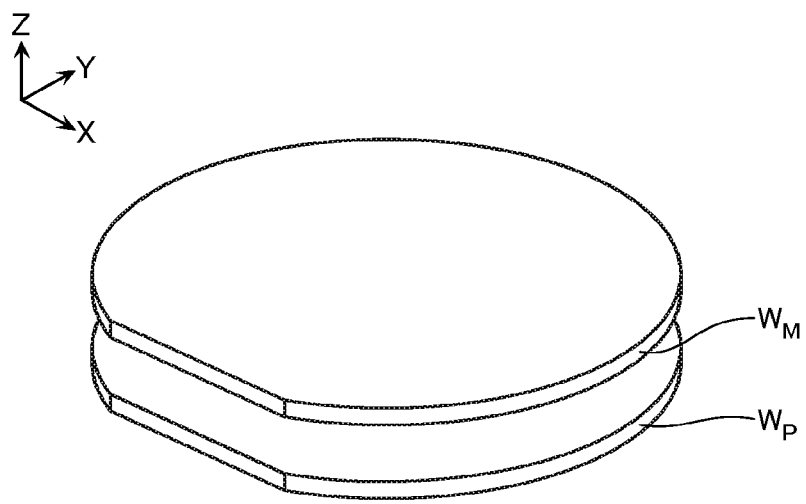
FIG. 62 is a schematic perspective view for describing the same manufacturing method.
Figure 63:
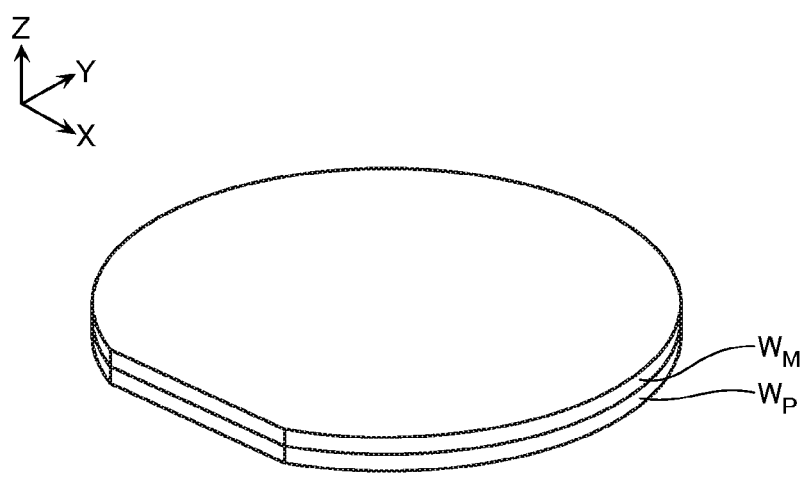
FIG. 63 is a schematic perspective view for describing the same manufacturing method.
Figure 64:
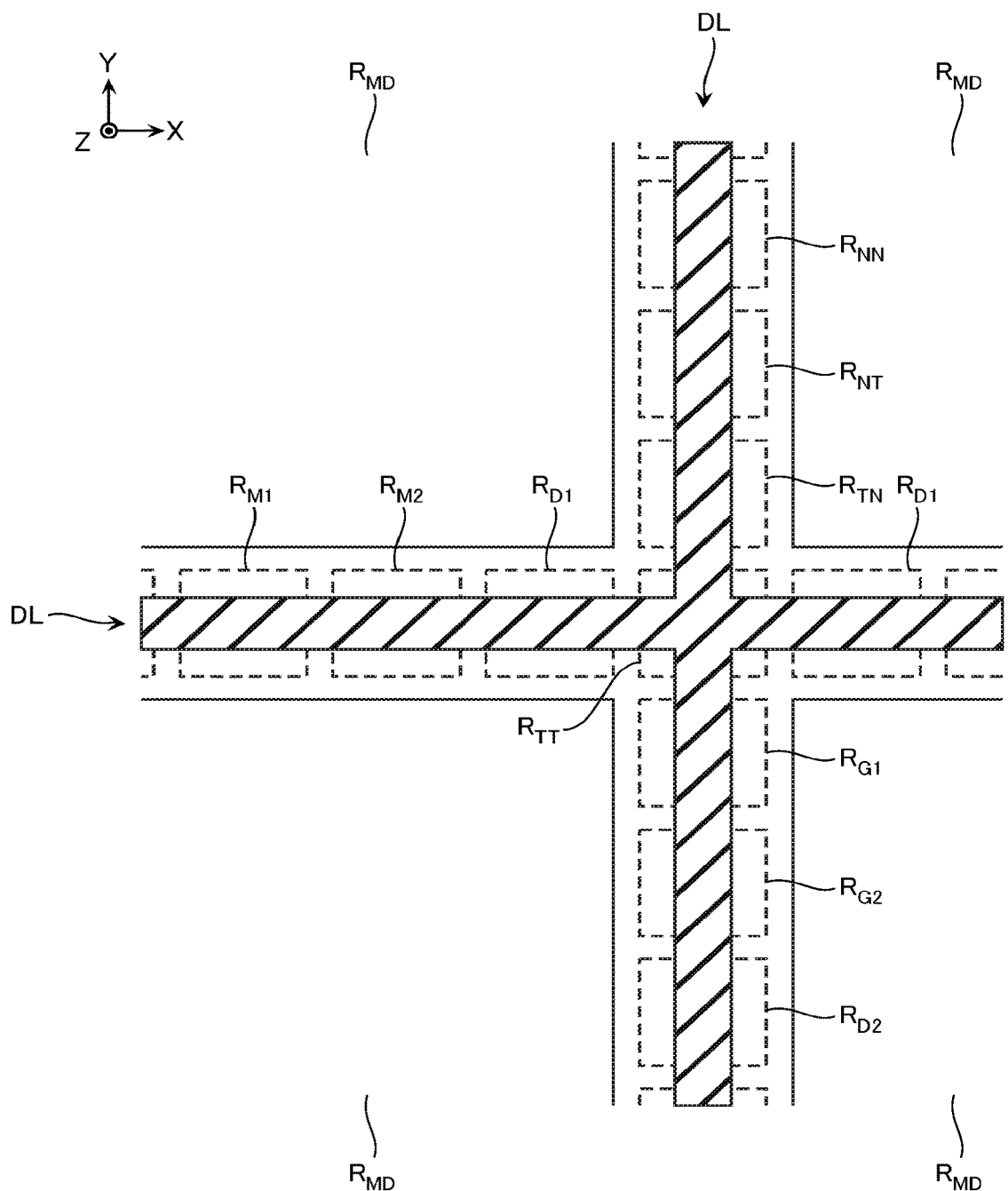
FIG. 64 is a schematic plan view for describing the same manufacturing method.
Figure 65:
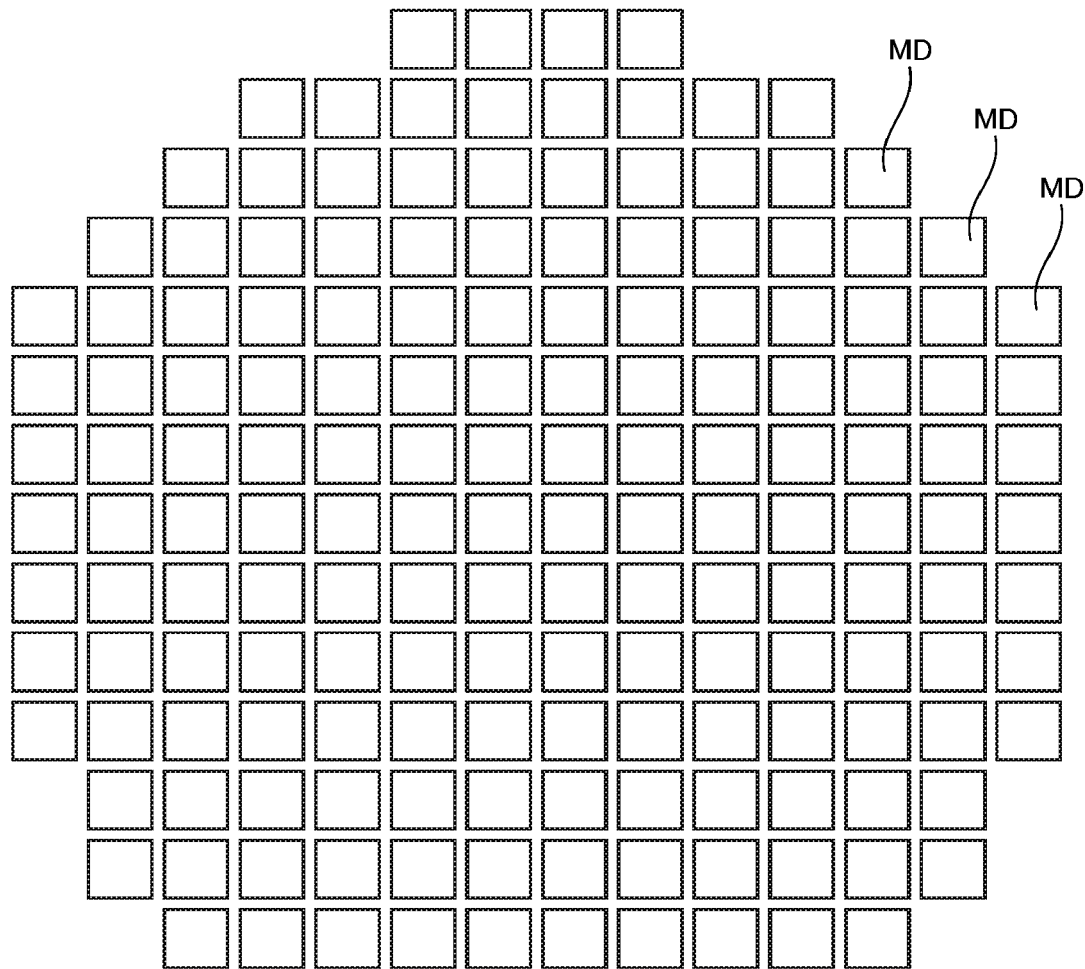
FIG. 65 is a schematic plan view for describing the same manufacturing method.

Next, with reference to FIG. 10 to FIG. 65, a method for manufacturing the memory die MD will be described. FIG. 10 and FIG. 11 are schematic bottom views for describing the same manufacturing method. FIG. 12 to FIG. 42 are schematic cross-sectional views for describing the same manufacturing method. FIG. 43 and FIG. 44 are schematic plan views for describing the same manufacturing method. FIG. 45 to FIG. 61 are schematic cross-sectional views for describing the same manufacturing method. FIG. 62 and FIG. 63 are schematic perspective views for describing the same manufacturing method. FIG. 64 and FIG. 65 are schematic plan views for describing the same manufacturing method. Note that FIG. 13, FIG. 15, FIG. 16, FIG. 18 to FIG. 20, FIG. 23 to FIG. 33 illustrate cross-sectional surfaces corresponding to FIG. 8. FIG. 45, FIG. 46, FIG. 48, FIG. 50 to FIG. 52, FIG. 54, FIG. 56, FIG. 57, FIG. 59 and FIG. 61 illustrate cross-sectional surfaces corresponding to FIG. 7.

In manufacturing the memory die MD according to the embodiment, a wafer $W_M$ corresponding to the chip $C_M$ and a wafer $W_P$ corresponding to the chip $C_P$ are manufactured (see FIG. 62), these two wafers $W_M$, $W_P$ are bonded (see FIG. 63), and individualization by dicing is performed after forming the back side wiring layer MA (FIG. 7) and the like (see FIG. 65).

[Method for Manufacturing Wafer $W_M$]

FIG. 10 illustrates a surface of a semiconductor substrate 150 corresponding to the wafer $W_M$. FIG. 11 illustrates an enlarged part of FIG. 10. As illustrated in FIG. 10, the semiconductor substrate 150 has the surface on which a plurality of memory regions $R_{MD}$ and a plurality of kerf regions $R_K$ disposed between each two of the plurality of memory regions $R_{MD}$ are disposed. The plurality of memory regions $R_{MD}$ become the memory dies MD after dicing. The kerf region $R_K$ includes various kinds of regions used in manufacturing the memory dies MD as illustrated in FIG. 11.

FIG. 11 illustrates marked regions $R_{M1}$, $R_{M2}$, a wiring marked region $R_{D1}$, and regions $R_{NN}$, $R_{NT}$, $R_{TN}$, $R_{TT}$. Note that configurations in the kerf region $R_K$ are not used for inputting/outputting a voltage to/from the memory cell array and for inputting/outputting a data signal or another signal to/from the memory cell array.

Figure 12:
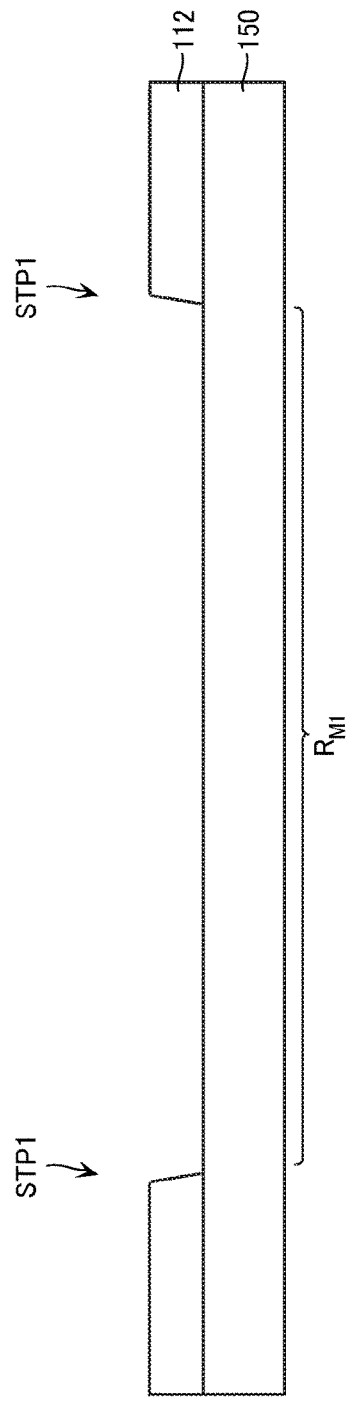
FIG. 12 is a schematic cross-sectional view for describing the same manufacturing method.

In manufacturing the wafer $W_M$, for example, as illustrated in FIG. 12, the insulating layer 112 of, for example, silicon oxide (SiO$_2$) is formed on the surface of the semiconductor substrate 150. This process is, for example, performed, for example, by CVD and the like or thermal oxidation and the like. In the marked region $R_{M1}$, a part of the insulating layer 112 is removed to expose the surface of the semiconductor substrate 150. This process is performed, for example, by wet etching. This forms a step STP1 including the surface of the semiconductor substrate 150 and a surface of the insulating layer 112. The step STP1 formed in the marked region $R_{M1}$ is used as a reference mark in positioning on an XY plane in a configuration in the wafer $W_M$.

Figure 13:
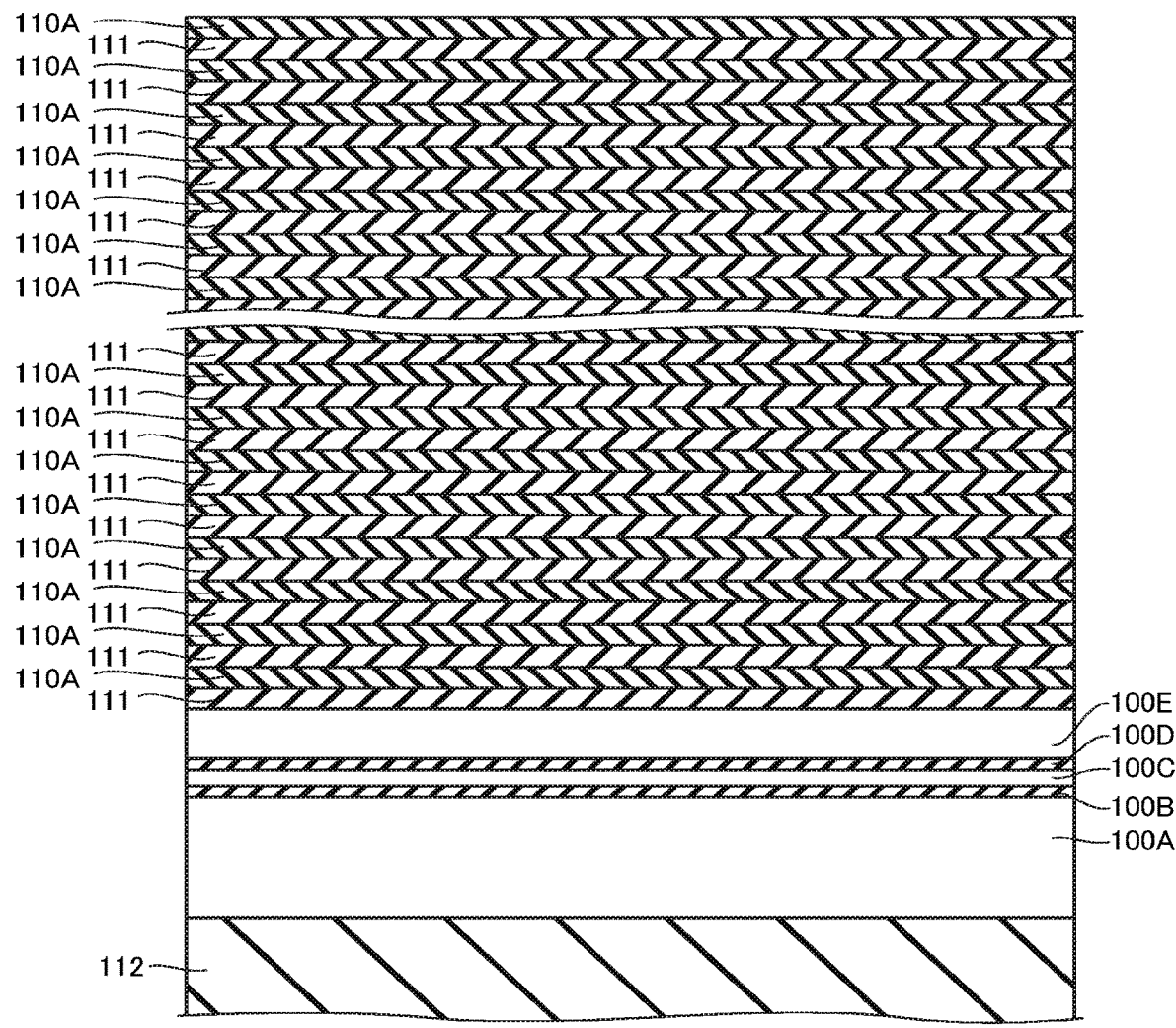
FIG. 13 is a schematic cross-sectional view for describing the same manufacturing method.

Next, for example, as illustrated in FIG. 13, a semiconductor layer 100A of, for example, silicon, a sacrifice layer 100B of, for example, silicon oxide, a sacrifice layer 100C of, for example, silicon, a sacrifice layer 100D of, for example, silicon oxide, and a semiconductor layer 100E of, for example, silicon are formed on the surface of the insulating layer 112. A plurality of inter-layer insulating layers 111 and a plurality of sacrifice layers 110A are alternately formed. This process is performed, for example, by method, such as Chemical Vapor Deposition (CVD).

Figure 14:
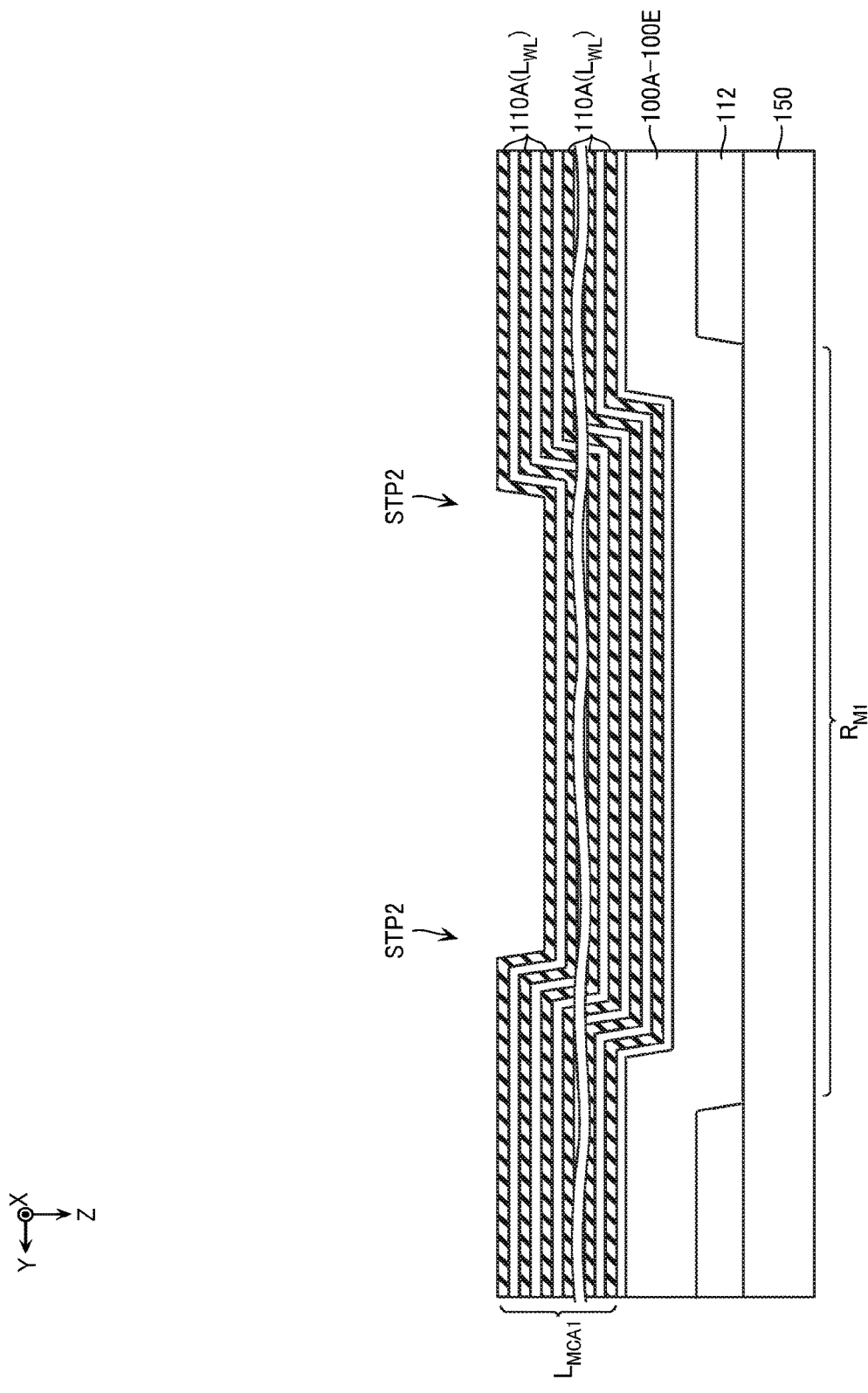
FIG. 14 is a schematic cross-sectional view for describing the same manufacturing method.

Note that this process forms the semiconductor layer 100A basically on the surface of the insulating layer 112. However, for example, as illustrated in FIG. 14, in the marked region $R_{M1}$, the semiconductor layer 100A is formed on the surface of the semiconductor substrate 150. This forms a step STP2 on a surface of a configuration in the marked region $R_{M1}$.

Figure 15:
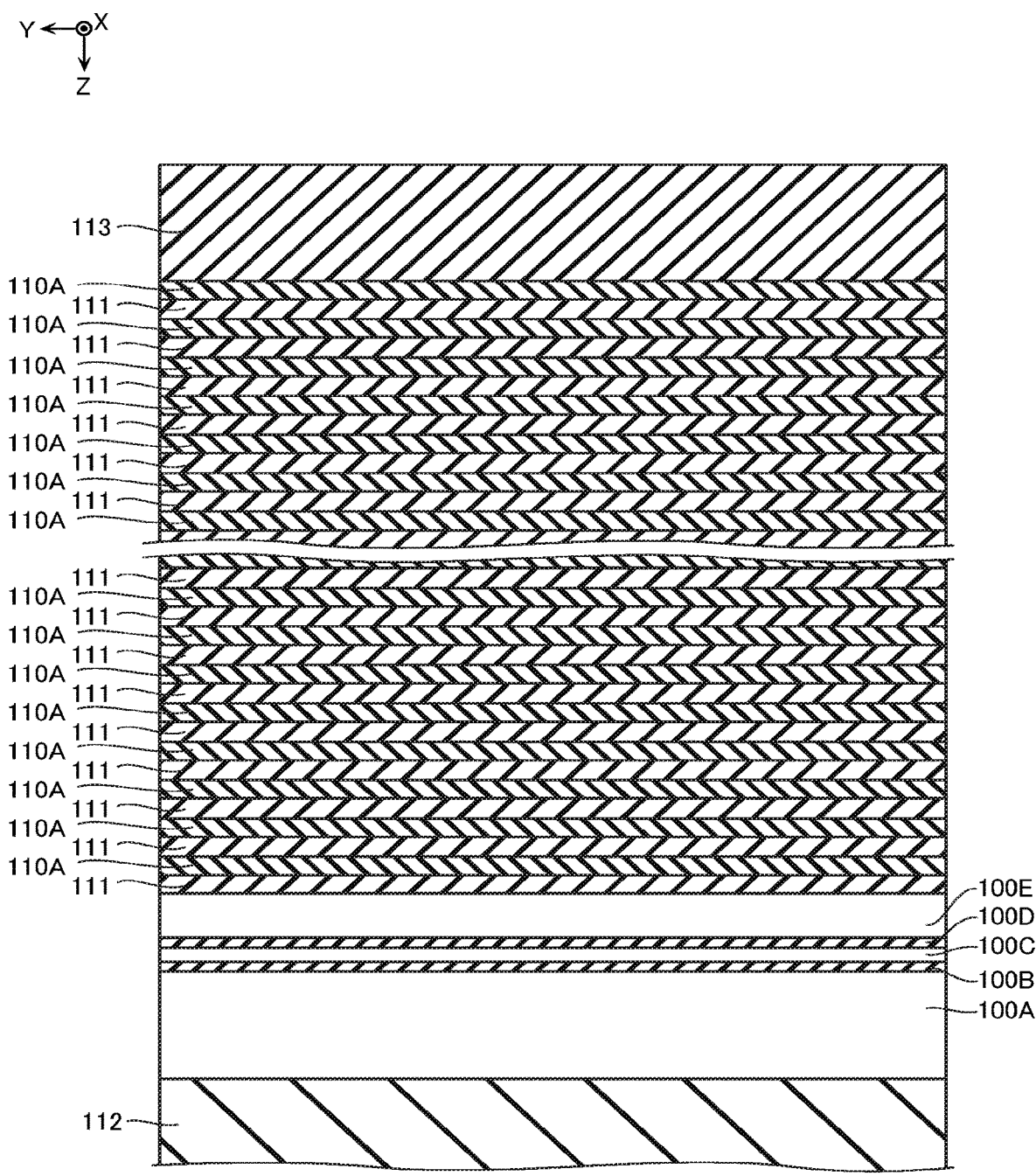
FIG. 15 is a schematic cross-sectional view for describing the same manufacturing method.

Next, for example, as illustrated in FIG. 15, an insulating layer 113 of, for example, silicon oxide (SiO$_2$) is formed on the surface illustrated in FIG. 13 and FIG. 14.

Figure 16:
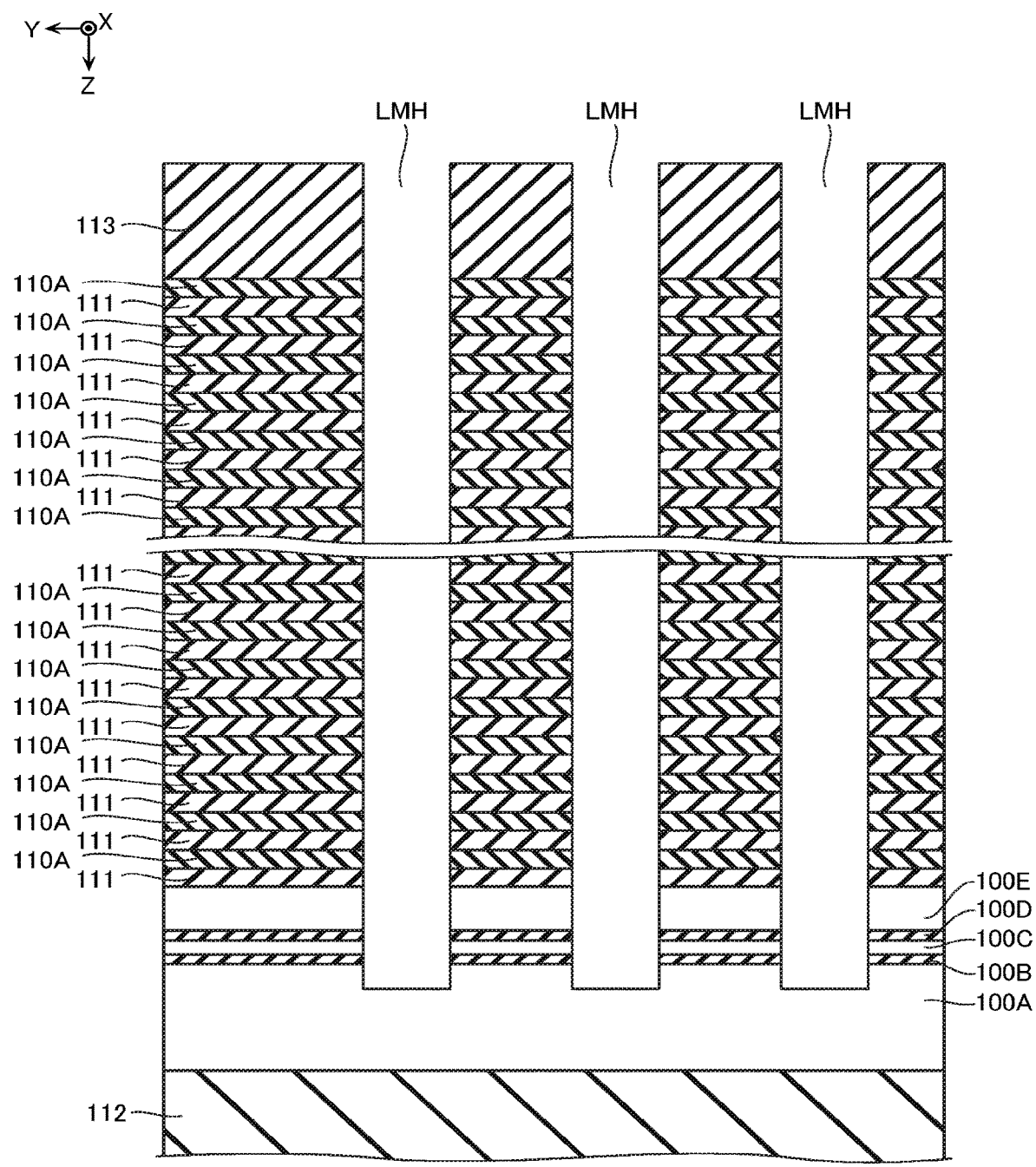
FIG. 16 is a schematic cross-sectional view for describing the same manufacturing method.

Next, for example, as illustrated in FIG. 16, a plurality of memory holes LMH are formed at positions corresponding to the semiconductor layers 120. The memory hole LMH extends in the Z-direction, passes through the insulating layer 113, the inter-layer insulating layers 111 and the sacrifice layers 110A, the semiconductor layer 100E, the sacrifice layer 100D, the sacrifice layer 100C, and the sacrifice layer 100B, and exposes a surface of the semiconductor layer 100A. This process is performed, for example, by method, such as RIE.

Note that, in forming the memory hole LMH, positioning is performed with the step STP2 described with reference to FIG. 14 as a reference.

Figure 17:
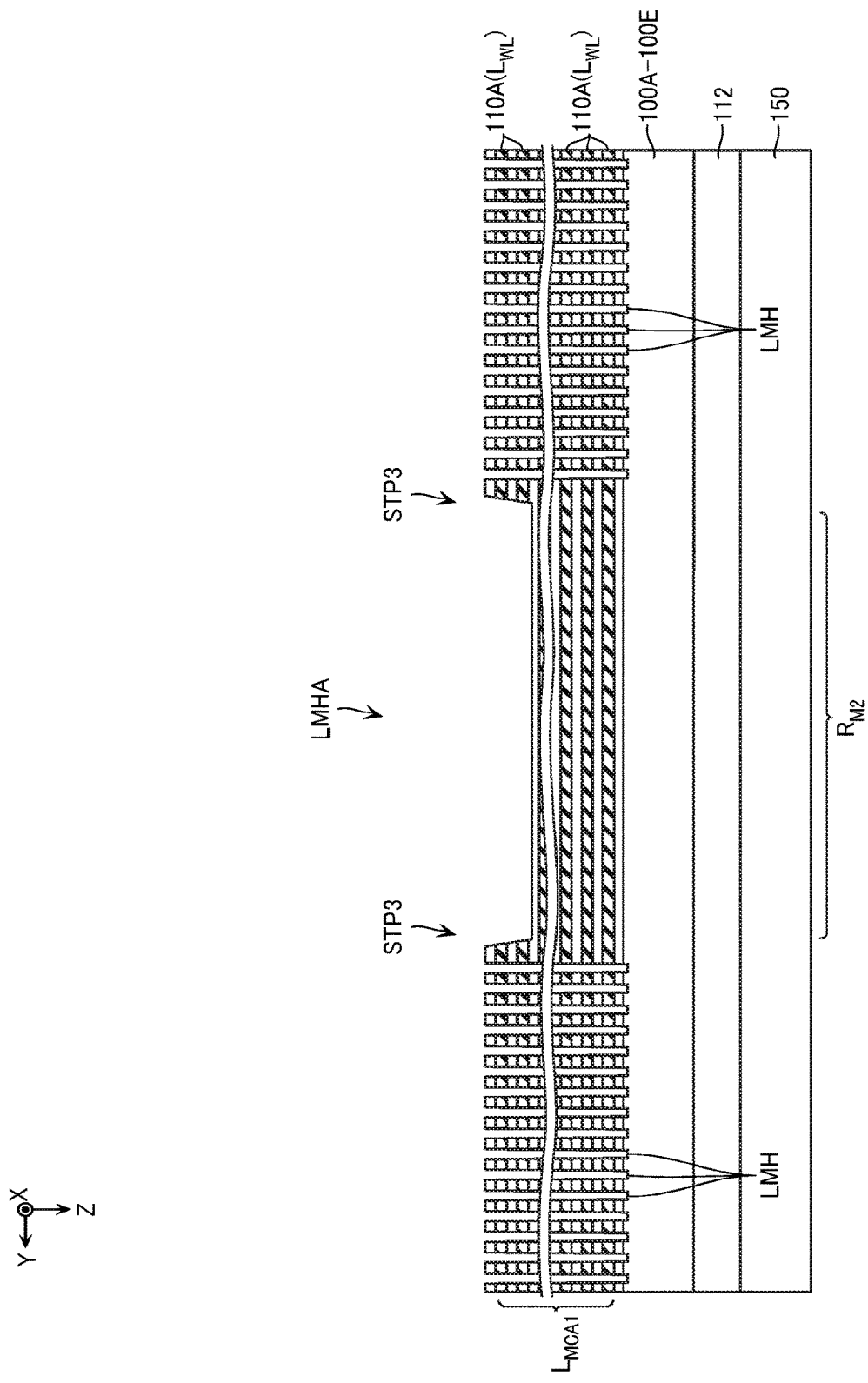
FIG. 17 is a schematic cross-sectional view for describing the same manufacturing method.

As illustrated in FIG. 17, in this process, simultaneously with patterning and forming the memory holes LMH, an opening LMHA is patterned and formed in the marked region $R_{M2}$. The opening LMHA has an inner diameter larger than an inner diameter of the memory hole LMH. The opening LMHA passes through only parts of the plurality of inter-layer insulating layers 111 and parts of the plurality of sacrifice layers 110A. Therefore, the opening LMHA has a bottom surface from which the inter-layer insulating layer 111 or the sacrifice layer 110A is exposed. This forms a step STP3 on the surface of the structure illustrated in FIG. 17.

Figure 18:
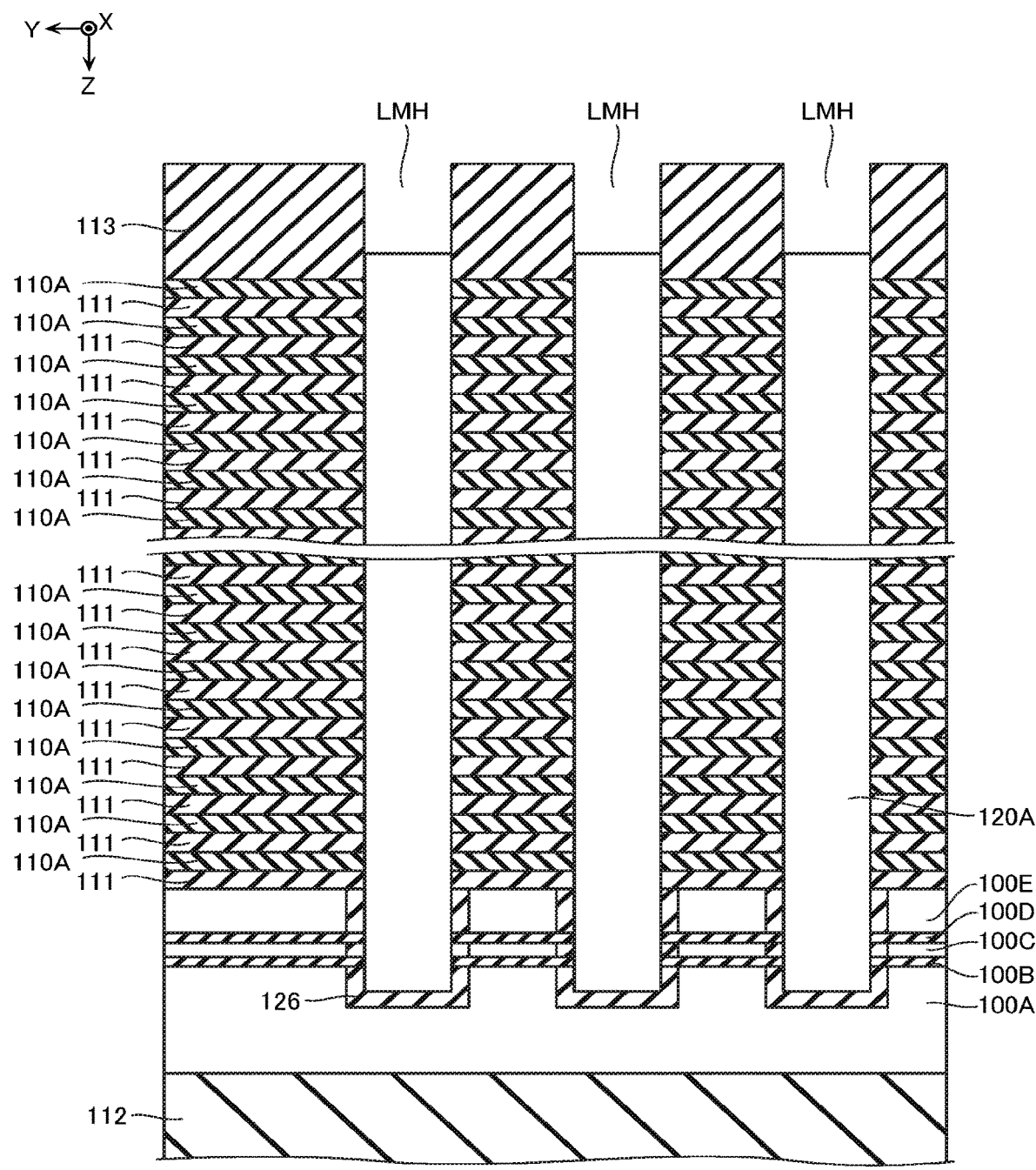
FIG. 18 is a schematic cross-sectional view for describing the same manufacturing method.

Next, for example, as illustrated in FIG. 18, parts of the semiconductor layer 100A, the sacrifice layer 100C, and the semiconductor layer 100E are oxidized via the memory holes LMH, and thus, insulating layers 126 are formed. Amorphous silicon films 120A are formed inside the memory holes LMH. This process is performed, for example, by method, such as CVD.

Figure 19:
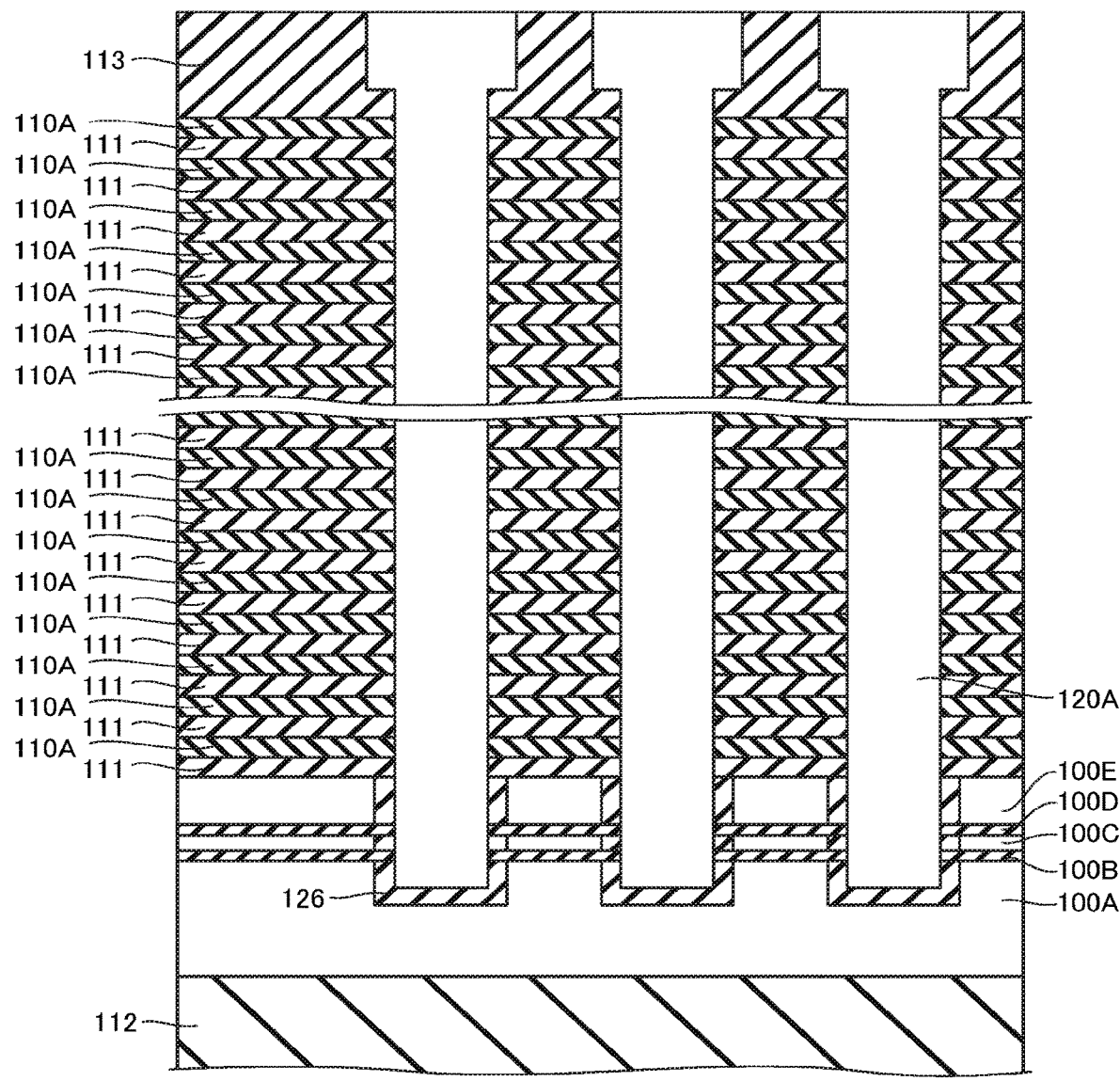
FIG. 19 is a schematic cross-sectional view for describing the same manufacturing method.

Next, for example, as illustrated in FIG. 19, parts of the insulating layer 113 are removed, and thus, diameters at one end portions in the Z-direction of the memory holes LMH are enlarged. This process is performed, for example, by method, such as wet etching. Additionally, the amorphous silicon films 120A are further formed inside the memory holes LMH. This process is performed, for example, by method, such as CVD.

Figure 20:
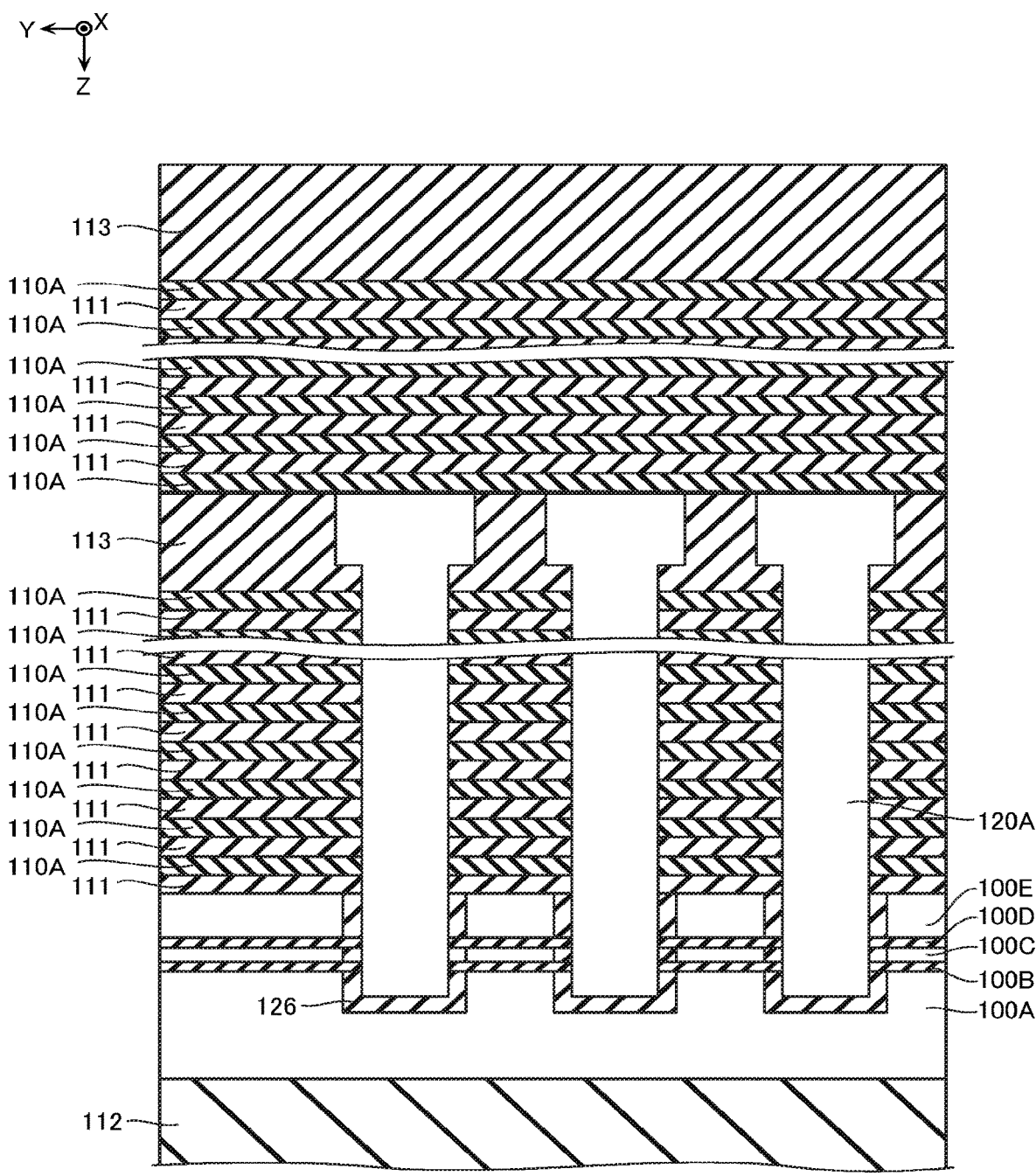
FIG. 20 is a schematic cross-sectional view for describing the same manufacturing method.

Next, for example, as illustrated in FIG. 20, the plurality of inter-layer insulating layers 111 and the plurality of sacrifice layers 110A are alternately formed on the surface of the structure described with reference to FIG. 19. Additionally, the insulating layer 113 of, for example, silicon oxide (SiO$_2$) is formed on the surface of this structure. This process is performed, for example, by method, such as CVD.

Figure 21:
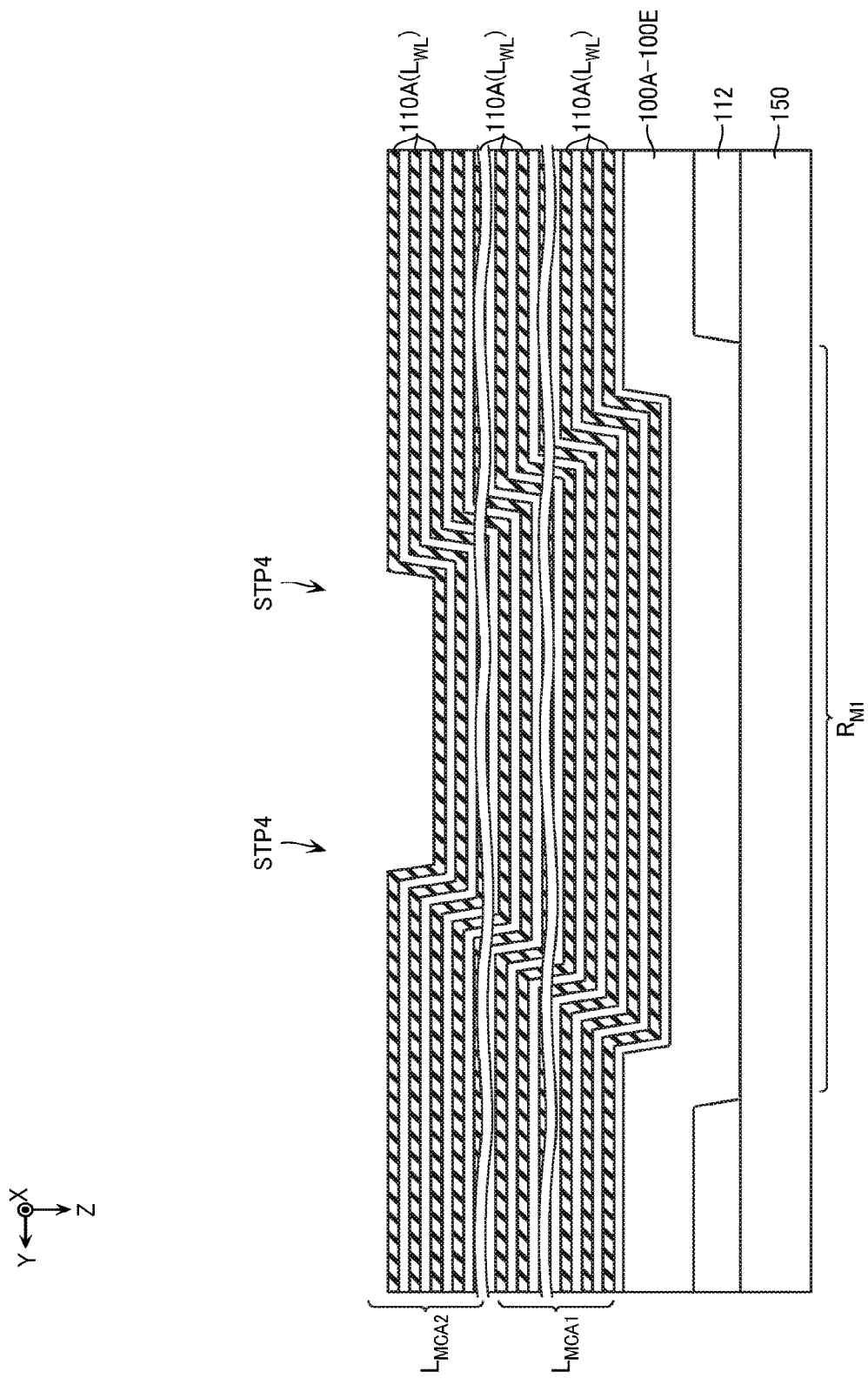
FIG. 21 is a schematic cross-sectional view for describing the same manufacturing method.

Note that, in this process, for example, as illustrated in FIG. 21, the plurality of inter-layer insulating layers 111 and the plurality of sacrifice layers 110A are formed along the step STP2 (FIG. 14) in the marked region R$_{M1}$. This forms a step STP4 on the surface of the configuration in the marked region R$_{M1}$.

Figure 22:
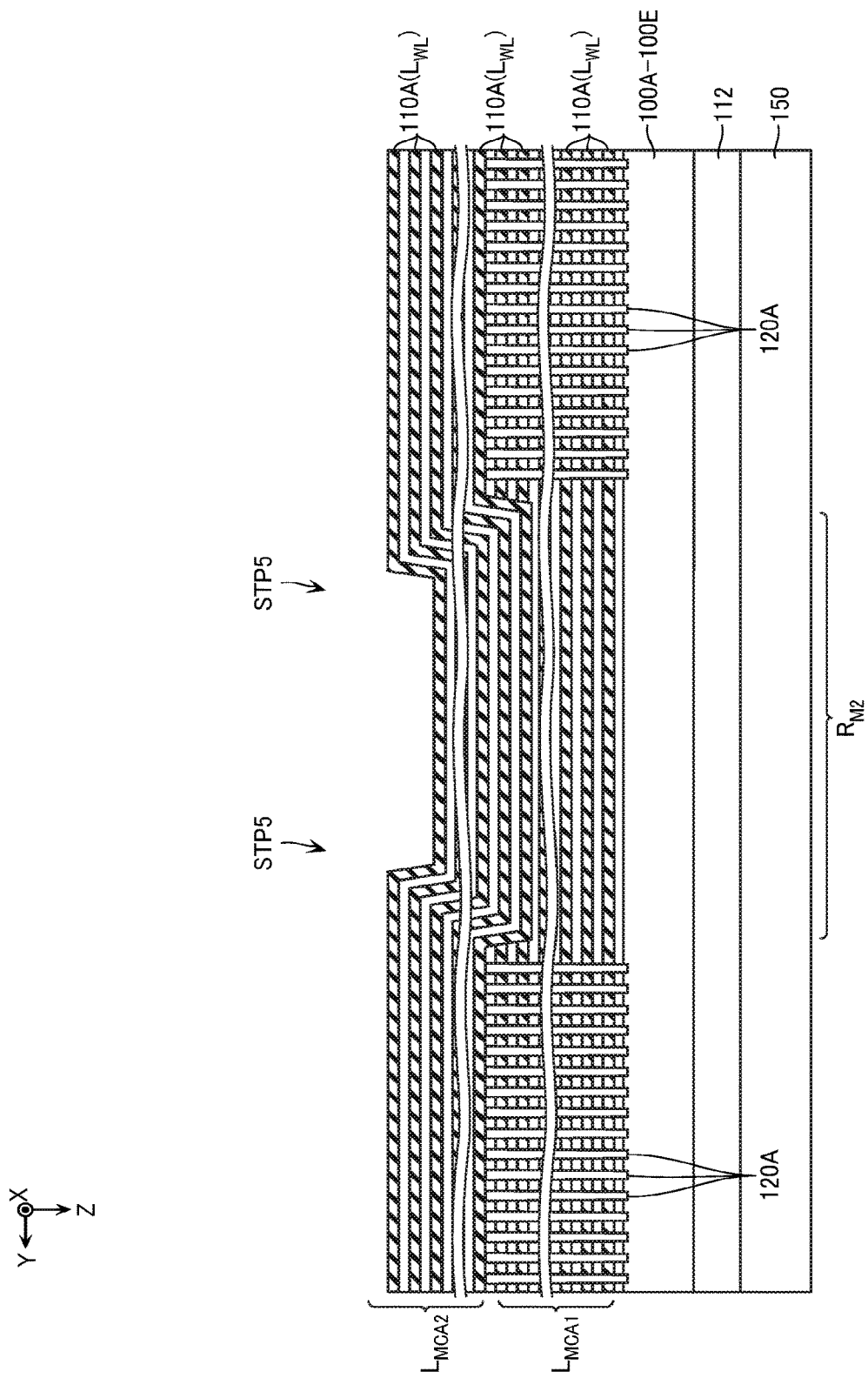
FIG. 22 is a schematic cross-sectional view for describing the same manufacturing method.

For example, as illustrated in FIG. 22, the plurality of inter-layer insulating layers 111 and the plurality of sacrifice layers 110A are formed along the step STP3 (FIG. 17) in the marked region R$_{M2}$. This forms a step STP5 on the surface of the configuration in the marked region R$_{M2}$.

Figure 23:
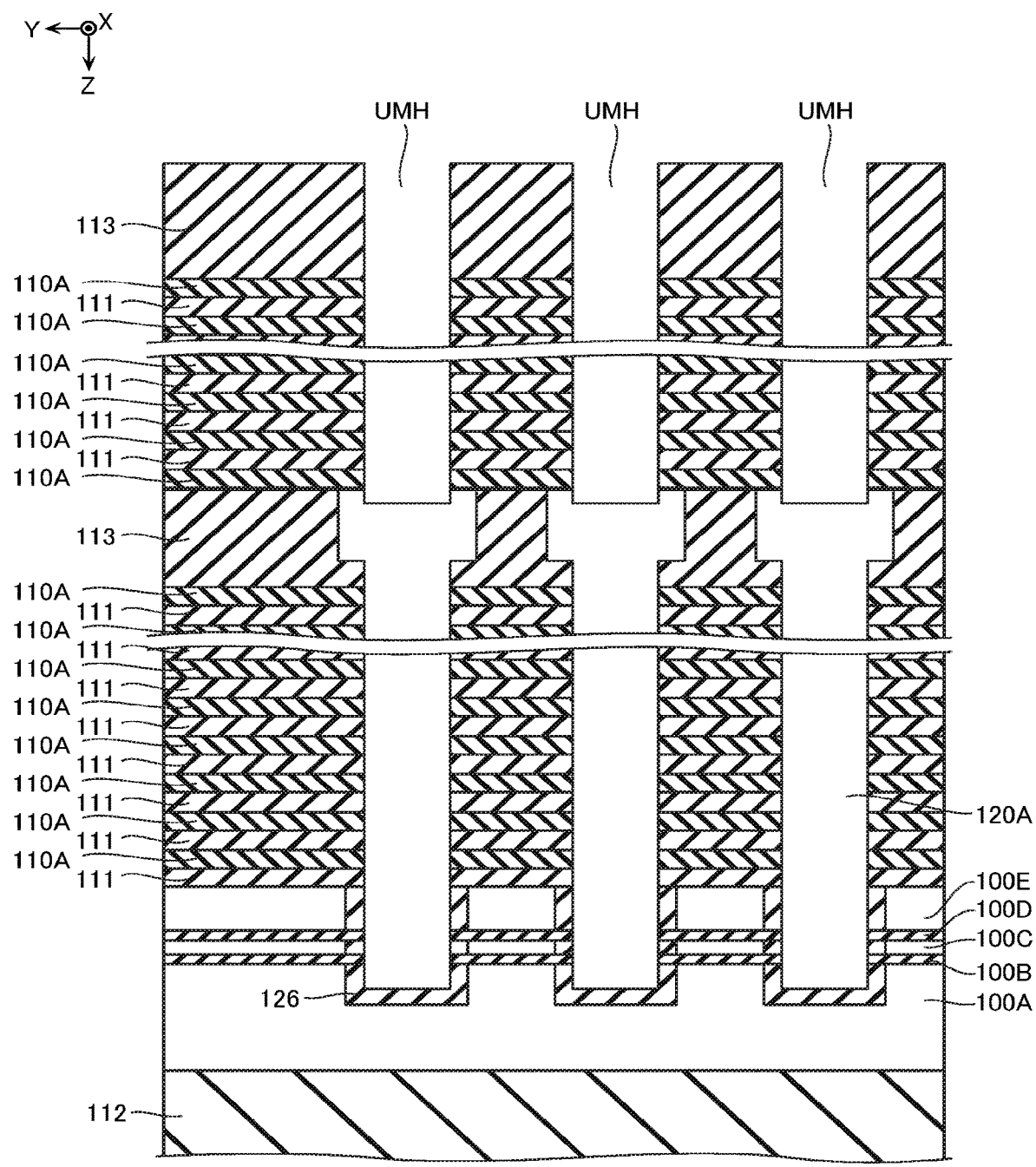
FIG. 23 is a schematic cross-sectional view for describing the same manufacturing method.

Next, for example, as illustrated in FIG. 23, a plurality of memory holes UMH are formed at positions corresponding to the semiconductor layers 120. These memory holes UMH extend in the Z-direction, pass through the insulating layer 113, and the inter-layer insulating layers 111 and the sacrifice layers 110A, and expose surfaces of the amorphous silicon films 120A. This process is performed, for example, by method, such as RIE.

Note that, in forming the memory holes UMH, positioning is performed with the step STP5 described with reference to FIG. 22 as a reference. Here, the position of the step STP5 corresponds to the position of the opening LMHA (FIG. 17). The opening LMHA is patterned simultaneously with the memory holes LMH. Therefore, by using the step STP5 as a reference, it is possible to preferably position the memory holes UMH with respect to the memory holes LMH.

Figure 24:
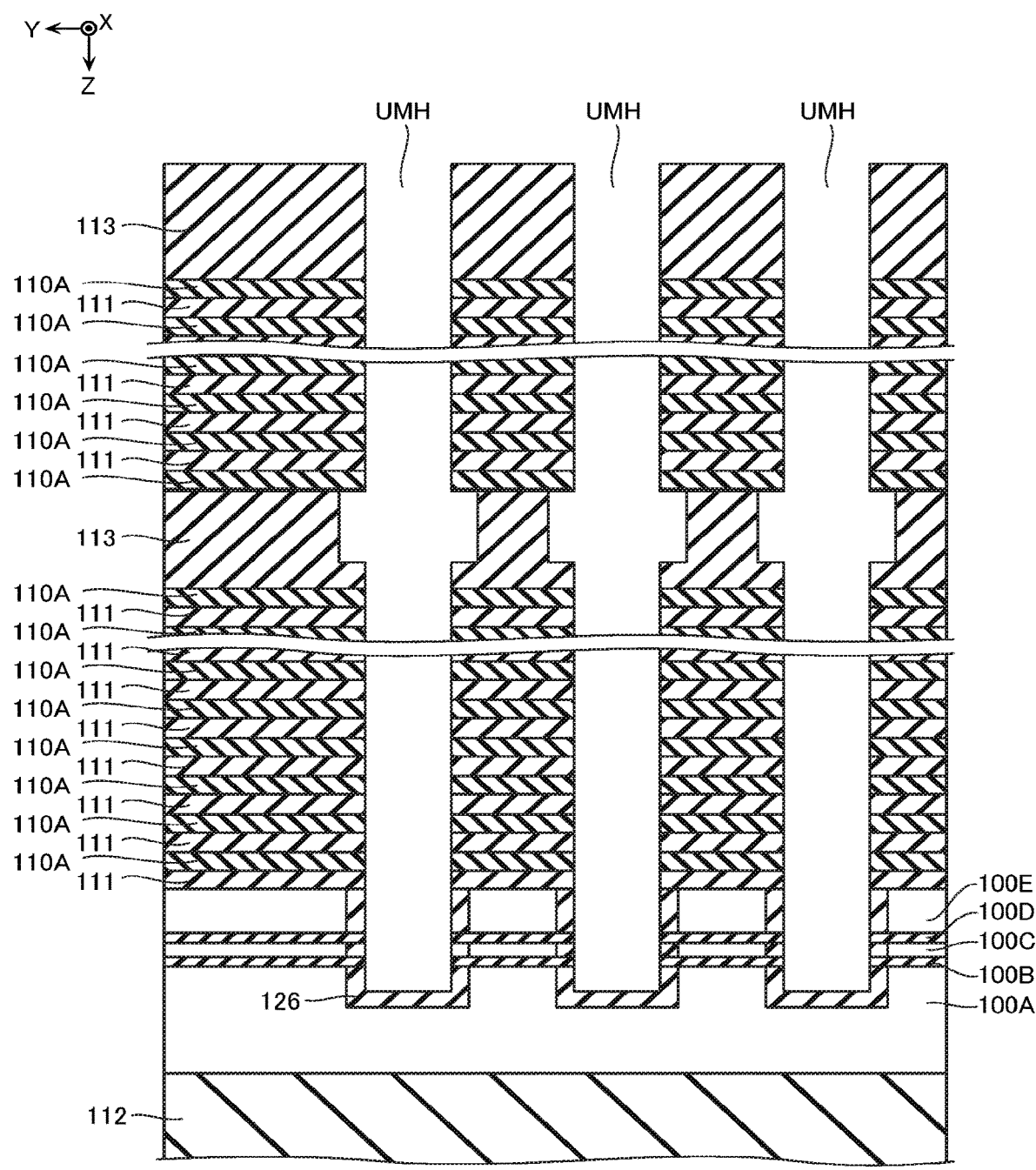
FIG. 24 is a schematic cross-sectional view for describing the same manufacturing method.

Next, for example, as illustrated in FIG. 24, the amorphous silicon films 120A are removed. This process is performed, for example, by method, such as wet etching.

Figure 25:
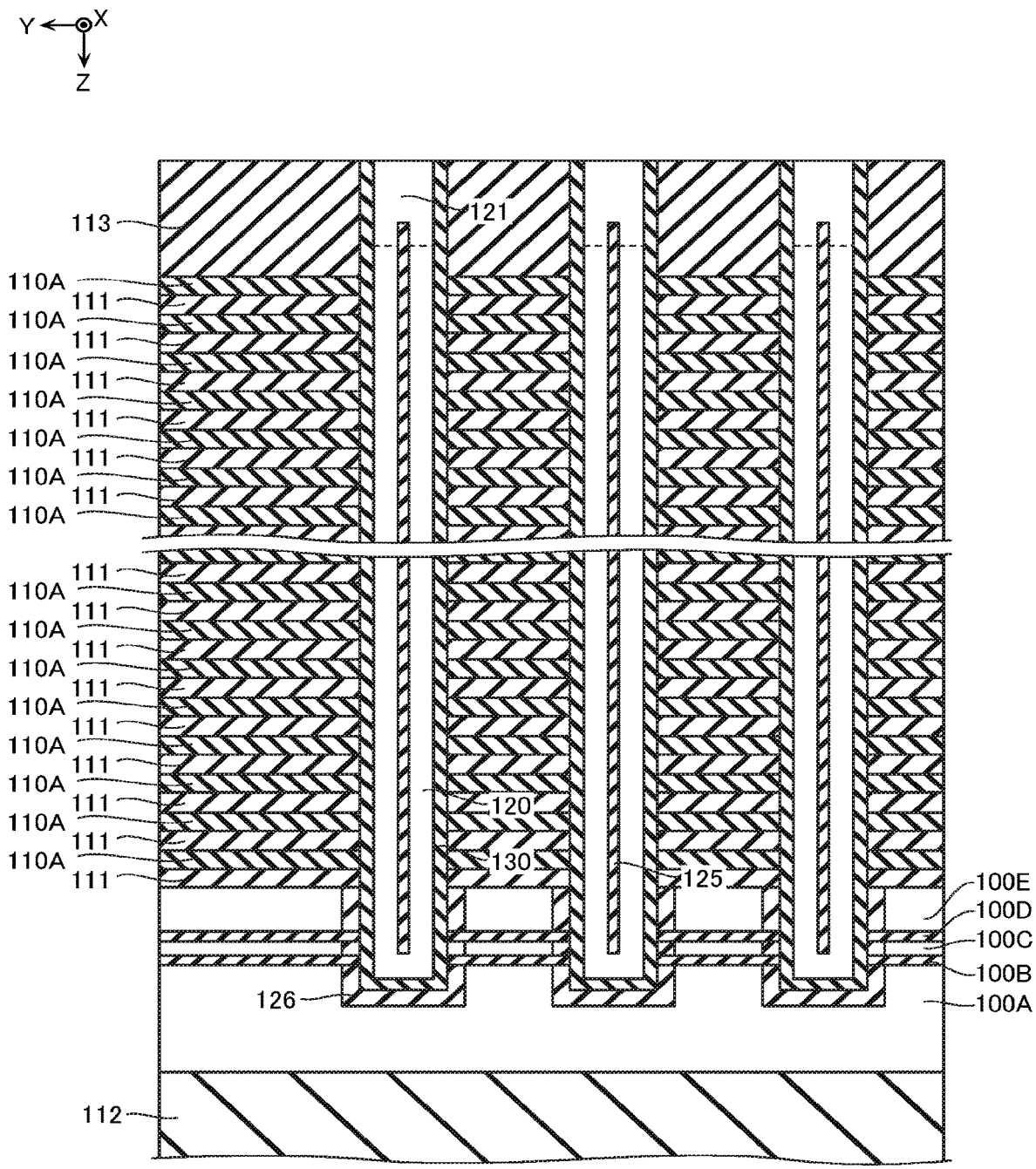
FIG. 25 is a schematic cross-sectional view for describing the same manufacturing method.

Next, for example, as illustrated in FIG. 25, the gate insulating films 130, the semiconductor layers 120, and the insulating layers 125 are formed inside the memory holes LMH, UMH. Additionally, the above-mentioned impurity regions 121 are formed at the upper ends of the semiconductor layers 120. This process is performed, for example, by method, such as CVD.

Figure 26:
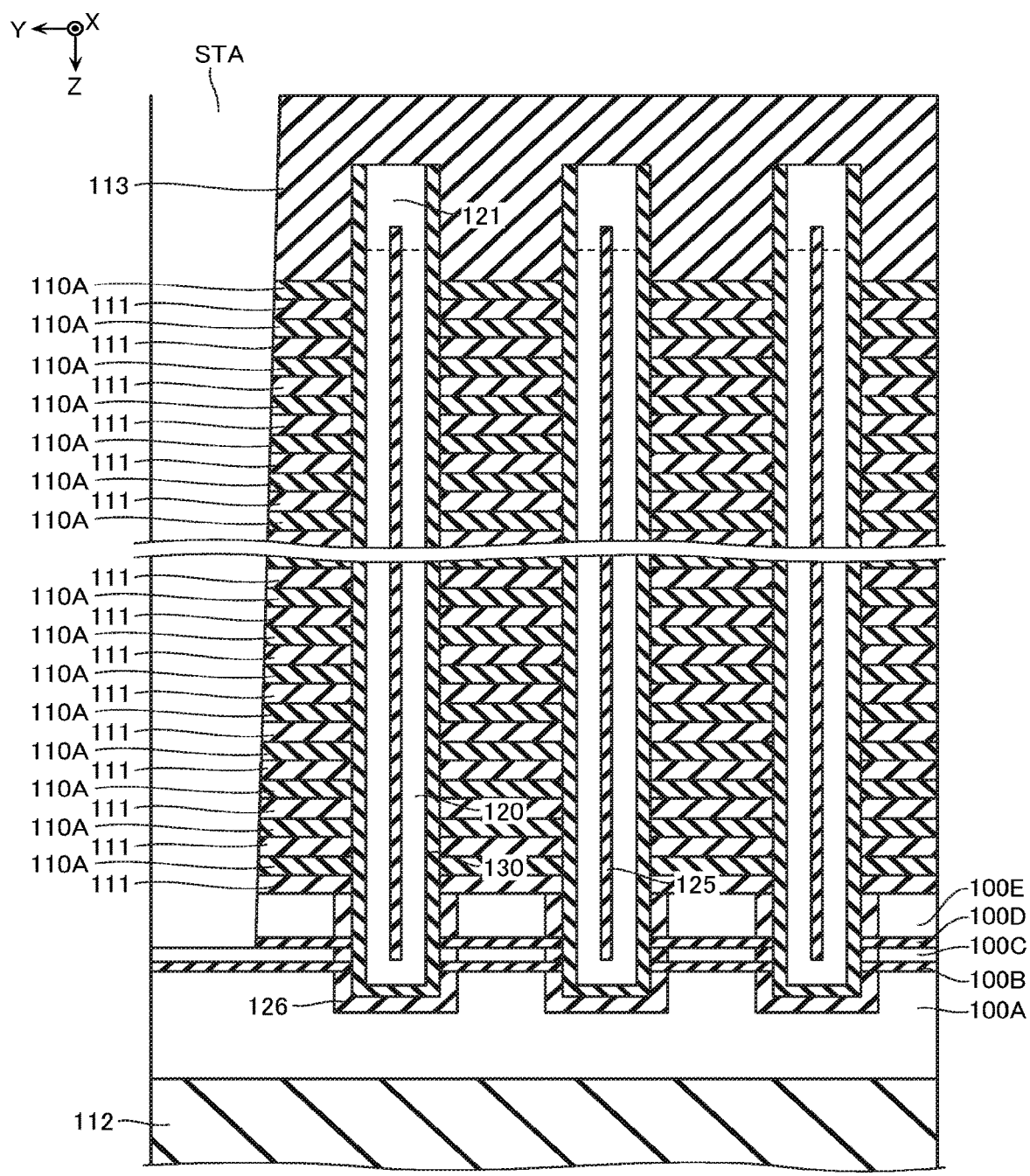
FIG. 26 is a schematic cross-sectional view for describing the same manufacturing method.

Next, for example, as illustrated in FIG. 26, a trench STA is formed. The trench STA extends in the Z-direction and in the X-direction, separates the inter-layer insulating layers 111 and the sacrifice layers 110A, the semiconductor layer 100E, and the sacrifice layer 100D in the Y-direction, and exposes the sacrifice layer 100C. This process is performed, for example, by method, such as RIE.

Note that, in forming the trench STA, positioning is performed with the step STP5 described with reference to FIG. 22 as a reference.

Figure 27:
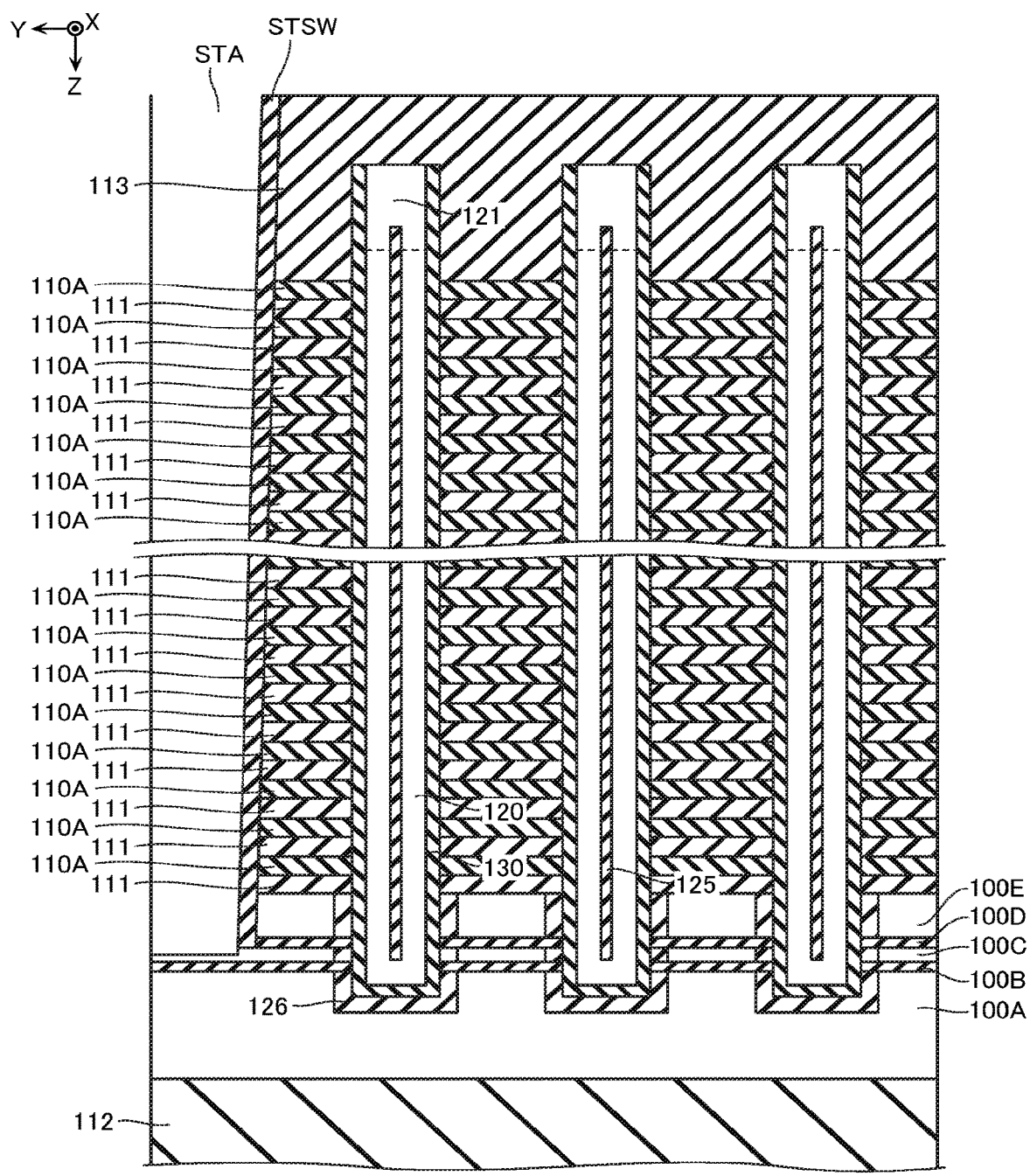
FIG. 27 is a schematic cross-sectional view for describing the same manufacturing method.

Next, for example, as illustrated in FIG. 27, a protective film STSW of, for example, silicon nitride is formed on a side surface in the Y-direction of the trench STA. In this process, an insulating film of, for example, silicon nitride is formed on the side surface in the Y-direction and a bottom surface of the trench STA by, for example, method, such as CVD. Additionally, by method, such as RIE, a part that covers the bottom surface of the trench STA of this insulating film is removed.

Figure 28:
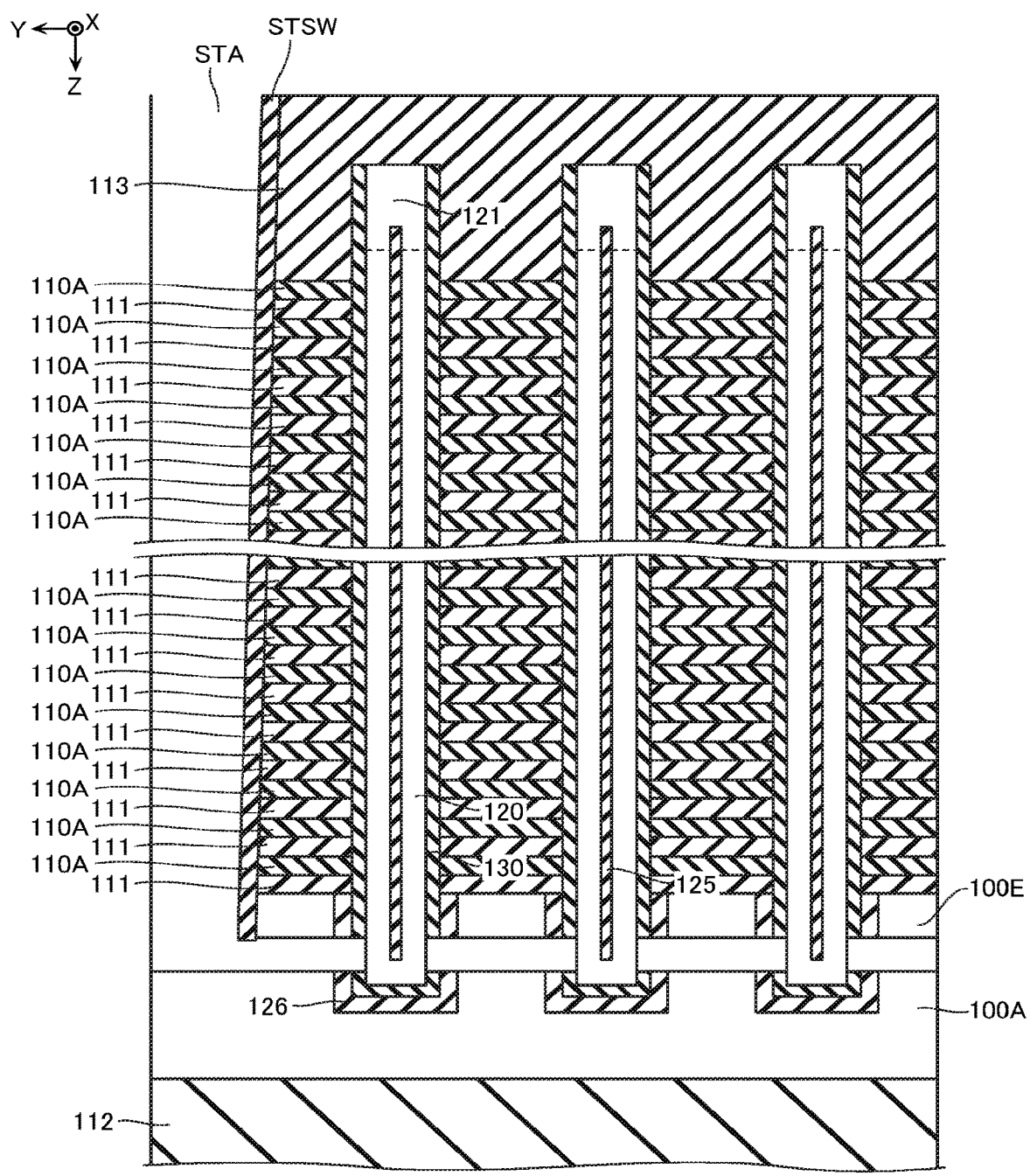
FIG. 28 is a schematic cross-sectional view for describing the same manufacturing method.

Next, for example, as illustrated in FIG. 28, the sacrifice layers 100B, 100C, 100D, and parts of the insulating layer 126 and the gate insulating film 130 are removed, and thus, parts of the semiconductor layers 120 are exposed. This process is performed, for example, by method, such as wet etching.

Figure 29:
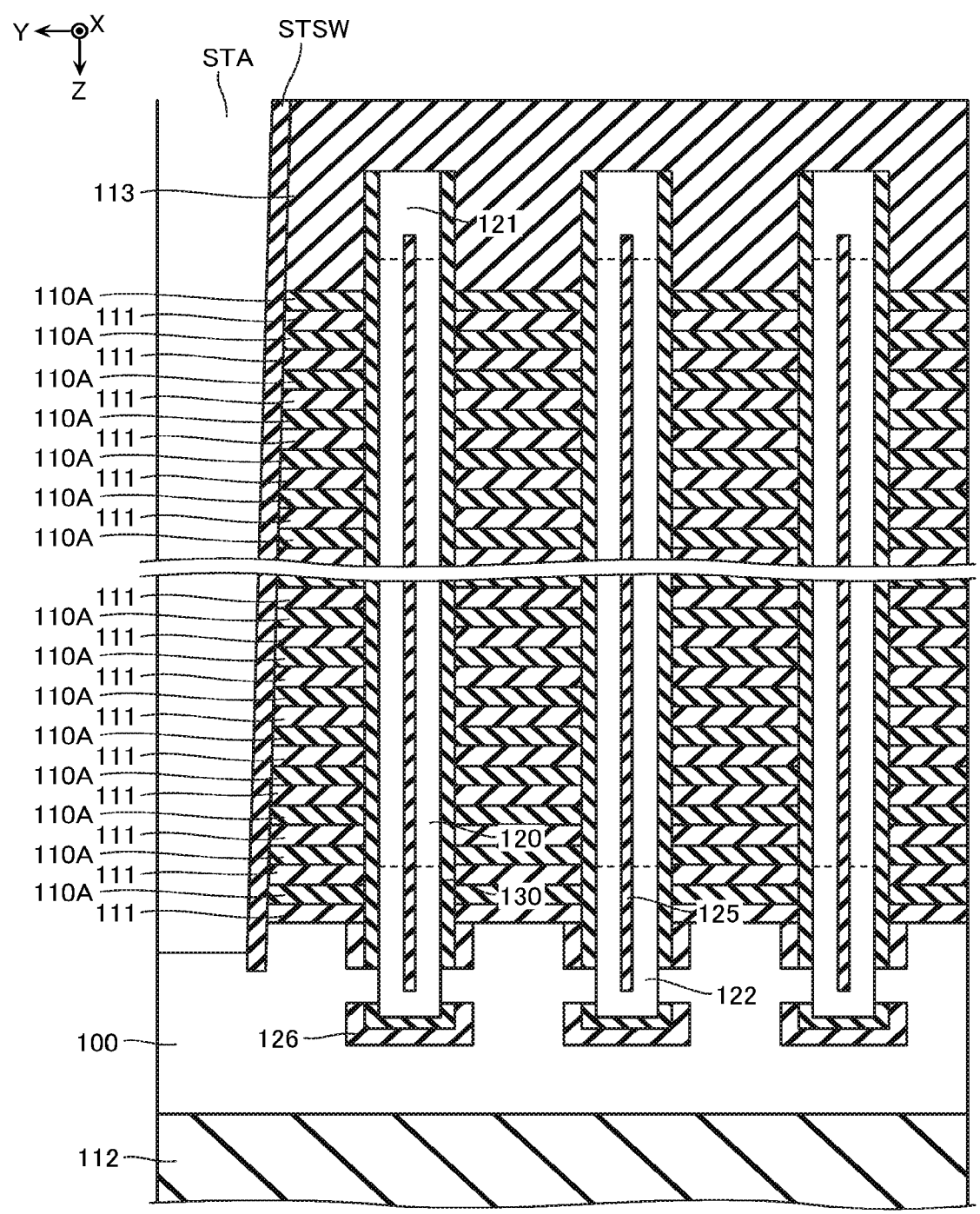
FIG. 29 is a schematic cross-sectional view for describing the same manufacturing method.

Next, for example, as illustrated in FIG. 29, the conductive layer 100 is formed. This process is performed, for example, by method, such as epitaxial growth. In this process, the above-mentioned impurity regions 122 are formed at the lower ends of the semiconductor layers 120.

Figure 30:
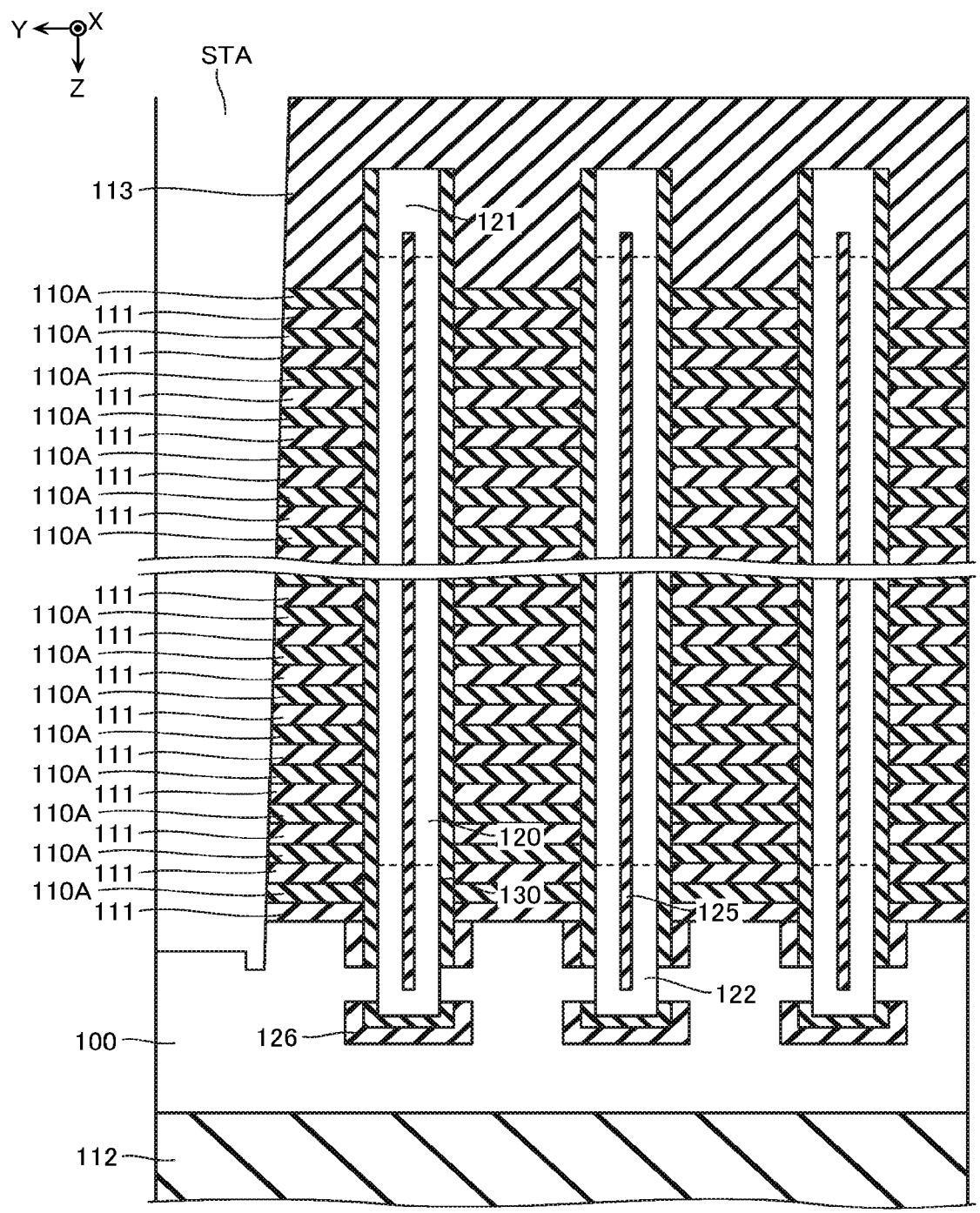
FIG. 30 is a schematic cross-sectional view for describing the same manufacturing method.

Next, for example, as illustrated in FIG. 30, the protective film STSW is removed. This process is performed, for example, by method, such as wet etching.

Figure 31:
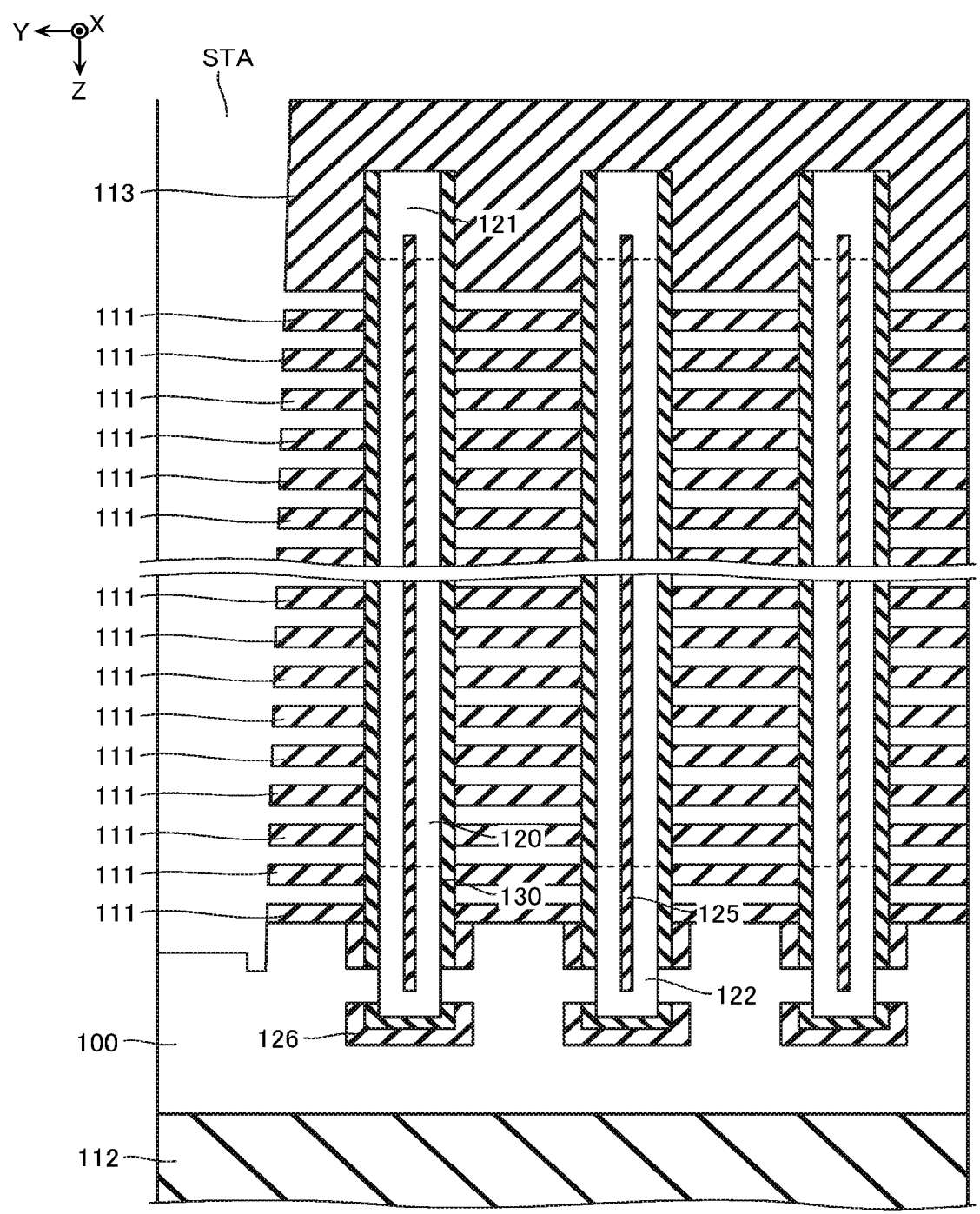
FIG. 31 is a schematic cross-sectional view for describing the same manufacturing method.

Next, for example, as illustrated in FIG. 31, the sacrifice layers 110A are removed via the trench STA. This forms a hollow structure that includes the plurality of inter-layer insulating layers 111 arranged in the Z-direction and a structure in the memory holes LMH, UMH (the semiconductor layers 120, the gate insulating films 130, and the insulating layers 125) that support these inter-layer insulating layers 111. This process is performed, for example, by method, such as wet etching.

Figure 32:
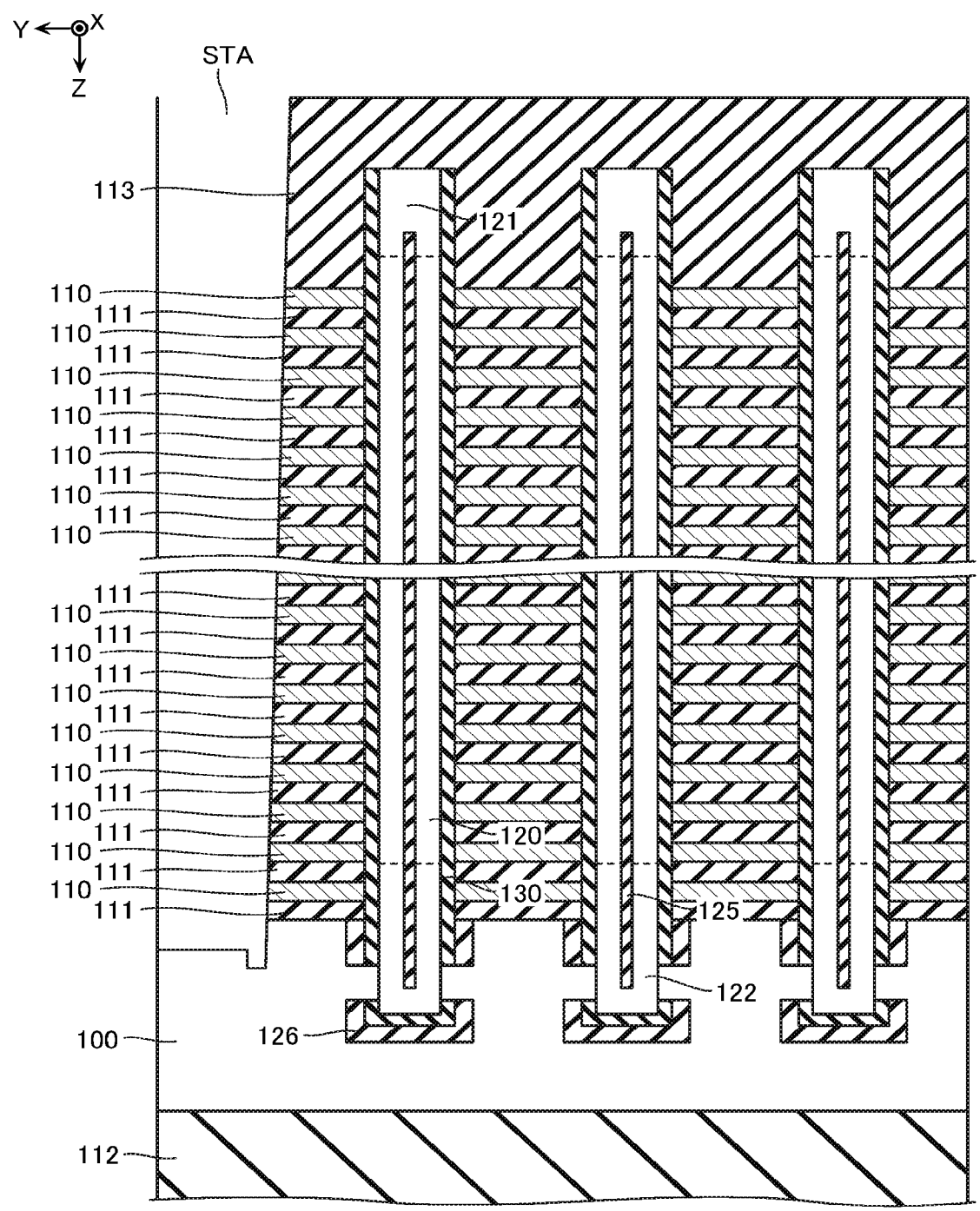
FIG. 32 is a schematic cross-sectional view for describing the same manufacturing method.

Next, for example, as illustrated in FIG. 32, the conductive layers 110 are formed. This process is performed, for example, by method, such as CVD.

Figure 33:
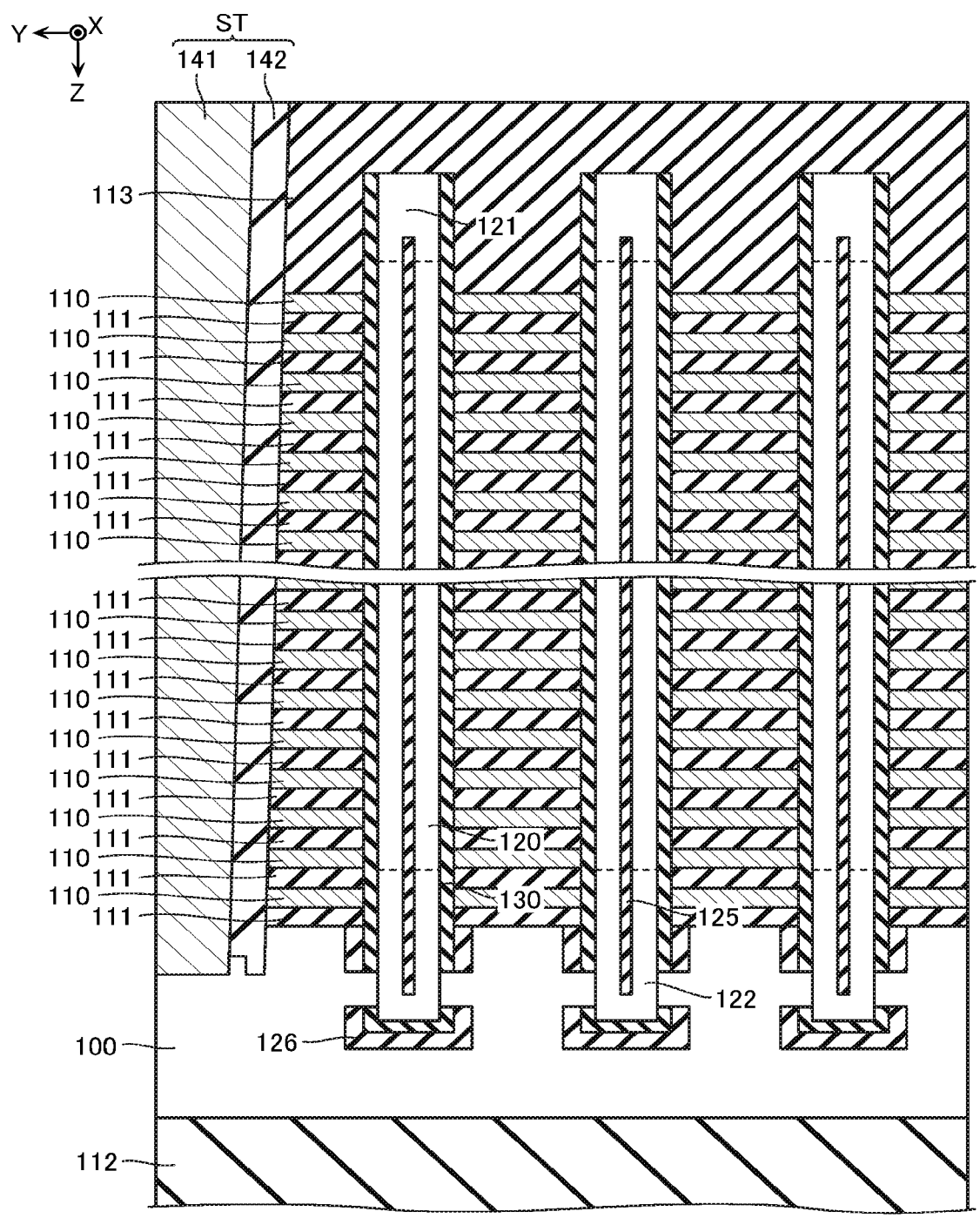
FIG. 33 is a schematic cross-sectional view for describing the same manufacturing method.

Next, for example, as illustrated in FIG. 33, the inter-block structure ST is formed in the trench STA. This process is performed, for example, by method, such as CVD and RIE.

Figure 34:
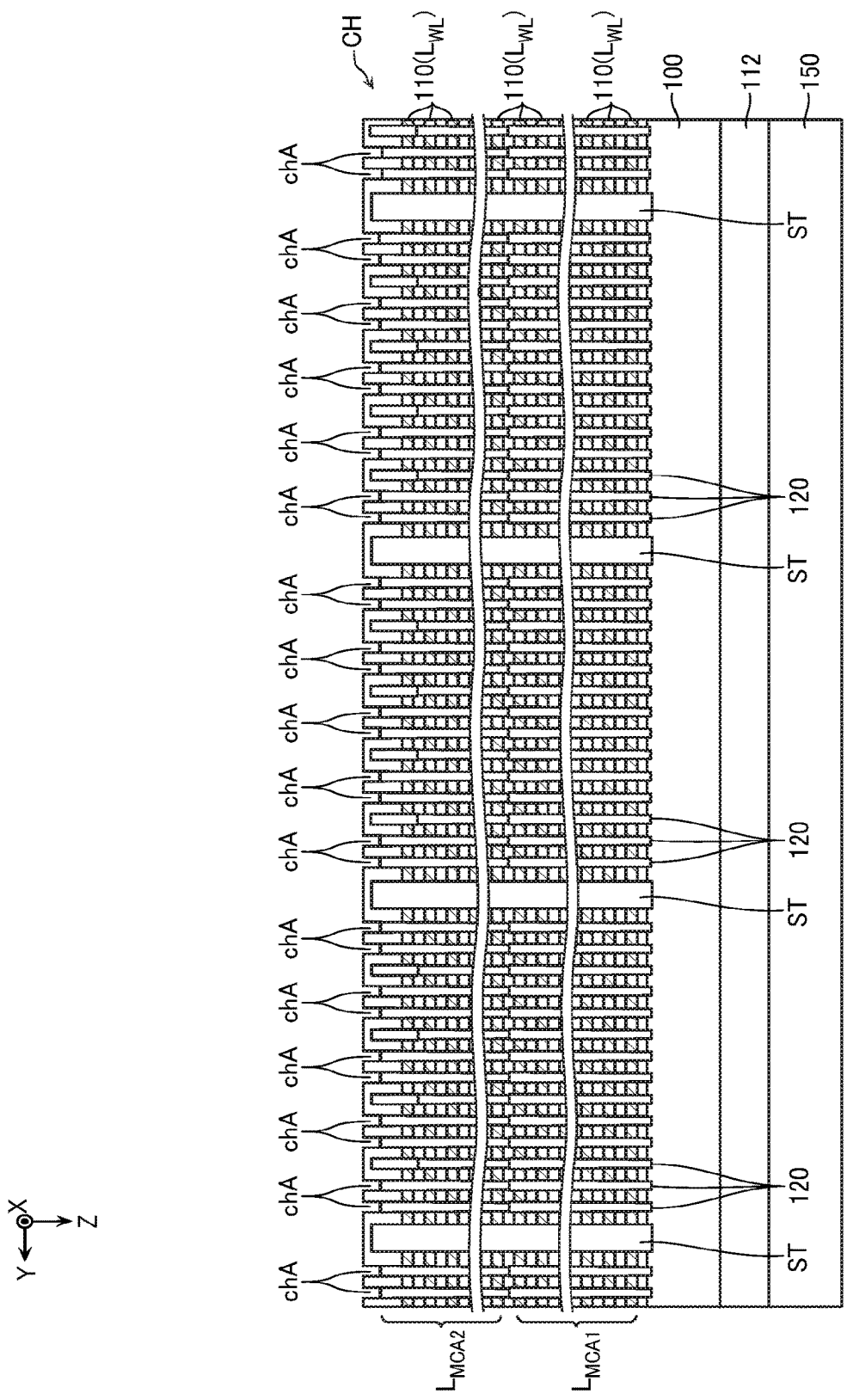
FIG. 34 is a schematic cross-sectional view for describing the same manufacturing method.
Figure 35:
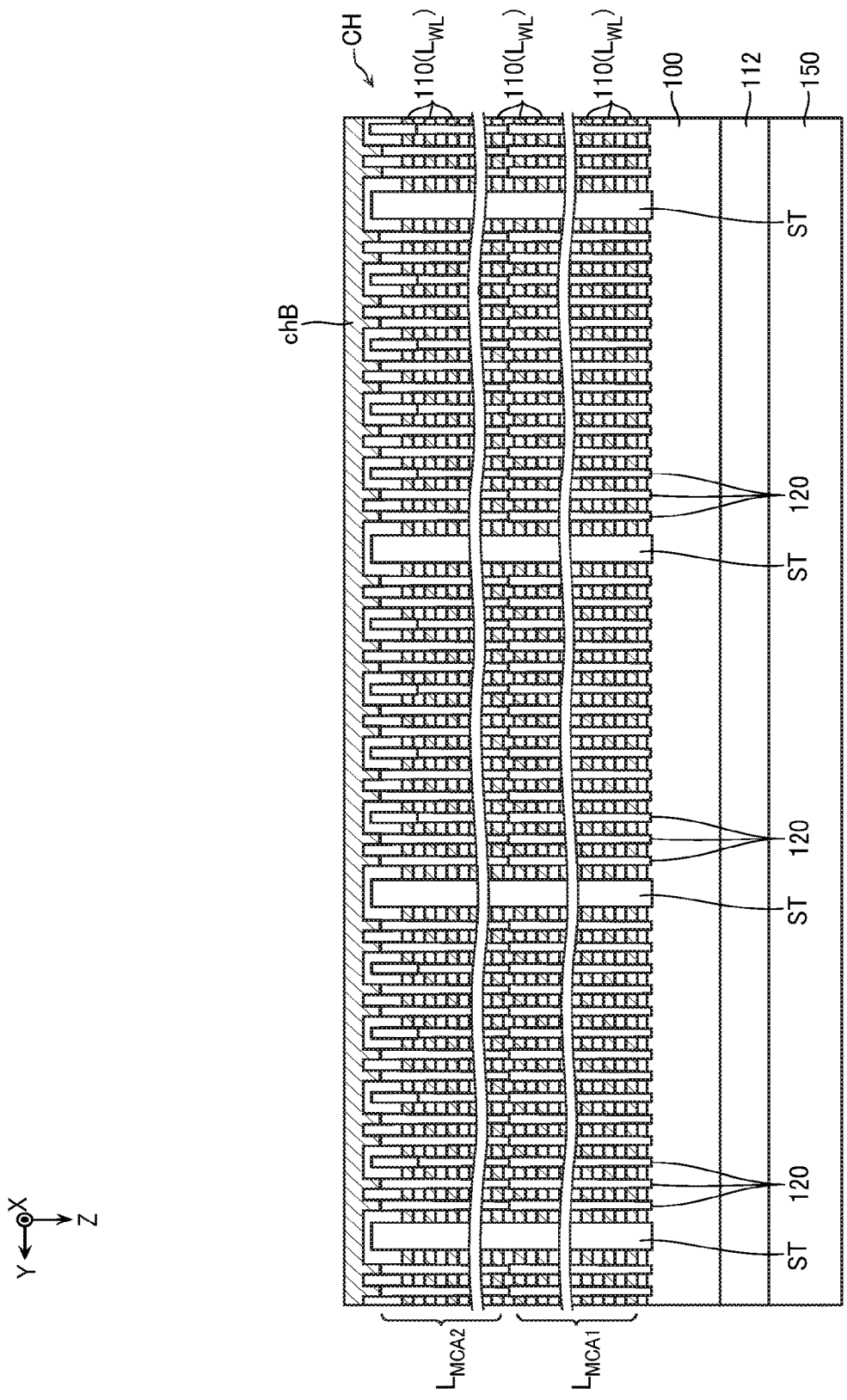
FIG. 35 is a schematic cross-sectional view for describing the same manufacturing method.
Figure 36:
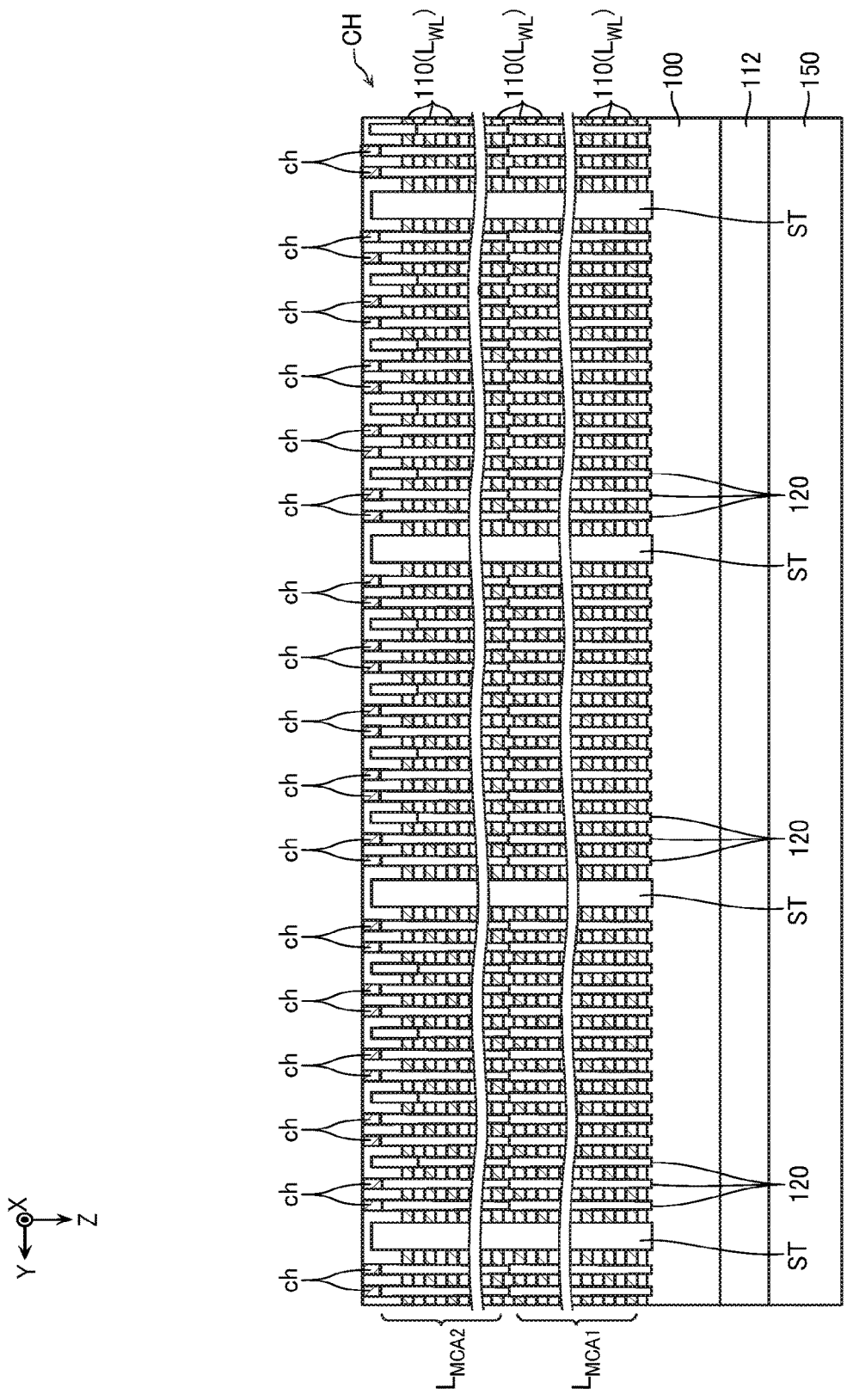
FIG. 36 is a schematic cross-sectional view for describing the same manufacturing method.

Next, for example, as illustrated in FIG. 34 to FIG. 36, by damascene process, the via-contact electrodes ch are formed.

For example, as illustrated in FIG. 34, a plurality of contact holes chA are formed at positions corresponding to the via-contact electrodes ch. The contact holes chA extend in the Z-direction to expose the surfaces of the semiconductor layers 120. This process is performed, for example, by method, such as RIE.

Next, for example, as illustrated in FIG. 35, a conductive layer chB is formed inside the contact holes chA. This process is performed, for example, by method, such as CVD.

Next, for example, as illustrated in FIG. 36, a part of the conductive layer chB is removed, and thus, the plurality of via-contact electrodes ch are formed. This process is performed, for example, by method, such as Chemical Mechanical Polishing (CMP).

Figure 37:
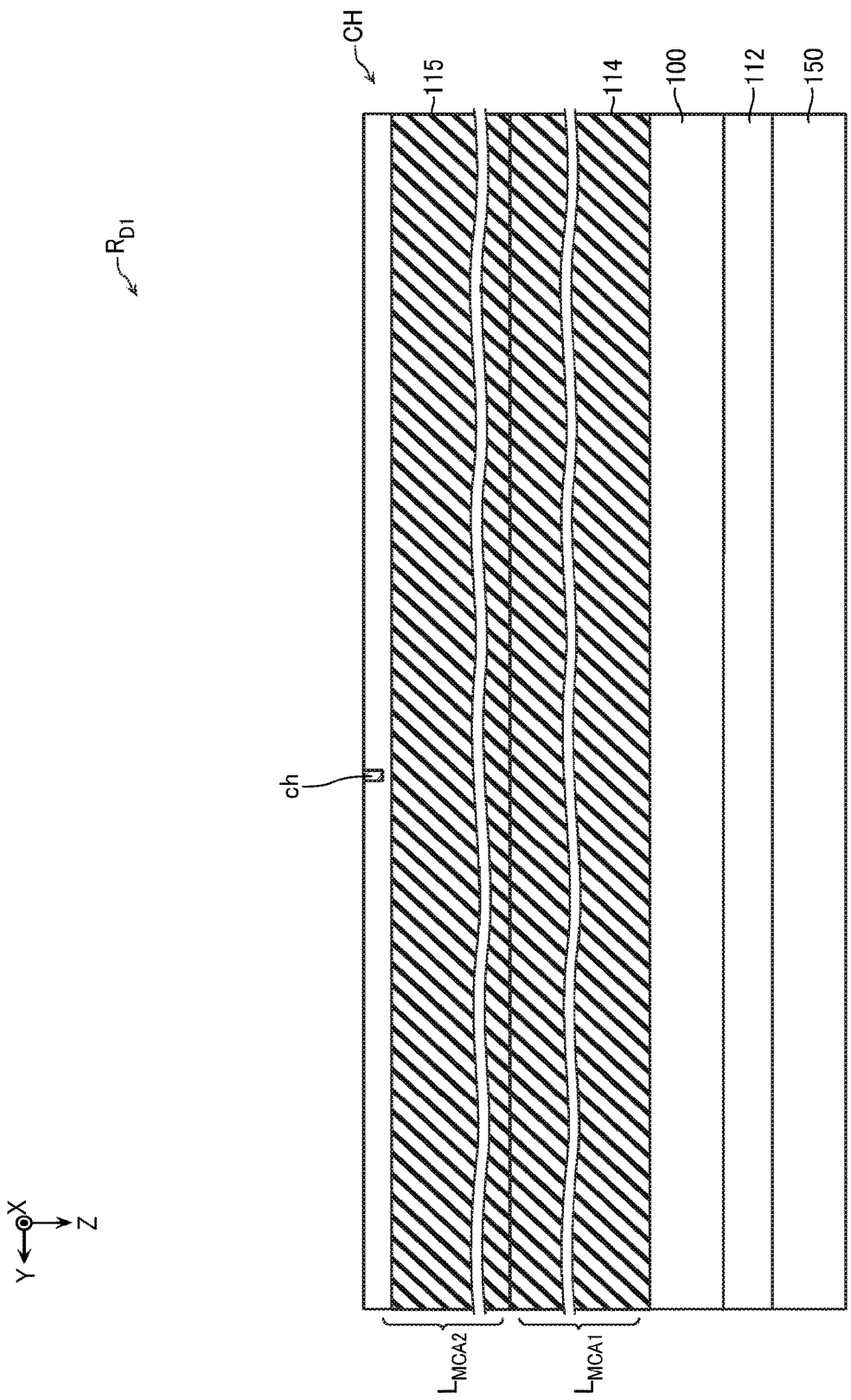
FIG. 37 is a schematic cross-sectional view for describing the same manufacturing method.

As illustrated in FIG. 37, in this process, simultaneously with patterning and forming the via-contact electrodes ch, the via-contact electrode ch (conductive member) is patterned and formed also in the wiring marked region R$_{D1}$. Note that, on the conductive layer 100 in the wiring marked region R$_{D1}$, the word line layers L$_{WL}$ corresponding to the memory cell array layers L$_{MCA1}$, L$_{MCA2}$ are not disposed, and insulating layers 114, 115 of, for example, silicon oxide (SiO$_2$) may be formed at height positions corresponding to the memory cell array layers L$_{MCA1}$, L$_{MCA2}$.

Figure 38:
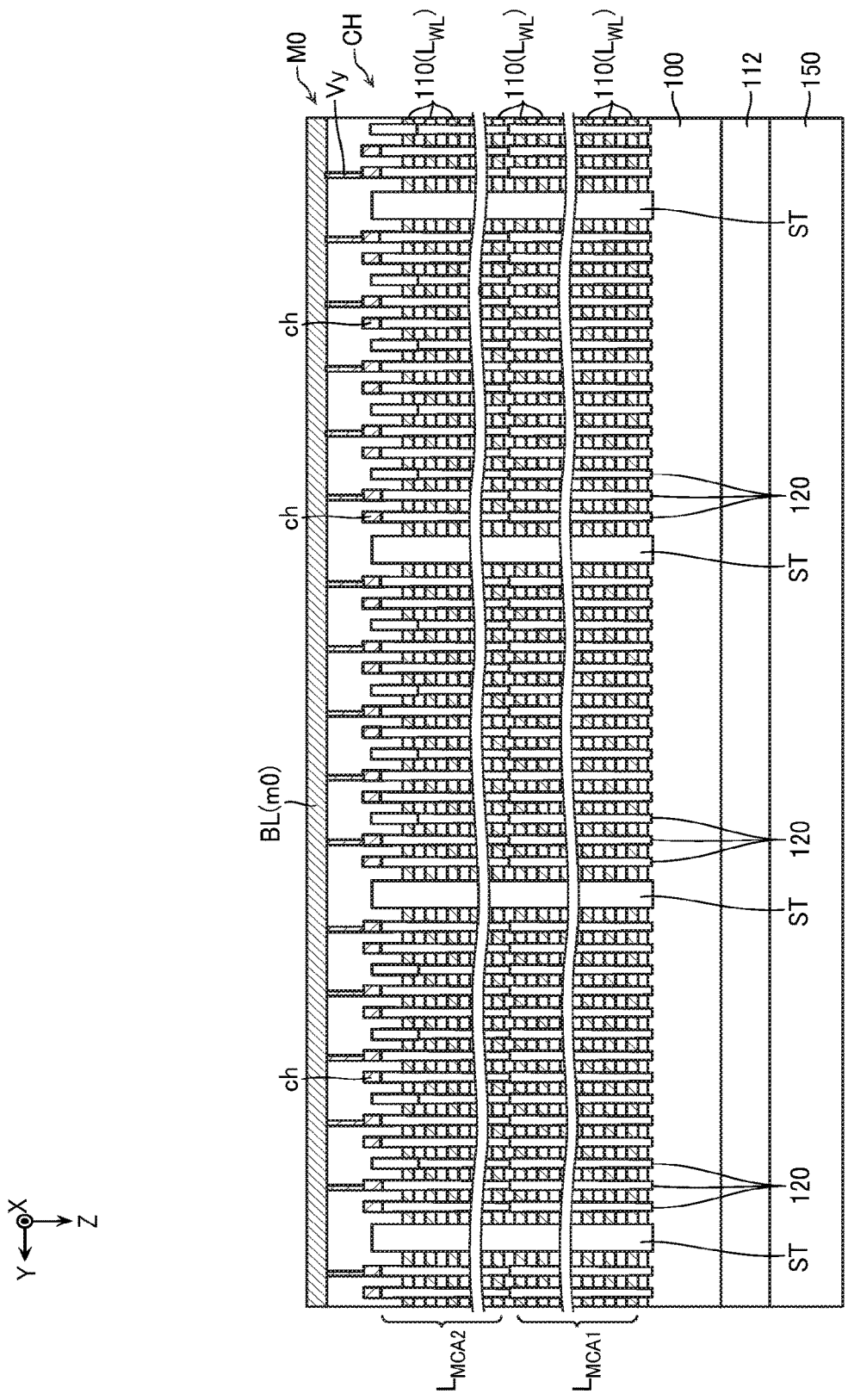
FIG. 38 is a schematic cross-sectional view for describing the same manufacturing method.

Next, for example, as illustrated in FIG. 38, by damascene process, the wiring layer M0 is formed.

Note that, in forming the wiring layer M0, positioning is performed with the via-contact electrode ch (conductive member) in the wiring marked region R$_{D1}$, described with reference to FIG. 37, as a reference.

Figure 39:
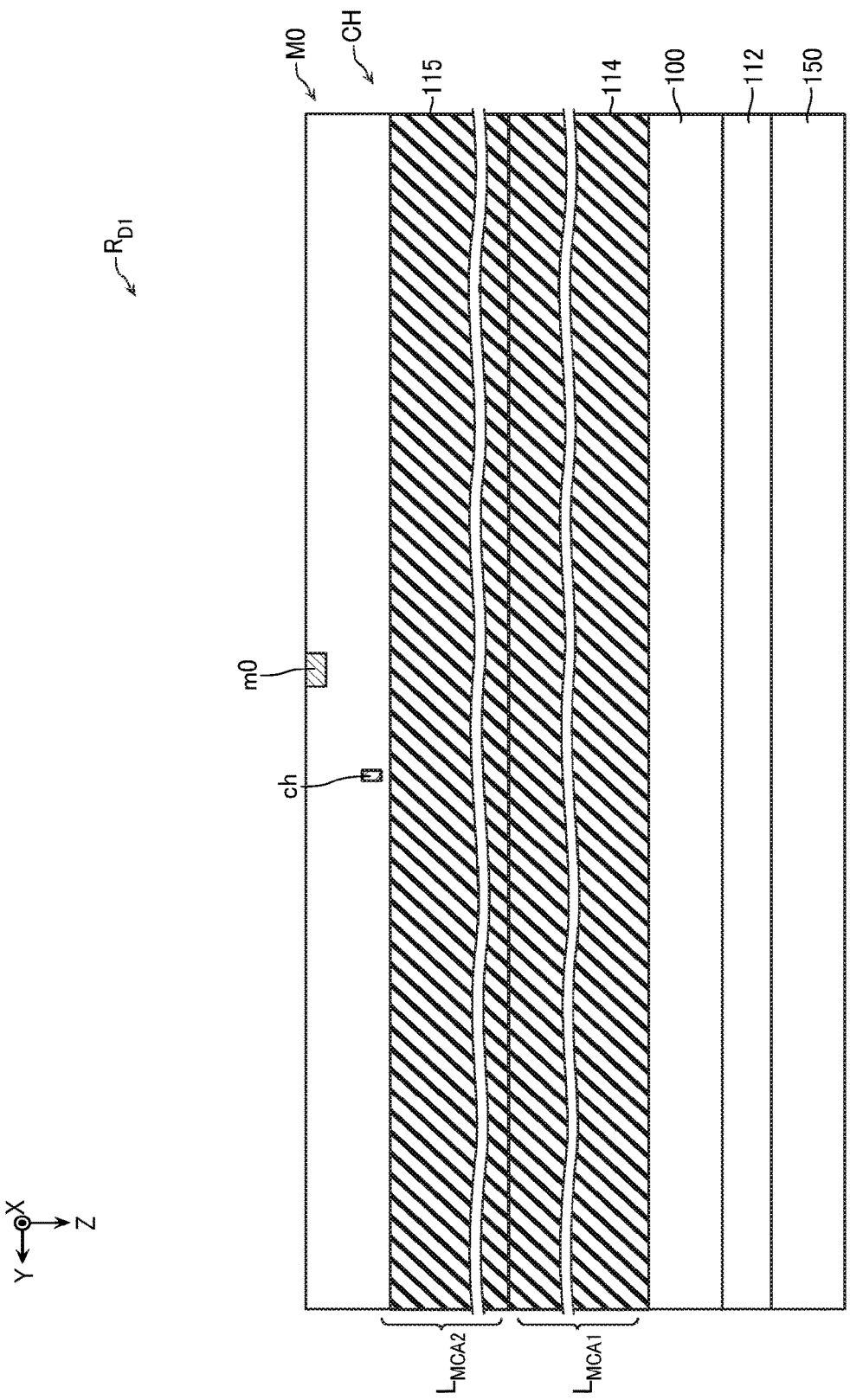
FIG. 39 is a schematic cross-sectional view for describing the same manufacturing method.

As illustrated in FIG. 39, in this process, simultaneously with patterning and forming the wiring layer M0, the wiring m0 (conductive member) is patterned and formed also in the wiring marked region R$_{O1}$.

Figure 40:
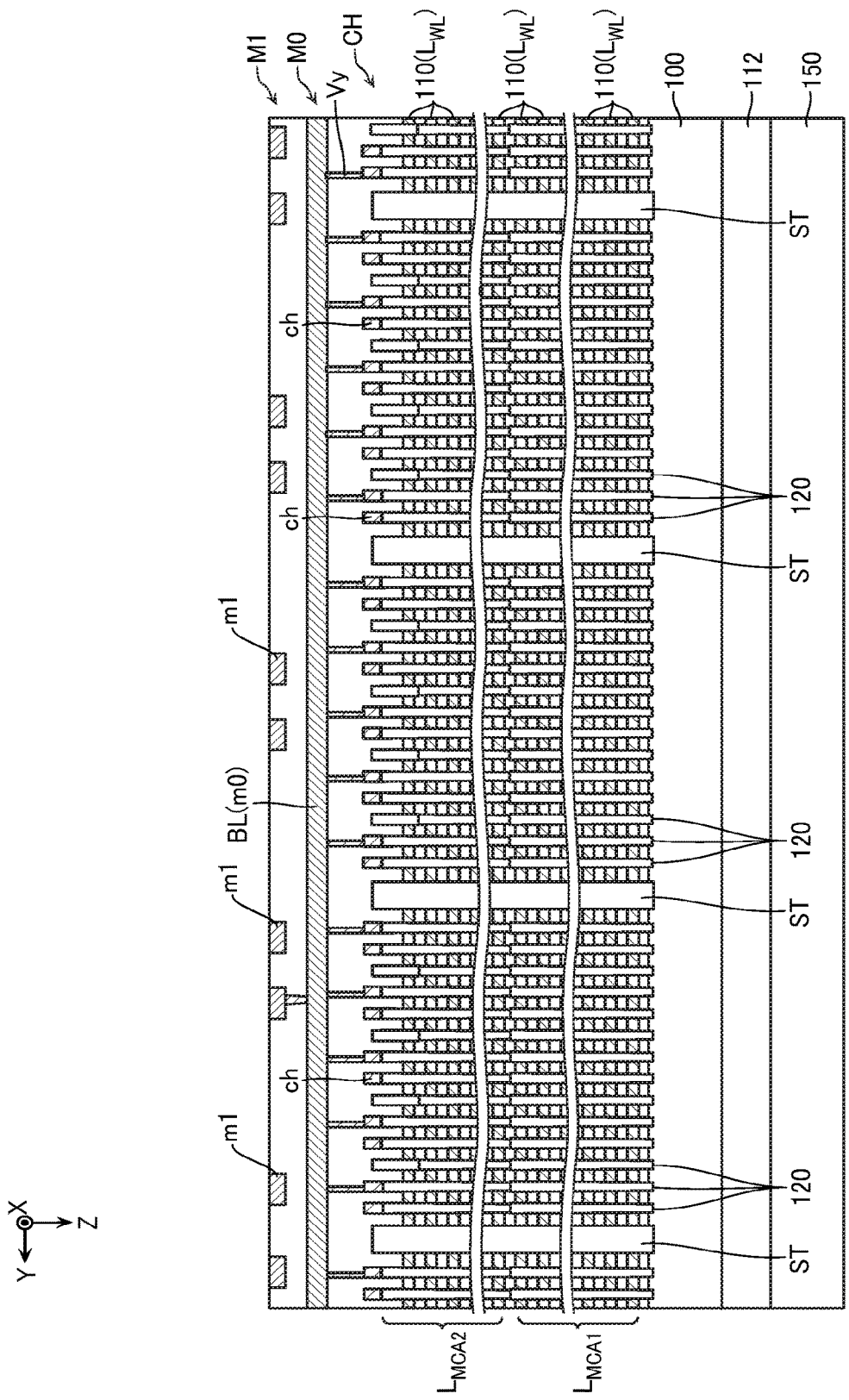
FIG. 40 is a schematic cross-sectional view for describing the same manufacturing method.

Next, for example, as illustrated in FIG. 40, by damascene process, the wiring layer M1 is formed.

Note that, in forming the wiring layer M1, positioning is performed with the wiring m0 (conductive member) in the wiring marked region R$_{D1}$, described with reference to FIG. 39, as a reference.

Figure 41:
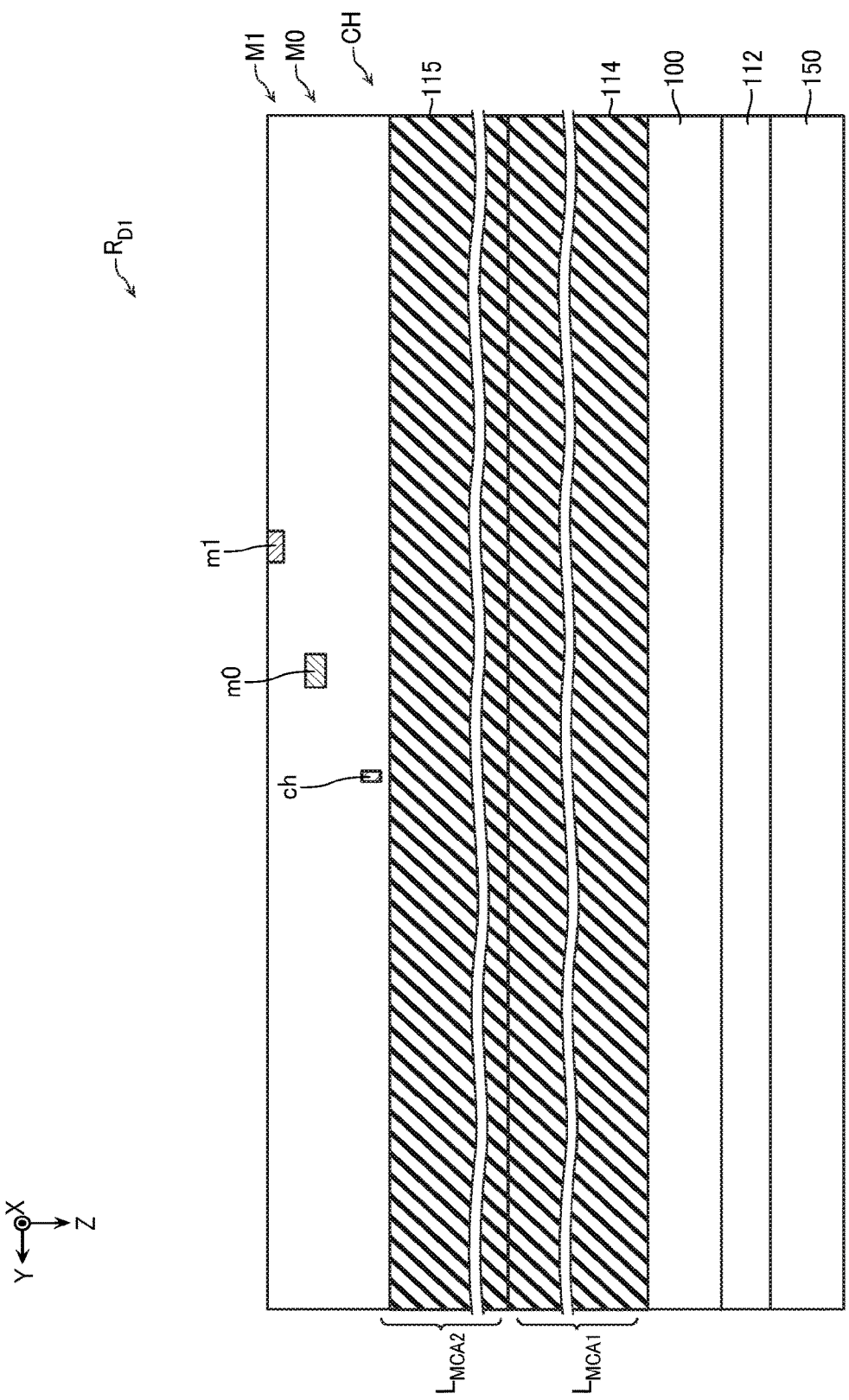
FIG. 41 is a schematic cross-sectional view for describing the same manufacturing method.

As illustrated in FIG. 41, in this process, simultaneously with patterning and forming the wiring layer M1, the wiring m1 (conductive member) is patterned and formed also in the wiring marked region $R_{D1}$.

Figure 42:
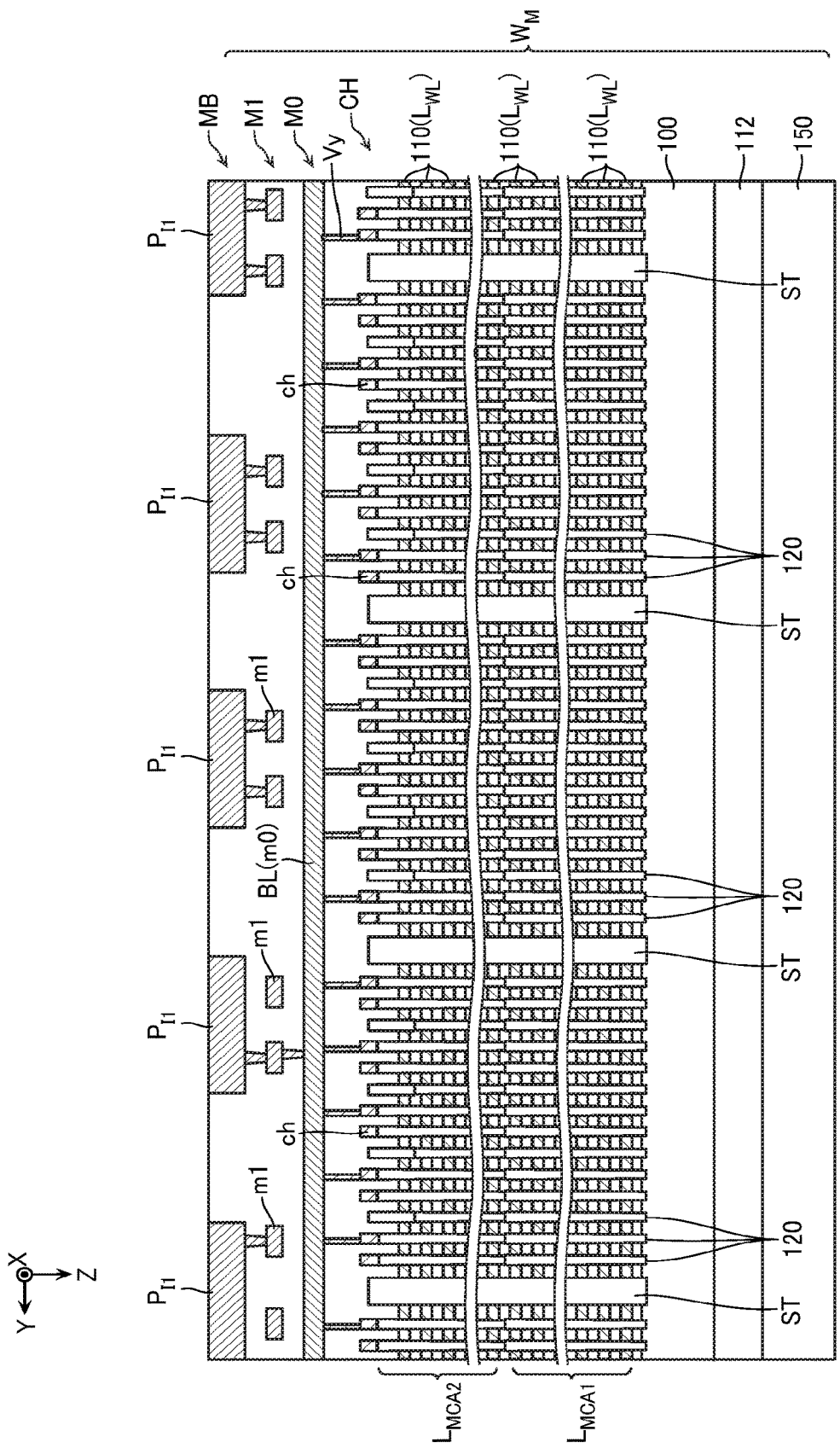
FIG. 42 is a schematic cross-sectional view for describing the same manufacturing method.

Next, for example, as illustrated in FIG. 42, by damascene process, the wiring layer MB is formed.

Note that, in forming the wiring layer MB, positioning is performed with the wiring m1 (conductive member) in the wiring marked region $R_{D1}$, described with reference to FIG. 41, as a reference.

[Method for Manufacturing Wafer $W_P$]

FIG. 43 illustrates a surface of a semiconductor substrate 250 corresponding to the wafer $W_P$. FIG. 44 illustrates an enlarged part of FIG. 43. As illustrated in FIG. 43, the semiconductor substrate 250 has the surface on which the plurality of memory regions $R_{MD}$ and a plurality of kerf regions $R_K$ disposed between each two of the plurality of memory regions $R_{MD}$ are disposed similarly to the surface of the semiconductor substrate 150. The kerf region $R_K$ includes various kinds of regions used in manufacturing the memory dies MD as illustrated in FIG. 44. FIG. 44 illustrates film thickness measurement regions $R_{G1}$, $R_{G2}$, and a wiring marked region $R_{D2}$.

Figure 45:
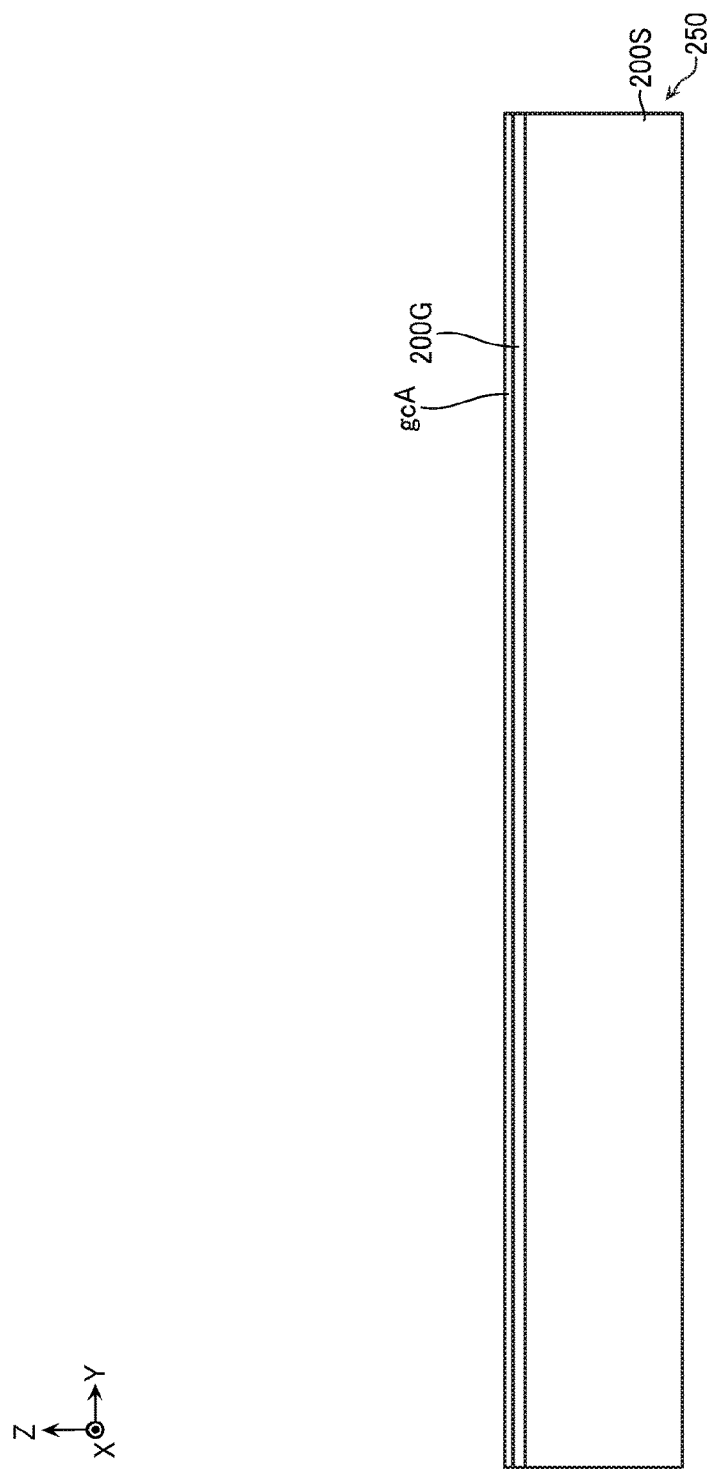
FIG. 45 is a schematic cross-sectional view for describing the same manufacturing method.

In manufacturing the wafer $W_P$, for example, as illustrated in FIG. 45, an insulating layer 200G is formed on a surface of the semiconductor substrate 250. This process is performed, for example, by thermal oxidation. Additionally, a conductive layer gcA containing, for example, polysilicon is formed on a surface of the insulating layer 200G. This process is performed, for example, by CVD.

Figure 46:
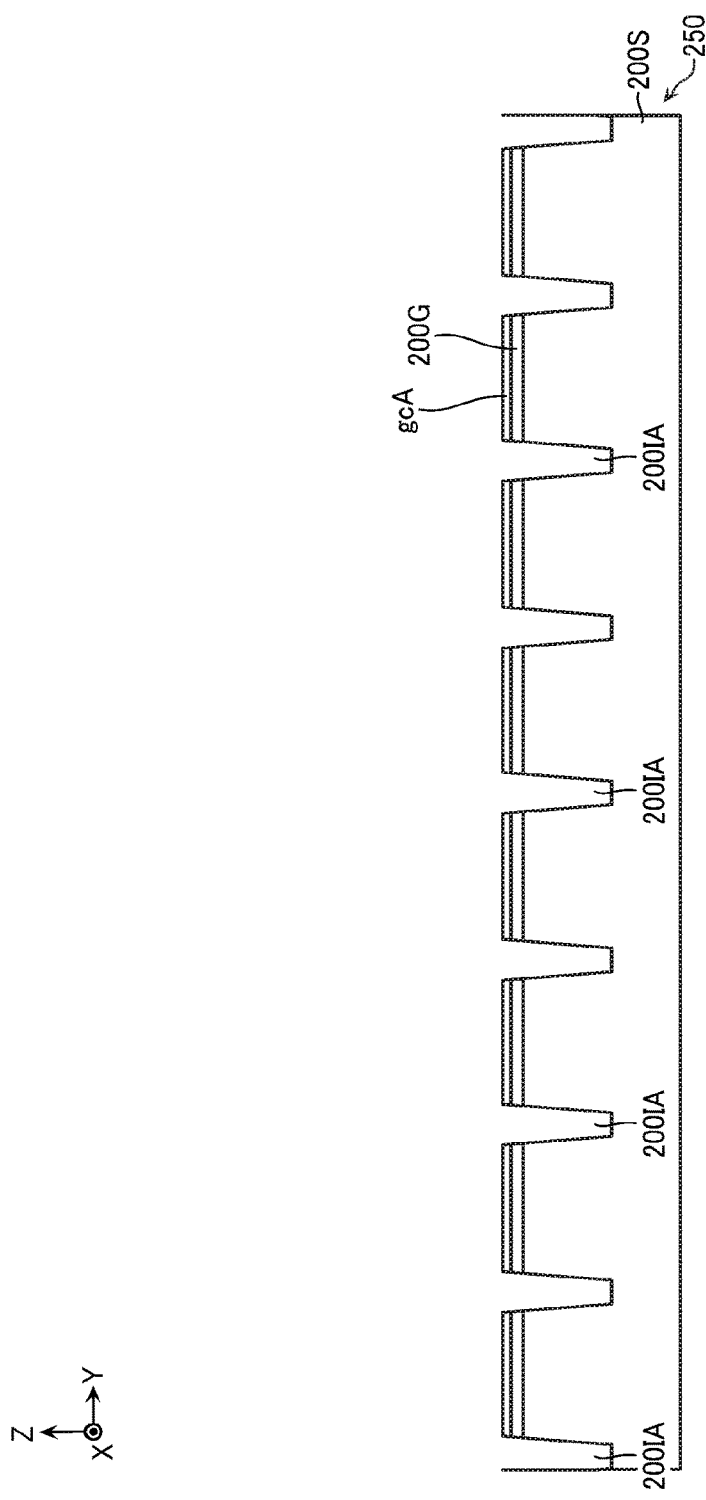
FIG. 46 is a schematic cross-sectional view for describing the same manufacturing method.

Next, for example, as illustrated in FIG. 46, openings 200IA are formed at positions corresponding to the insulating regions 200I described with reference to FIG. 7. The openings 200IA extend in the Z-direction and the X-direction or the Y-direction, pass through the conductive layer gcA and the insulating layer 200G, and separate parts of the surface of the semiconductor substrate 250. This process is performed, for example, by method, such as RIE.

Figure 47:
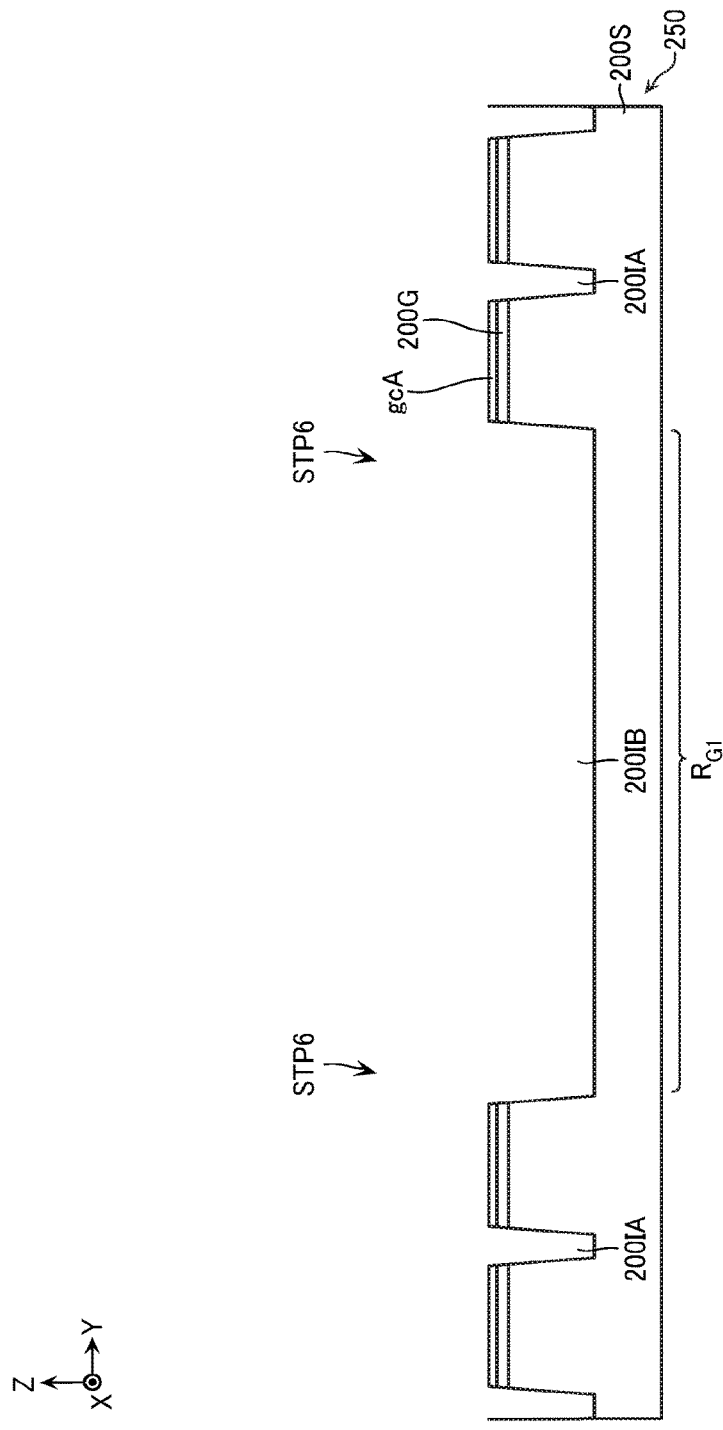
FIG. 47 is a schematic cross-sectional view for describing the same manufacturing method.

Note that, as illustrated in FIG. 47, in this process, simultaneously with patterning and forming the openings 200IA, an opening 200IB is patterned and formed in the film thickness measurement region $R_{G1}$. The opening 200IB has an inner diameter larger than a width of the opening 200IA. This forms a step STP6 on a surface of the structure illustrated in FIG. 47.

Figure 48:
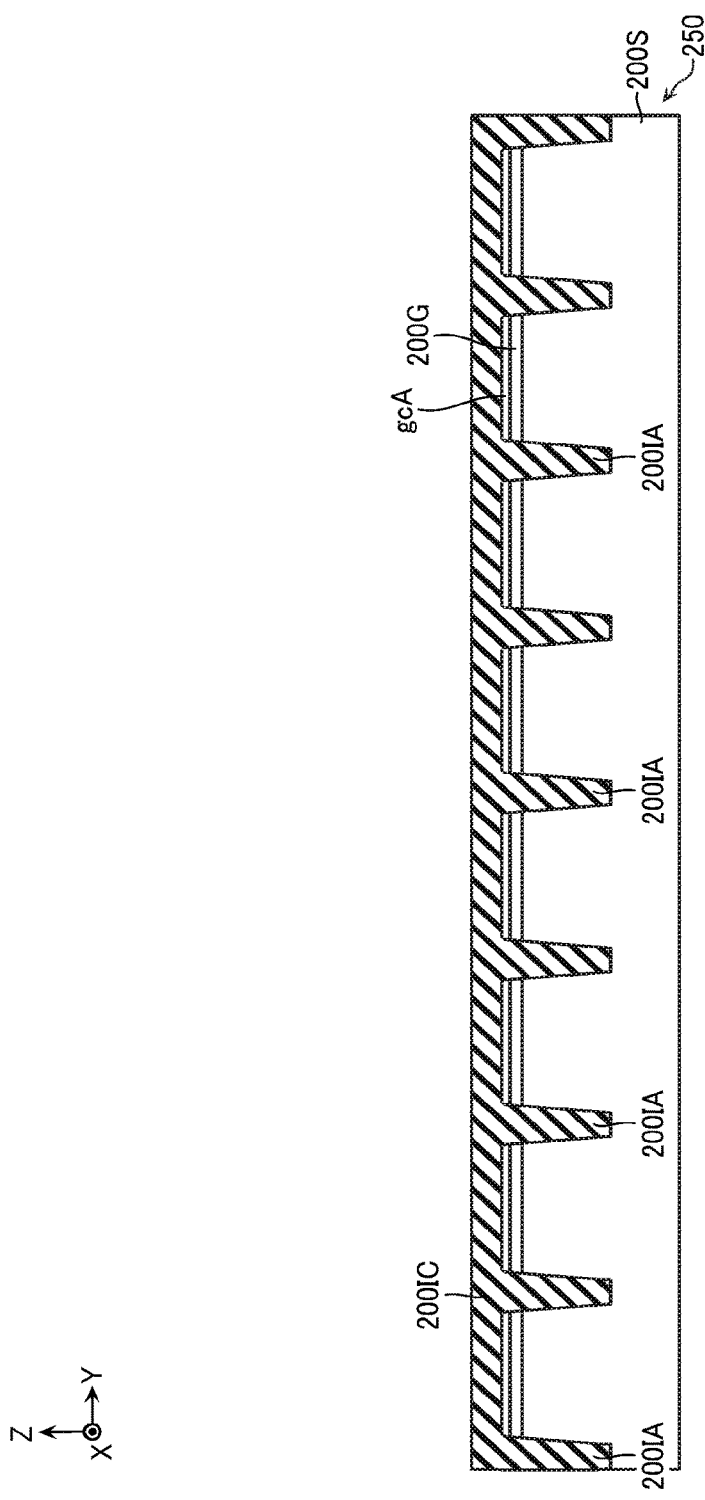
FIG. 48 is a schematic cross-sectional view for describing the same manufacturing method.

Next, for example, as illustrated in FIG. 48, an insulating layer 200IC is formed on the semiconductor substrate 250. This process is performed, for example, by CVD.

Figure 49:
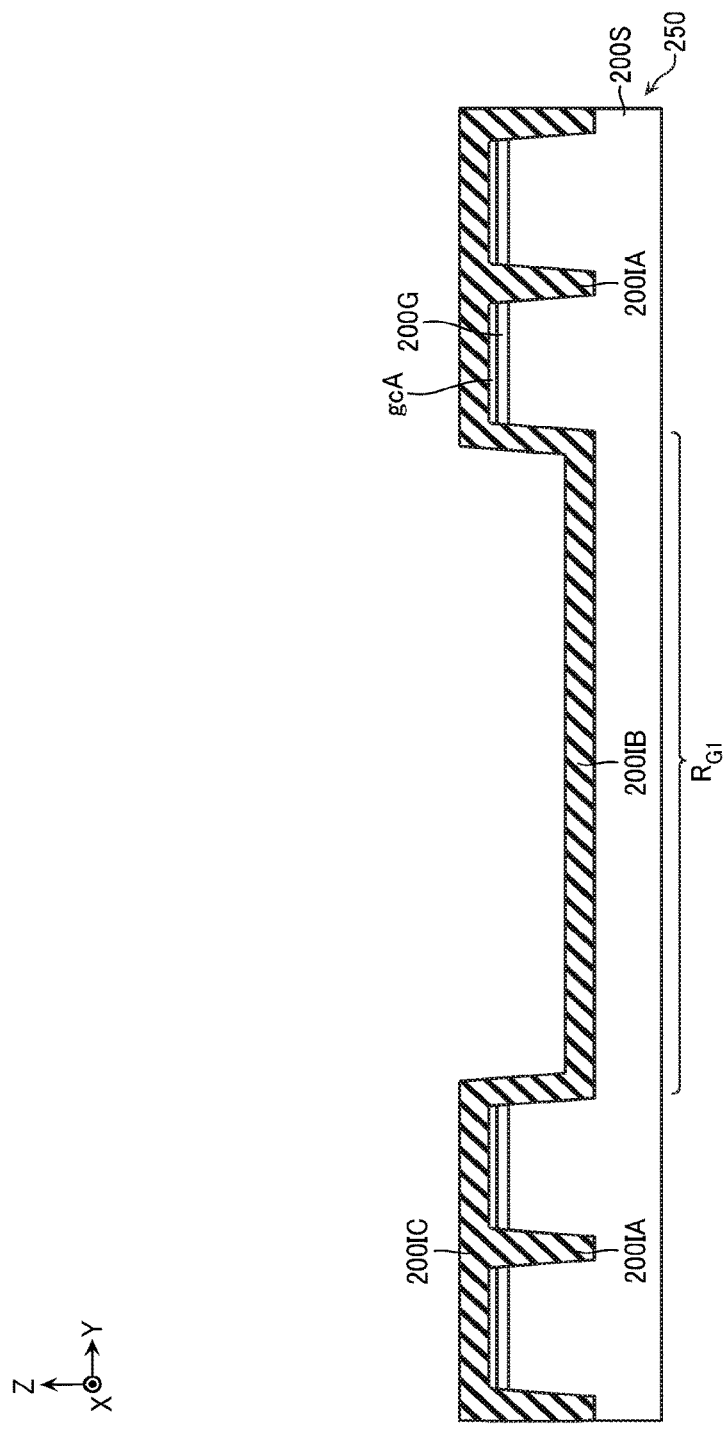
FIG. 49 is a schematic cross-sectional view for describing the same manufacturing method.

Note that, as illustrated in FIG. 49, in this process, the insulating layer 200IC is formed also in the film thickness measurement region $R_{G1}$. Here, the openings 200IA are filled with the insulating layer 200IC. On the other hand, the opening 200IB is not filled with the insulating layer 200IC. Therefore, it is possible to preferably measure a film thickness of the insulating layer 200IC by measuring a film thickness in the film thickness measurement region $R_{G1}$.

Figure 50:
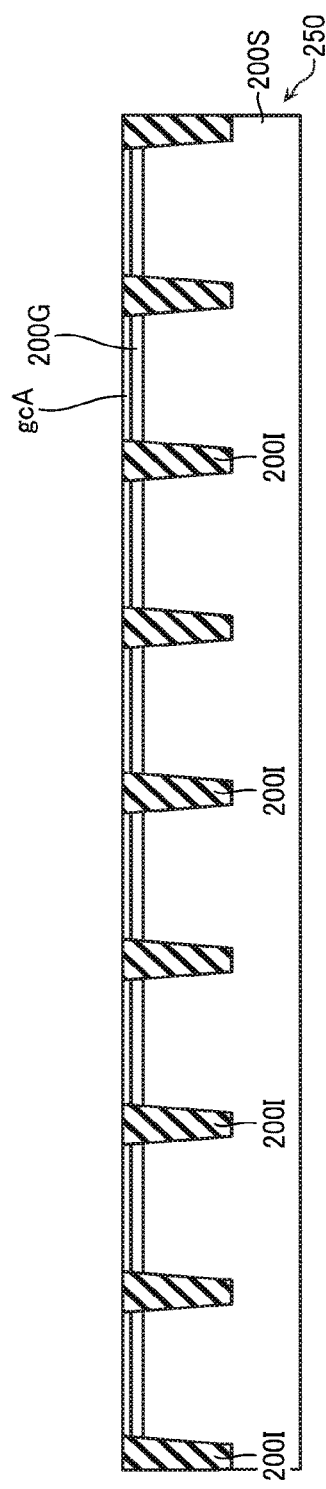
FIG. 50 is a schematic cross-sectional view for describing the same manufacturing method.

Next, for example, as illustrated in FIG. 50, a part of the insulating layer 200IC is removed, and thus, a plurality of insulating regions 200I are formed. This process is performed, for example, by method, such as CMP.

Figure 51:
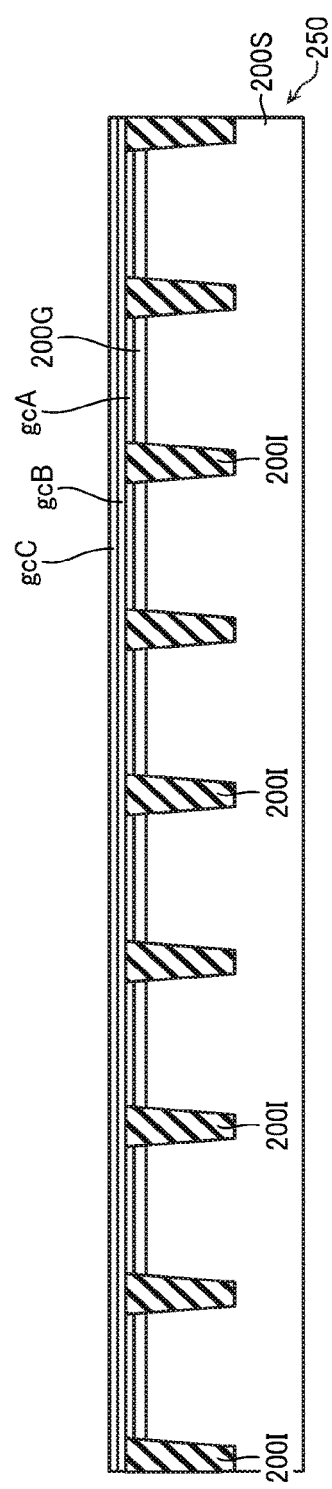
FIG. 51 is a schematic cross-sectional view for describing the same manufacturing method.

Next, for example, as illustrated in FIG. 51, a conductive layer gcB containing, for example, tungsten (W) and an insulating layer gcC containing, for example, silicon nitride (SiN) are formed on a surface of the conductive layer gcA. This process is performed, for example, by CVD.

Figure 52:
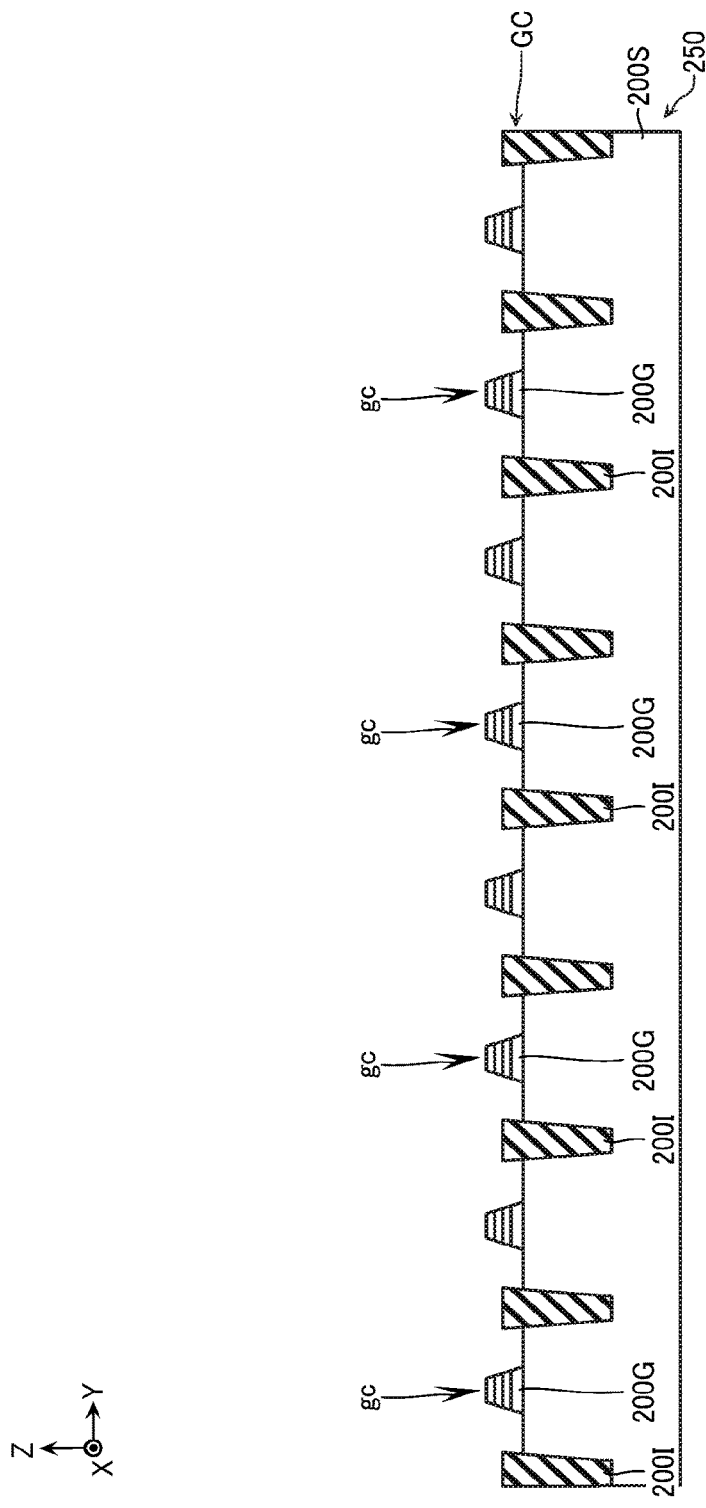
FIG. 52 is a schematic cross-sectional view for describing the same manufacturing method.

Next, for example, as illustrated in FIG. 52, parts of the insulating layer gcC, the conductive layers gcB, gcA, and the insulating layer 200G are removed to expose the surface of the semiconductor substrate 250, and thus, a plurality of electrodes gc are formed. This process is performed, for example, by RIE.

Figure 53:
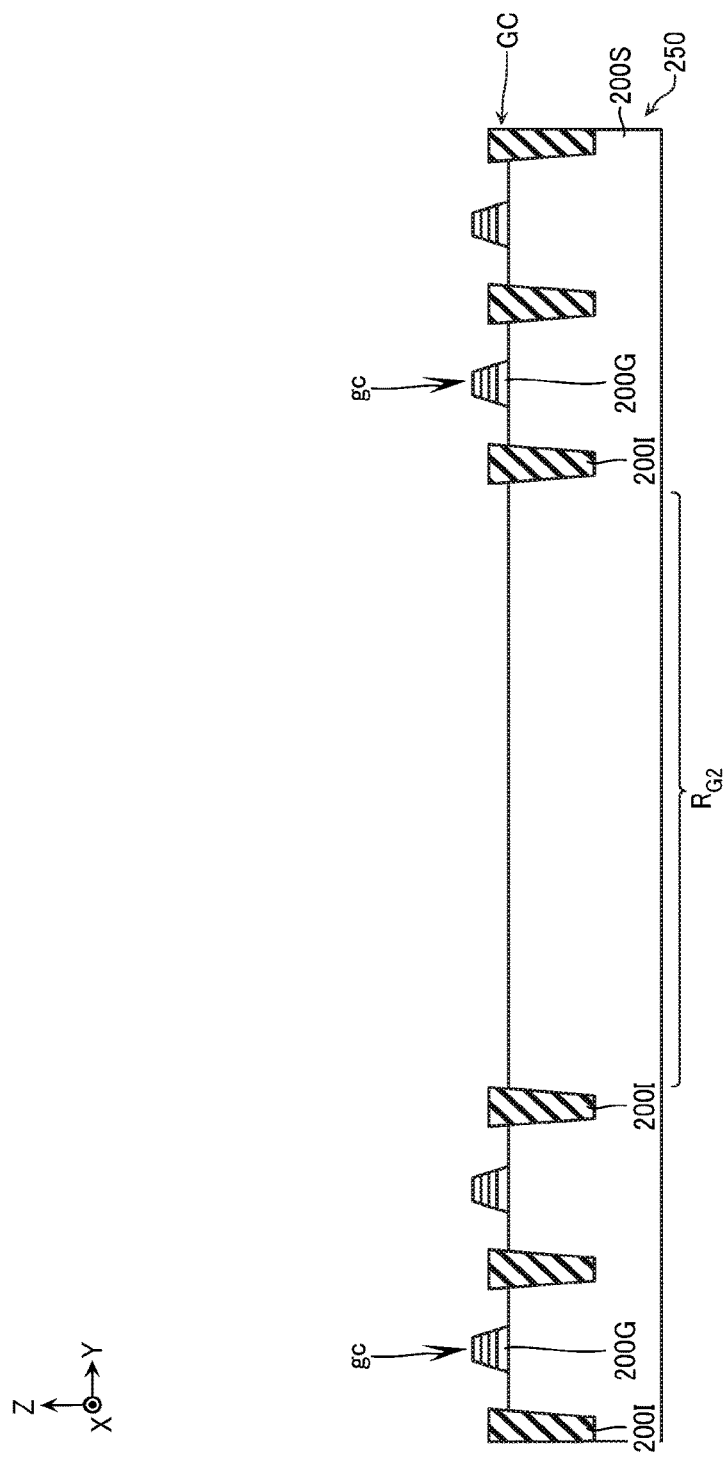
FIG. 53 is a schematic cross-sectional view for describing the same manufacturing method.

Note that, as illustrated in FIG. 53, in this process, the insulating layer gcC, the conductive layers gcB, gcA, and the insulating layer 200G are removed in the film thickness measurement region $R_{G2}$, and thus, the surface of the semiconductor substrate 250 is exposed.

Figure 54:
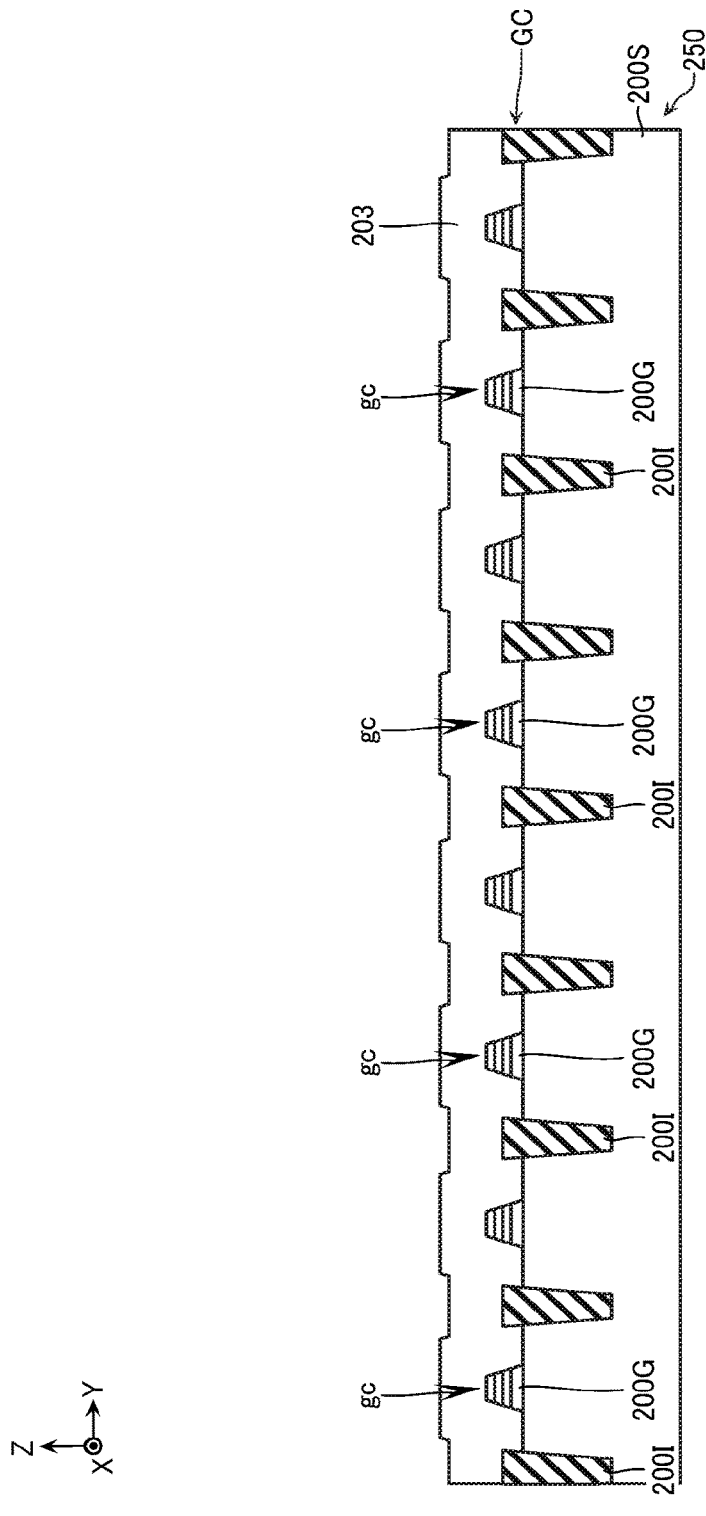
FIG. 54 is a schematic cross-sectional view for describing the same manufacturing method.

Next, for example, as illustrated in FIG. 54, an insulating layer 203 of, for example, silicon oxide is formed on a surface of the structure illustrated in FIG. 52. This process is performed, for example, by CVD.

Figure 55:
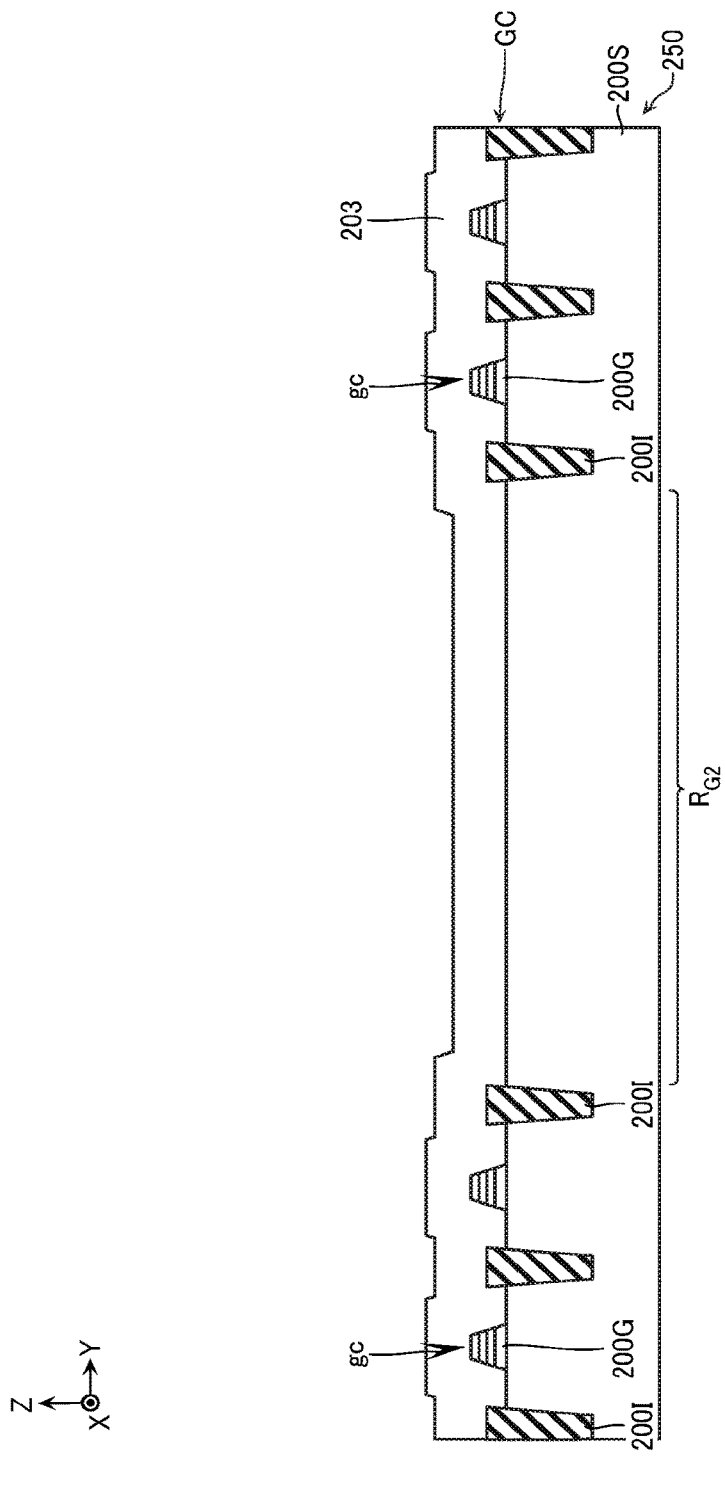
FIG. 55 is a schematic cross-sectional view for describing the same manufacturing method.

Note that, as illustrated in FIG. 55, in this process, the insulating layer 203 is formed in the film thickness measurement region $R_{G2}$. Here, the insulating region 200I is not disposed in the film thickness measurement region $R_{G2}$. The insulating layer gcC, the conductive layers gcB, gcA, and the insulating layer 200G are also not disposed in the film thickness measurement region $R_{G2}$. Therefore, it is possible to preferably measure a film thickness of the insulating layer 203 by measuring a film thickness in the film thickness measurement region $R_{G2}$.

Figure 56:
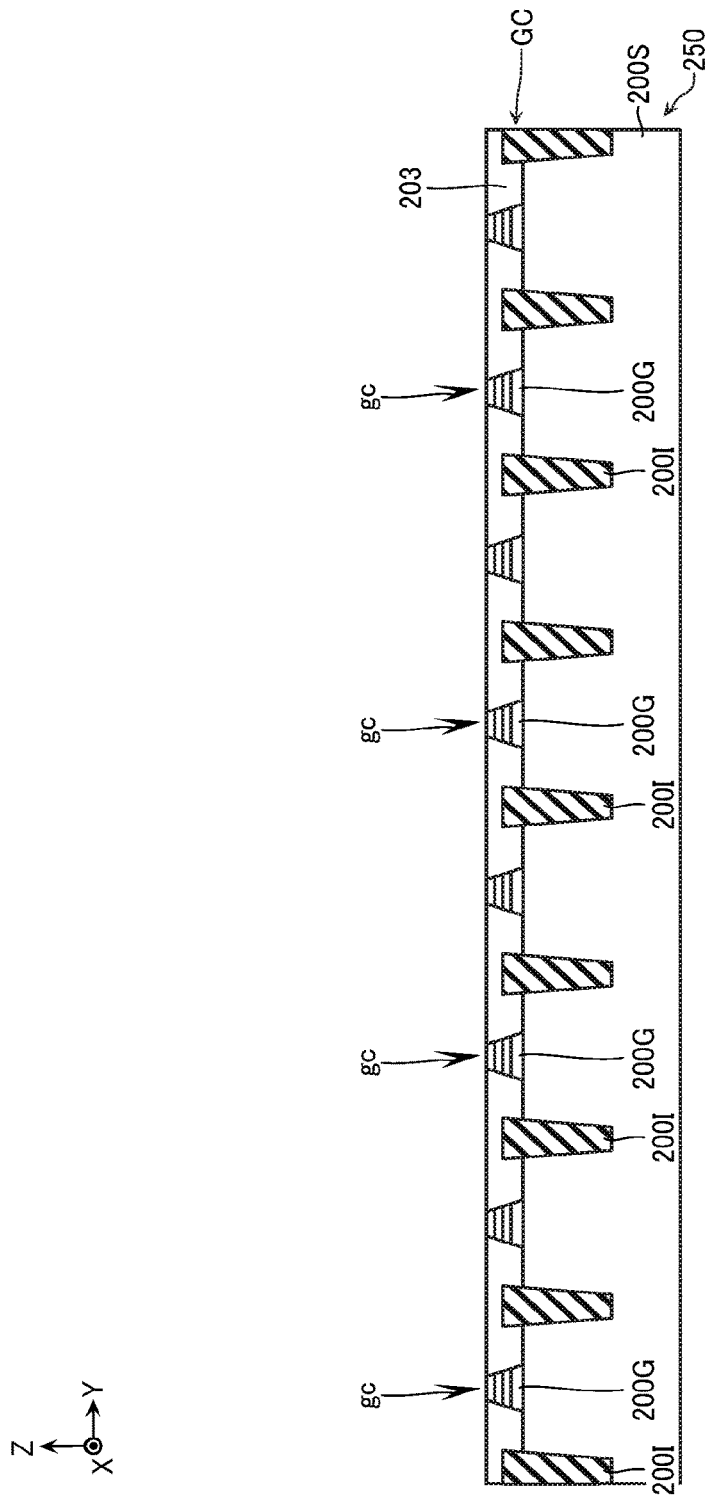
FIG. 56 is a schematic cross-sectional view for describing the same manufacturing method.

Next, for example, as illustrated in FIG. 56, a part of the insulating layer 203 is removed, and thus, a surface of the structure illustrated in FIG. 52 is planarized. This process is performed, for example, by CMP.

Figure 57:
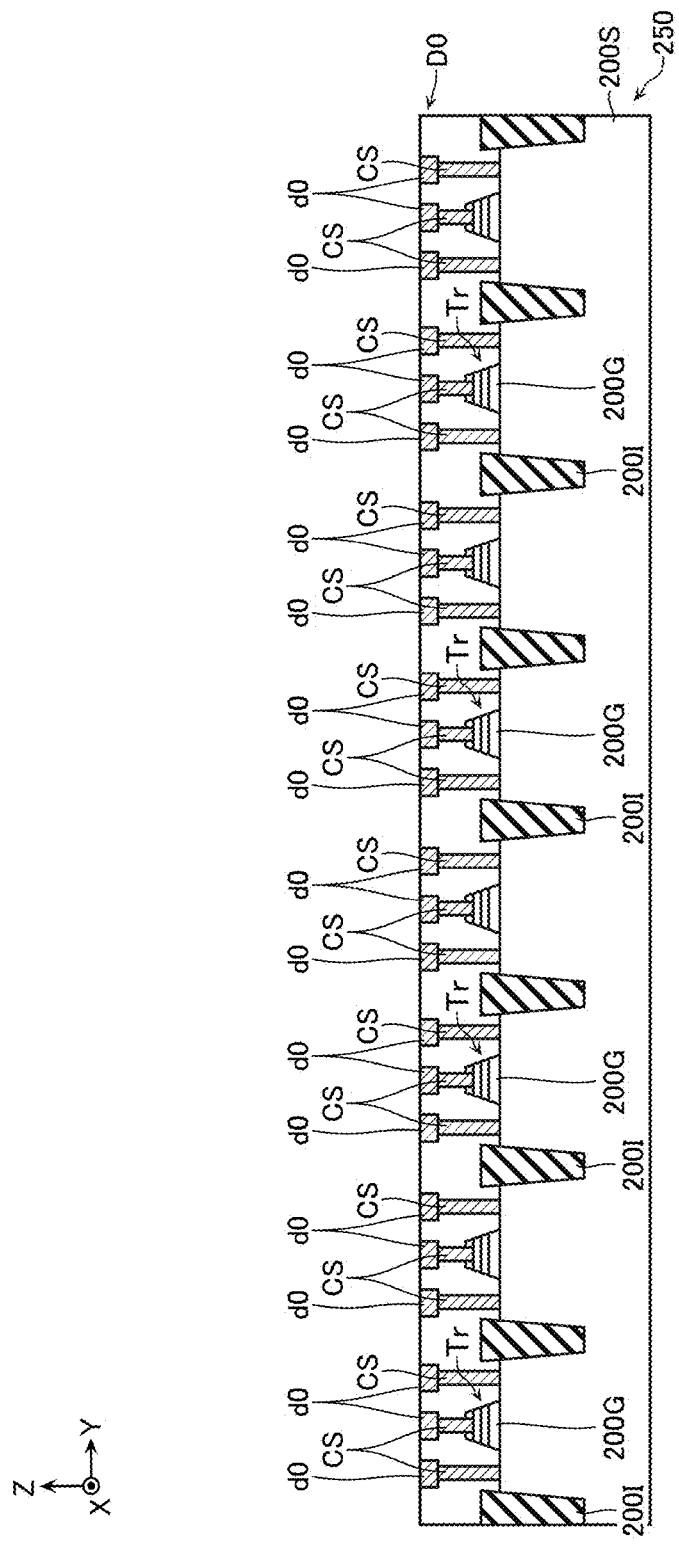
FIG. 57 is a schematic cross-sectional view for describing the same manufacturing method.

Next, for example, as illustrated in FIG. 57, by damascene process, the via-contact electrodes CS and the wiring layer D0, described with reference to FIG. 7, are formed.

Figure 58:
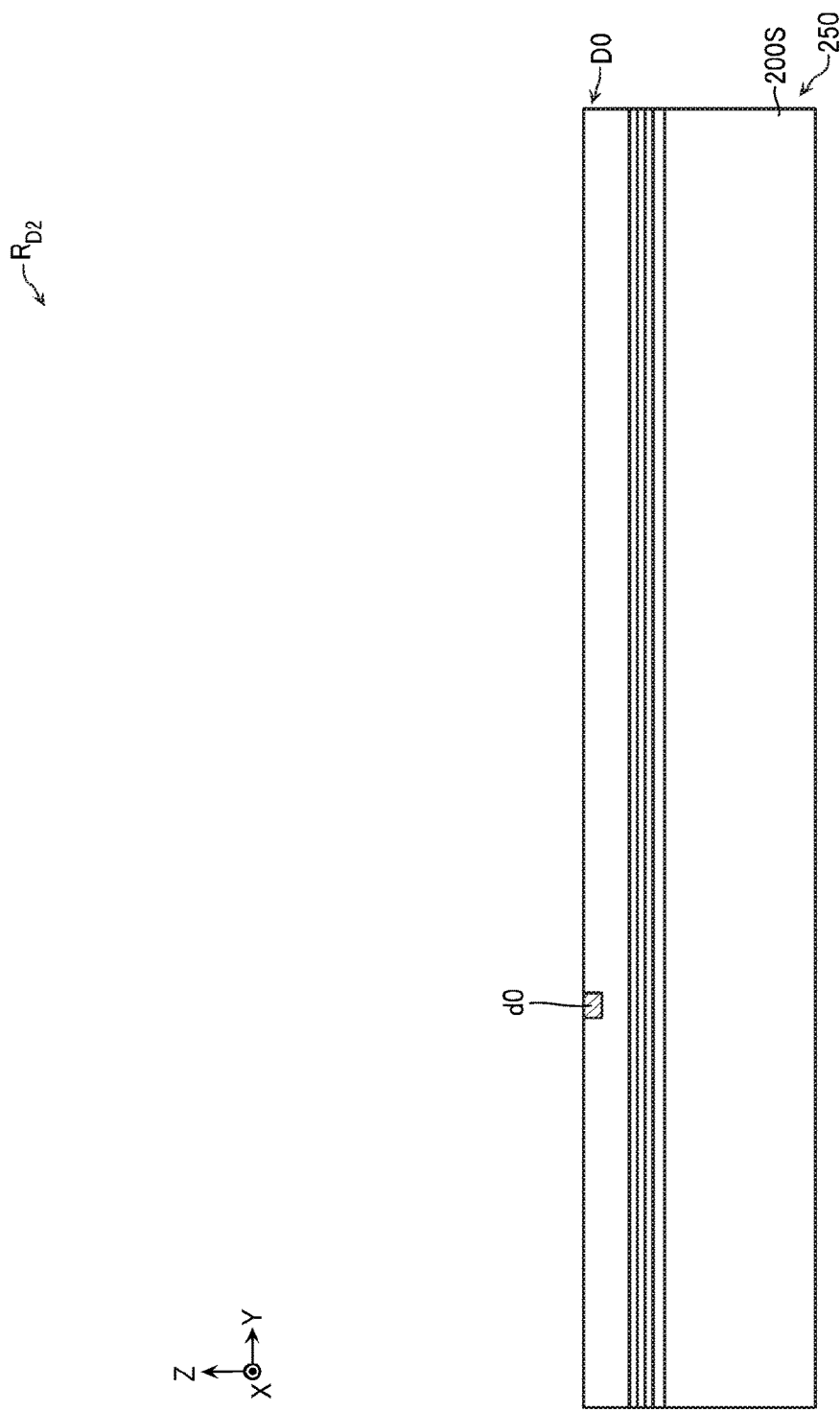
FIG. 58 is a schematic cross-sectional view for describing the same manufacturing method.

Note that, as illustrated in FIG. 58, in this process, simultaneously with patterning and forming the wiring layer D0, the wiring d0 (conductive member) is patterned and formed also in the wiring marked region $R_{D2}$.

Figure 59:
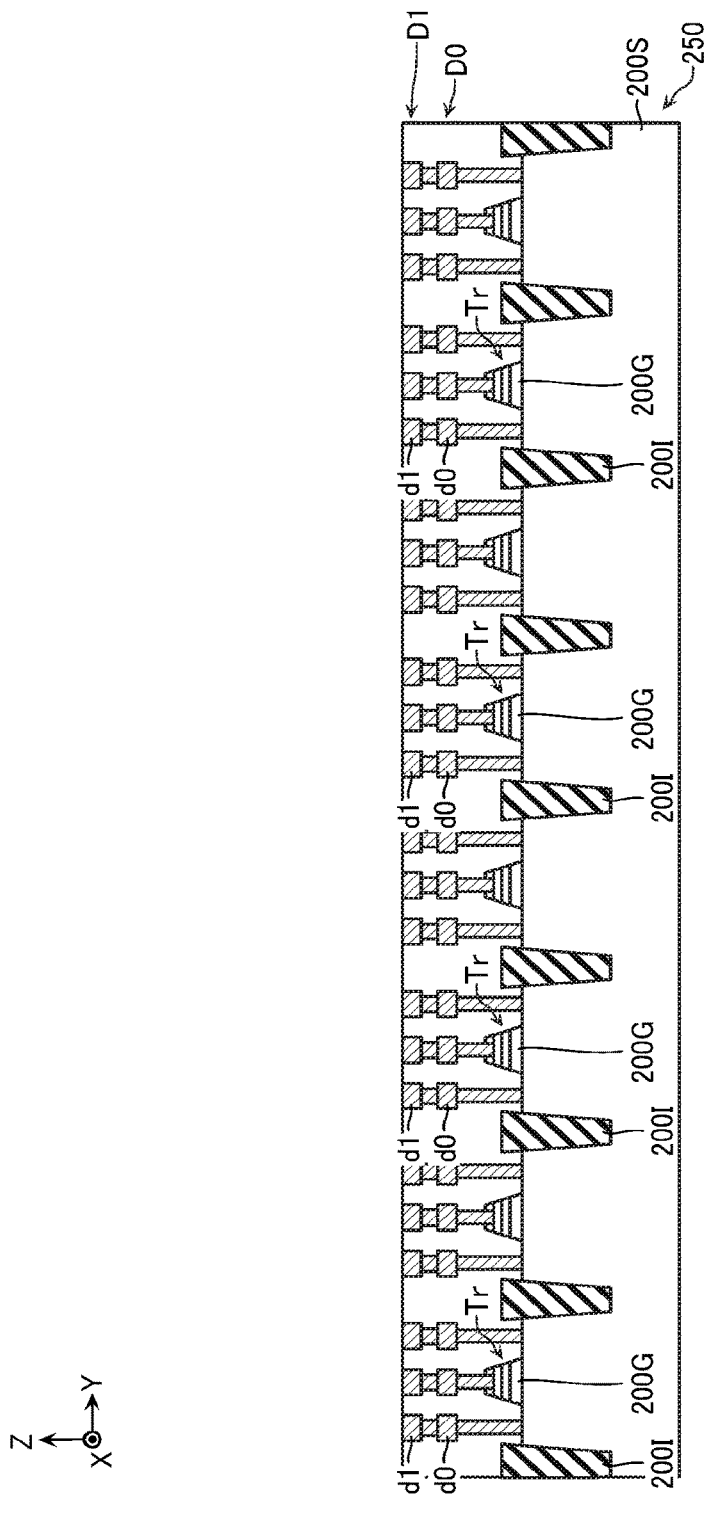
FIG. 59 is a schematic cross-sectional view for describing the same manufacturing method.

Next, for example, as illustrated in FIG. 59, by damascene process, the wiring layer D1 is formed.

Note that, in forming the wiring layer D1, positioning is performed with the wiring d0 (conductive member) in the wiring marked region $R_{D2}$ described with reference to FIG. 58 as a reference.

Figure 60:
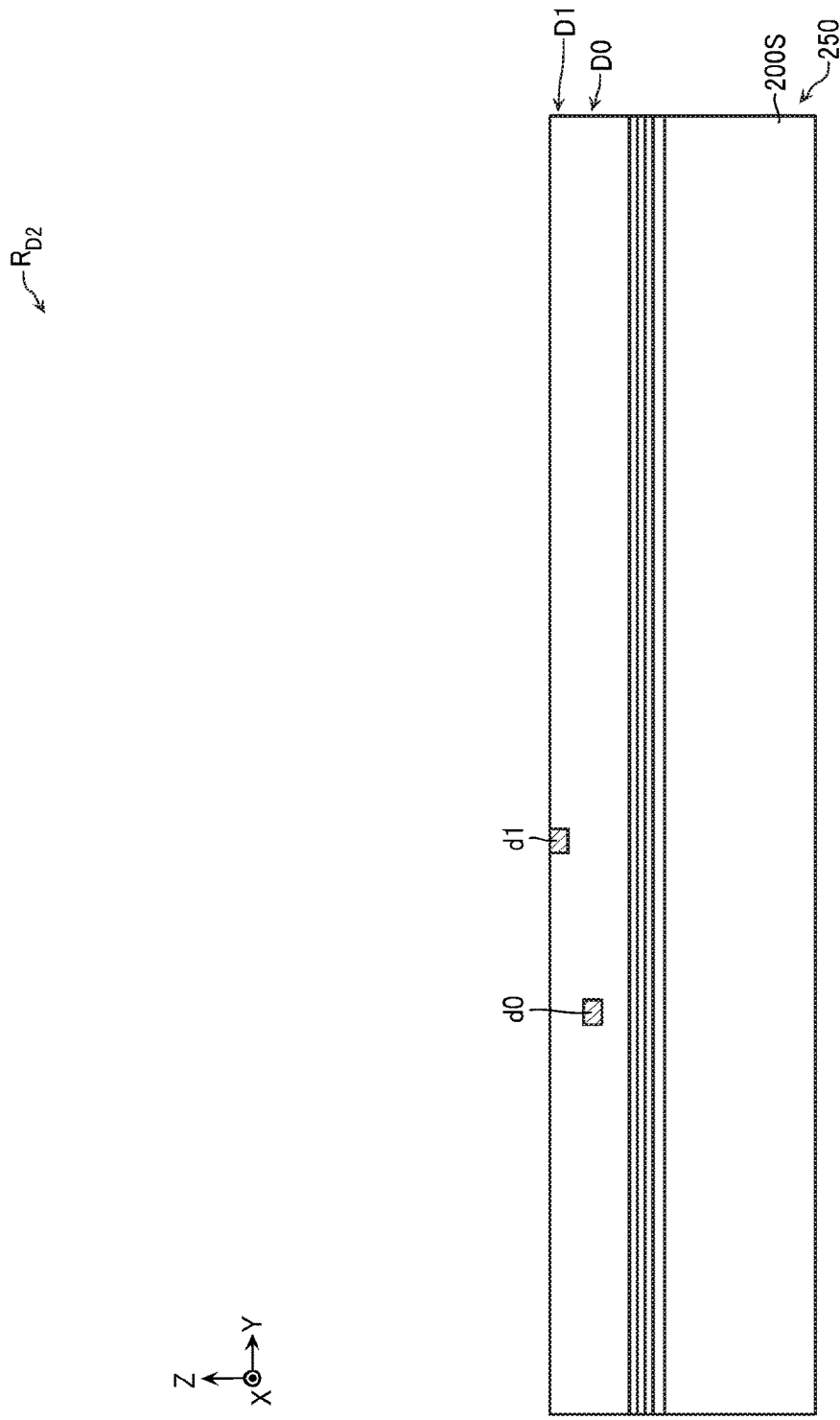
FIG. 60 is a schematic cross-sectional view for describing the same manufacturing method.

As illustrated in FIG. 60, in this process, simultaneously with patterning and forming the wiring layer D1, the wiring d1 (conductive member) is patterned and formed also in the wiring marked region $R_{D2}$.

Figure 61:
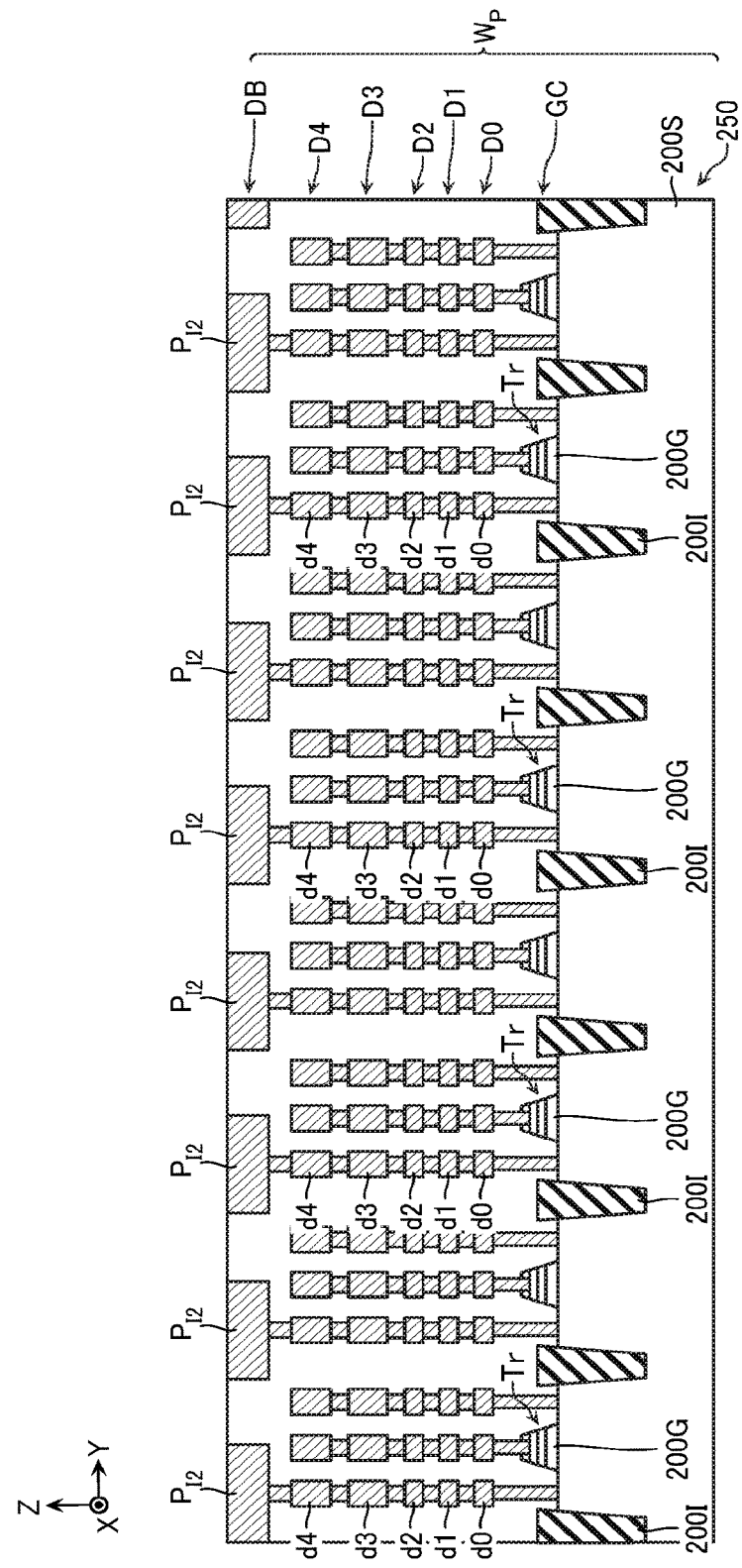
FIG. 61 is a schematic cross-sectional view for describing the same manufacturing method.

The same applies to the following, and for example, as illustrated in FIG. 61, by damascene process, the wiring layers D2, D3, D4, DB are formed.

[Process after Bonding Wafers $W_M$, $W_P$]

After manufacturing the wafers $W_M$, $W_P$, for example, as illustrated in FIG. 62, the front surface of the wafer $W_M$ is opposed to the front surface of the wafer $W_P$. For example, as illustrated in FIG. 63, the wafers $W_M$, $W_P$ are bonded together. Next, after the semiconductor substrate 150 of the wafer $W_M$ is removed, the back side wiring layer MA and the like are formed to obtain the substrate body structure $L_{SB}$ described with reference to FIG. 7.

Next, as illustrated in FIG. 64 and FIG. 65, along dicing lines DL disposed in the kerf regions $R_K$, the wafers $W_M$, $W_P$ bonded together are cut off to form the plurality of memory dies MD. Note that, in some cases, a part of the kerf region $R_K$ becomes a part of the memory die MD as the edge region $R_{ED}$ described with reference to FIG. 4 and FIG. 6.

[Recessed Portion and Projecting Portion on Surfaces of Wafers $W_M$, $W_P$]

In some cases, the surfaces of the wafers $W_M$, $W_P$ are recessed in parts of the kerf regions $R_K$ compared with those in the memory regions $R_{MD}$. Hereinafter, such portions may be referred to as a recessed portion. In some cases, the surfaces of the wafers $W_M$, $W_P$ project in parts of the kerf regions $R_K$ compared with those in the memory regions $R_{MD}$. Hereinafter, such portions may be referred to as a projecting portion.

Here, if the recessed portion of the surface of the wafer $W_M$ overlaps with the recessed portion of the surface of the wafer $W_P$, a void may be generated between the wafers $W_M$ and $W_P$ in the process described with reference to FIG. 63. Similarly, if the projecting portion of the surface of the wafer $W_M$ overlaps with the projecting portion of the surface of the wafer $W_P$, a void may be generated between the wafers $W_M$ and $W_P$ in the process described with reference to FIG. 63.

Therefore, in the embodiment, layouts on the wafers $W_M$, $W_P$ are adjusted such that the recessed portion of the wafer $W_M$ does not overlap with the recessed portion of the wafer $W_P$. Similarly, the layouts on the wafers $W_M$, $W_P$ are adjusted such that the projecting portion of the wafer $W_M$ does not overlap with the projecting portion of the wafer $W_P$. With such a method, it is possible to reduce the generation of a void by keeping sizes of the unevenness between the wafers $W_M$ and $W_P$ within a range of permissible amount.

Next, a description will be given of the recessed portions and the projecting portions formed on the wafers $W_M$, $W_P$.

[Recessed Portion of Wafer $W_M$]

Figure 66:
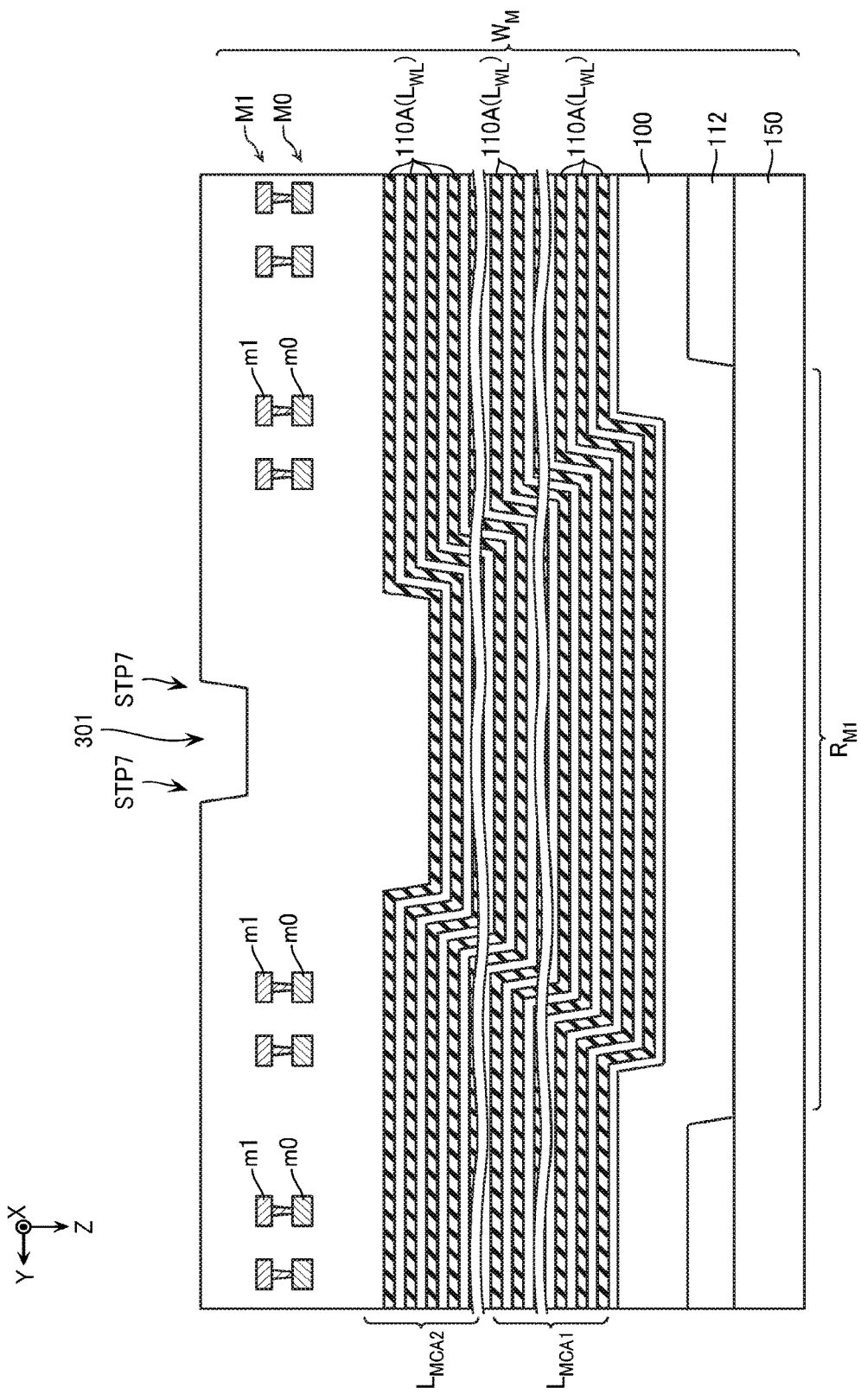
FIG. 66 is a schematic cross-sectional view illustrating a structure in a part of a marked region $R_{M1}$ of a wafer $W_M$.

FIG. 66 is a schematic cross-sectional view illustrating a structure in a part of the marked region $R_{M1}$ of the wafer $W_M$. The marked region $R_{M1}$ is, as described above, used as a reference mark during the manufacturing process of the semiconductor memory device, and is, for example, usable for positioning the memory holes LMH. In the marked region $R_{M1}$ exemplary illustrated in FIG. 66, a part of the insulating layer 112 is removed. This forms the step STP1 described with reference to FIG. 12 in the marked region $R_{M1}$ exemplary illustrated in FIG. 66. In the marked region $R_{M1}$ exemplary illustrated in FIG. 66, the plurality of word line layers $L_{WL}$ and the like arranged in the Z-direction are formed along this step STP1. This forms a step STP7 on the surface of the wafer $W_M$. The region surrounded by this step STP7 is a recessed portion 301. Note that, in the marked region $R_{M1}$ exemplary illustrated in FIG. 66, the plurality of word line layers $L_{WL}$ arranged in the Z-direction each include the sacrifice layer 110A, not the conductive layer 110.

Figure 67:
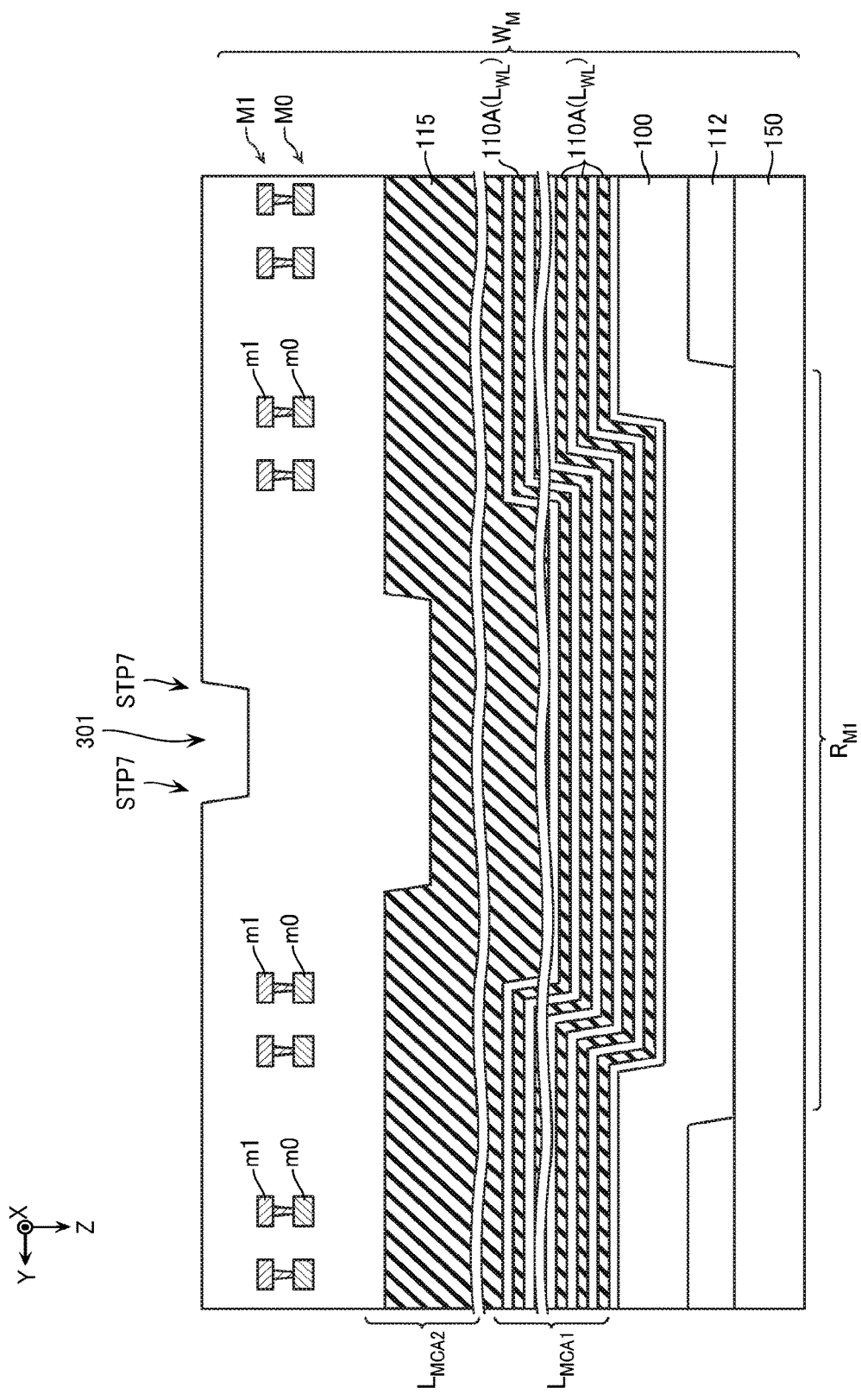
FIG. 67 is a schematic cross-sectional view illustrating a structure in another marked region $R_{M1}$ of the wafer $W_M$.

FIG. 67 is a schematic cross-sectional view illustrating a structure in another marked region $R_{M1}$ of the wafer $W_M$. The structure illustrated in FIG. 67 is approximately the same as the structure illustrated in FIG. 66. However, in the example in FIG. 67, the word line layers $L_{WL}$ corresponding to the memory cell array layer $L_{MCA2}$ are not disposed in the marked region $R_{M1}$, instead, the insulating layer 115 of, for example, silicon oxide (SiO$_2$) is formed. Note that, in the example in FIG. 66 or FIG. 67, it is also possible to omit the word line layers $L_{WL}$ corresponding to the memory cell array layer $L_{MCA1}$ in the marked region $R_{M1}$ and form an insulating layer of, for example, silicon oxide (SiO$_2$).

Figure 68:
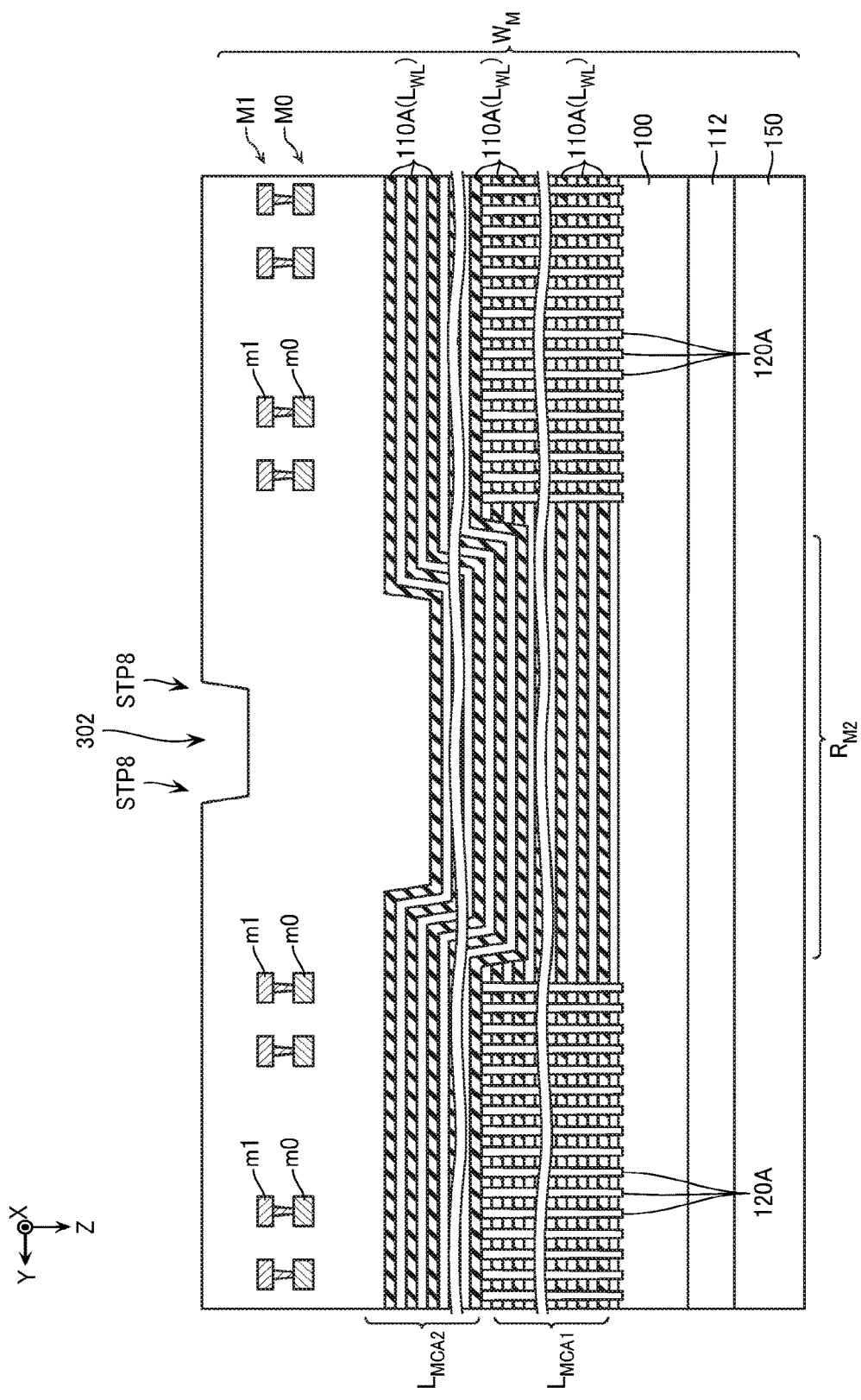
FIG. 68 is a schematic cross-sectional view illustrating a structure in a marked region $R_{M2}$ of the wafer $W_M$.

FIG. 68 is a schematic cross-sectional view illustrating a structure in the marked region $R_{M2}$ of the wafer $W_M$. The marked region $R_{M2}$ is, as described above, usable for positioning the memory holes UMH and the trench STA during the manufacturing process of the semiconductor memory device. In the example in FIG. 68, the amorphous silicon films 120A (columnar structure) are disposed at the proximity of the marked region $R_{M2}$ and the amorphous silicon films 120A are not disposed in the marked region $R_{M2}$. In the marked region $R_{M2}$, parts of word line layers $L_{WL}$ corresponding to the memory cell array layer $L_{MCA1}$ are removed. This forms the step STP3 described with reference to FIG. 17 in the marked region $R_{M2}$ exemplary illustrated in FIG. 68. In the marked region $R_{M2}$ exemplary illustrated in FIG. 68, along this step STP3, the word line layers $L_{WL}$ and the like corresponding to the memory cell array layer $L_{MCA2}$ are disposed. This forms a step STP8 on the surface of the wafer $W_M$. The region surrounded by this step STP8 is a recessed portion 302. Note that, in the marked region $R_{M2}$ exemplary illustrated in FIG. 68, the plurality of word line layers $L_{WL}$ arranged in the Z-direction each include the sacrifice layer 110A, not the conductive layer 110. In the example in FIG. 68, it is also possible to omit the word line layers $L_{WL}$ corresponding to the memory cell array layers $L_{MCA1}$ and/or the memory cell array layers $L_{MCA2}$ of the marked region $R_{M2}$ and form an insulating layer of, for example, silicon oxide (SiO$_2$).

[Projecting Portion of Wafer $W_M$]

Figure 69:
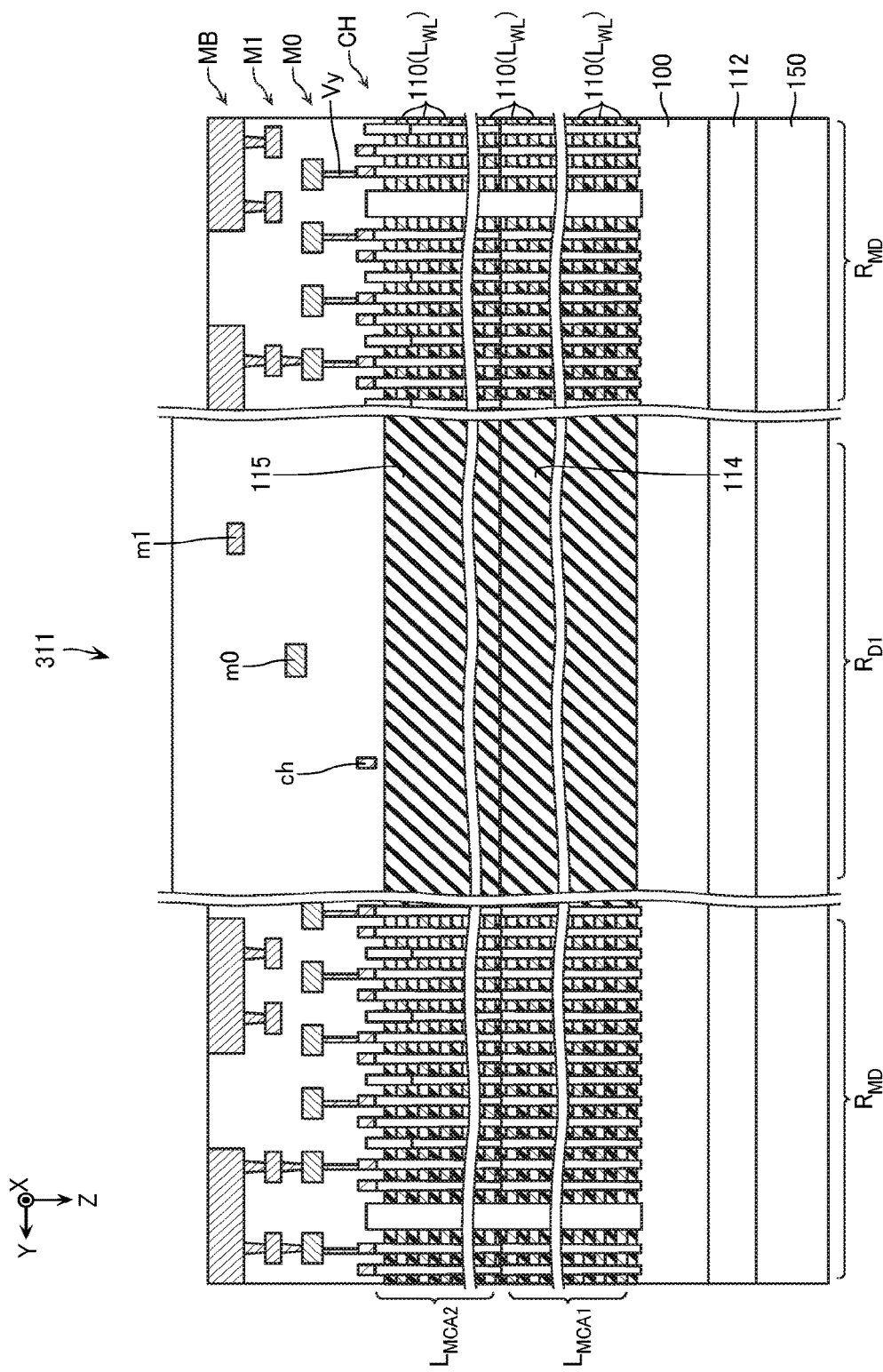
FIG. 69 is a schematic cross-sectional view illustrating a structure in a wiring marked region $R_{D1}$ of the wafer $W_M$.

FIG. 69 is a schematic cross-sectional view illustrating a structure in the wiring marked region $R_{D1}$. As illustrated, the via-contact electrode ch (conductive member) and the wirings m0, m1 (conductive members) disposed in the wiring marked region $R_{D1}$ are disposed at positions where they do not overlap with one another viewing from the Z-direction. The via-contact electrode ch (conductive member) and the wirings m0, m1 (conductive members) disposed in the wiring marked region $R_{D1}$ are disposed at positions where they do not overlap with any of wirings in the wiring layers CH, M0, M1, MB viewing from the Z-direction.

As described with reference to FIG. 34 to FIG. 42, the configuration in the wiring marked region $R_{D1}$ (conductive member) is usable for positioning the wiring layers M0, M1, MB.

Here, as described above, the configuration in the wiring layers CH, M0, M1 can be formed by damascene process. In such a case, in order to reduce the generation of unevenness in the kerf region $R_K$, for example, it is conceivable to dispose the dummy pattern $p_{M2}$ as described with reference to FIG. 4 at the proximity of the via-contact electrode ch and the wirings m0, m1 in the wiring marked region $R_{D1}$.

However, disposing such a dummy pattern $p_{M2}$ in the wiring marked region $R_{D1}$ may cause the dummy pattern $p_{M2}$ to be falsely detected in positioning the wiring layers M0, M1, MB, and thus, plane positions of the wiring layers M0, M1, MB may be displaced in some cases. Therefore, the dummy wiring and the like cannot be disposed in the wiring marked region $R_{D1}$. Here, for example, the configurations in the wiring layers CH, M1 contain tungsten (W). When the dummy wiring and the like are not disposed in such wiring layers CH, M1, in the process as described with reference to FIG. 36 and the like, the surface of such a region, in some cases, projects compared with the surfaces of the memory region $R_{MD}$ and other regions in the kerf region $R_K$ in which the dummy wiring and the like are disposed, and thus, the projecting portion 311 is formed in the wiring marked region $R_{D1}$.

Note that, in the wiring marked region $R_{D1}$, in the process described with reference to FIG. 12, the insulating layer 112 is not removed. Therefore, the step STP1 as described with reference to FIG. 12 is not formed in the wiring marked region $R_{D1}$. In the insulating layer 114 in the wiring marked region $R_{D1}$, the opening LMHA is not formed in the process described with reference to FIG. 17. Therefore, the step STP3 as described with reference to FIG. 17 is also not formed in the wiring marked region $R_{D1}$.

Figure 70:
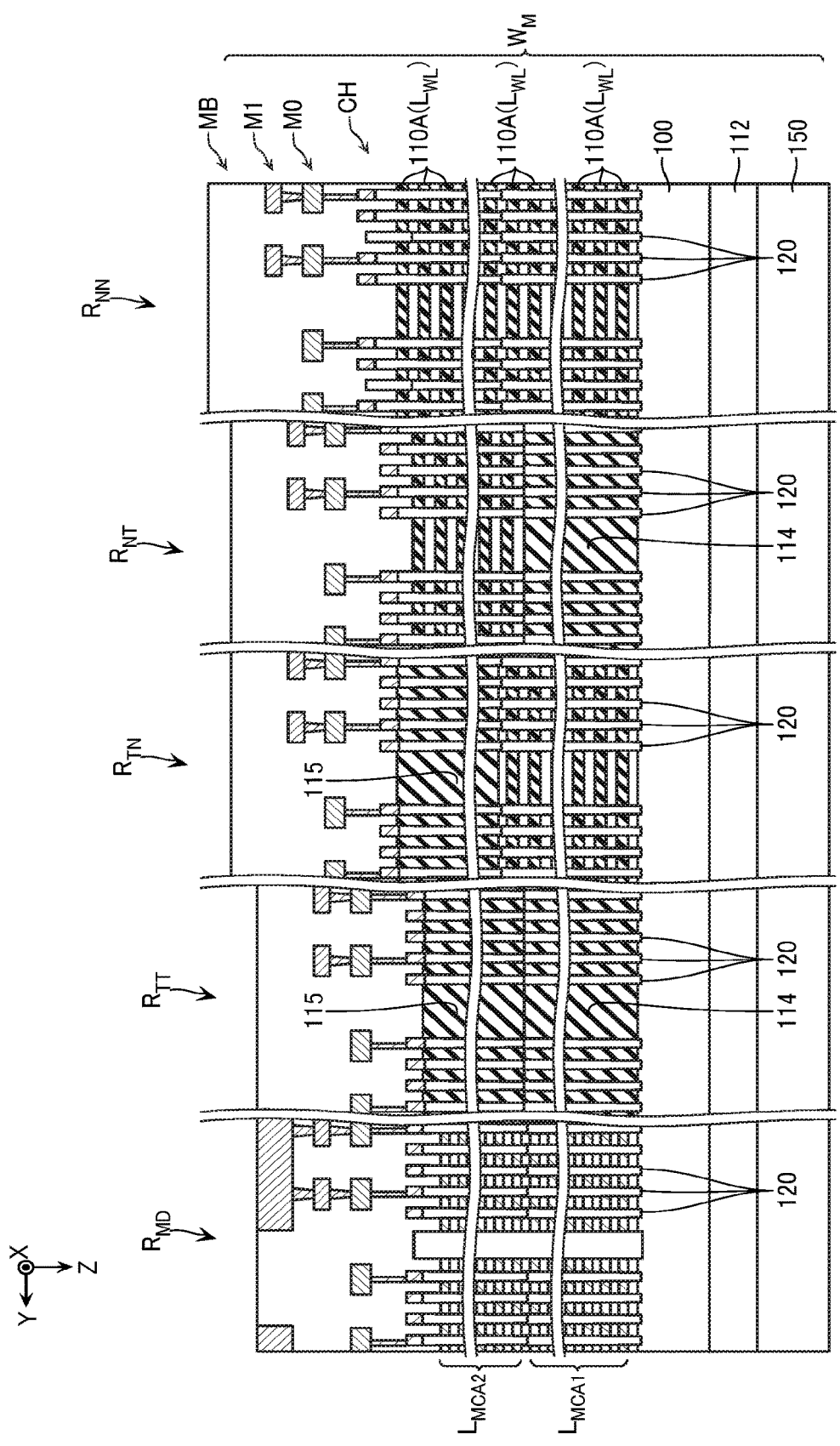
FIG. 70 is a schematic cross-sectional view illustrating a structure in a part of a region in a kerf region $R_K$ of the wafer $W_M$.

FIG. 70 is a schematic cross-sectional view illustrating a structure in parts of the regions $R_{NN}$, $R_{NT}$, $R_{TN}$, $R_{TT}$ in the kerf region $R_K$ exemplary illustrated in FIG. 11. Note that FIG. 70 illustrates the configuration in the memory region $R_{MD}$ for comparison.

In the region $R_{NN}$, the plurality of word line layers $L_{WL}$ arranged in the Z-direction are disposed. In the region $R_{NN}$, the plurality of word line layers $L_{WL}$ arranged in the Z-direction each include the sacrifice layer 110A, not the conductive layer 110. This sacrifice layer 110A is disposed in an isolated pattern shape in the region $R_{NN}$.

The configuration in the region $R_{NT}$ is basically similar to the configuration in the region $R_{NN}$. However, in the region $R_{NT}$, the word line layers $L_{WL}$ are not disposed at the height position corresponding to the memory cell array layer $L_{MCA1}$. At the height position corresponding to the memory cell array layer $L_{MCA1}$ in the region $R_{NT}$, the insulating layer 114 of, for example, silicon oxide (SiO$_2$) is disposed.

The configuration in the region $R_{TN}$ is basically similar to the configuration in the region $R_{NN}$. However, in the region $R_{TN}$, the word line layers $L_{WL}$ are not disposed at the height position corresponding to the memory cell array layer $L_{MCA2}$. At the height position corresponding to the memory cell array layer $L_{MCA2}$ in the region $R_{TN}$, the insulating layer 115 of, for example, silicon oxide (SiO$_2$) is disposed.

In the region $R_{TT}$, the plurality of word line layers $L_{WL}$ arranged in the Z-direction are not disposed. At the height position corresponding to the memory cell array layers $L_{MCA1}$, $L_{MCA2}$ in the region $R_{TT}$, the insulating layers 114, 115 of, for example, silicon oxide (SiO$_2$) are disposed.

Note that, in the regions $R_{NN}$, $R_{NT}$, $R_{TN}$, $R_{TT}$, the semiconductor layer 120 and the gate insulating film 130 may be disposed or they are not necessarily disposed.

Here, while the illustration is omitted, after performing the process described with reference to FIG. 13, and before performing the process described with reference to FIG. 15, the plurality of inter-layer insulating layers 111 and sacrifice layers 110A are removed in the regions $R_{NT}$, $R_{TT}$, and thus, the insulating layer 114 of, for example, silicon oxide (SiO$_2$) is formed. The insulating layer 114 formed in this process, in some cases, shrinks in the subsequent process. This, in some cases, recesses the surfaces of the structures formed in the regions $R_{NT}$, $R_{TT}$.

While the illustration is omitted, in the process described with reference to FIG. 20, after forming the plurality of inter-layer insulating layers 111 and sacrifice layers 110A, and before forming the insulating layer 113, the plurality of inter-layer insulating layers 111 and sacrifice layers 110A are removed in the region $R_{TN}$, $R_{TT}$, and thus, the insulating layer 115 of, for example, silicon oxide (SiO$_2$) is formed. The insulating layer 115 formed in this process, in some cases, shrinks in the subsequent process. This, in some cases, recesses the surfaces of the structures formed in the regions $R_{TN}$, $R_{TT}$.

In the memory region $R_{MD}$, in the process described with reference to FIG. 26, the trench STA is formed. In the process described with reference to FIG. 31, the sacrifice layers 110A are removed via the trench STA. In the process described with reference to FIG. 32, the conductive layers 110 are formed. After forming the conductive layers 110, the conductive layers 110, in some cases, thermally shrink. This, in some cases, recesses the surface of the structure formed in the memory region $R_{MD}$.

As the result, as illustrated in FIG. 70, the surfaces of the regions $R_{NN}$, $R_{NT}$, $R_{TN}$ where the plurality of inter-layer insulating layers 111 and sacrifice layers 110A remain project with respect to the surface of the memory region $R_{MD}$. As the result, the surfaces of the regions $R_{NN}$, $R_{NT}$, $R_{TN}$ provide projecting portions in some cases.

Note that, in the regions $R_{NN}$, $R_{NT}$, $R_{TN}$, $R_{TT}$, in the process described with reference to FIG. 12, the insulating layer 112 is not removed. Therefore, the step STP1 as described with reference to FIG. 12 is not formed in the regions $R_{NN}$, $R_{NT}$, $R_{TN}$, $R_{TT}$. The opening LMHA is not formed in the regions $R_{NN}$, $R_{NT}$, $R_{TN}$, $R_{TT}$ in the process described with reference to FIG. 17. Therefore, the step STP3 as described with reference to FIG. 17 is also not formed in the regions $R_{NN}$, $R_{NT}$, $R_{TN}$, $R_{TT}$.

[Recessed Portion of Wafer $W_P$]

Figure 71:
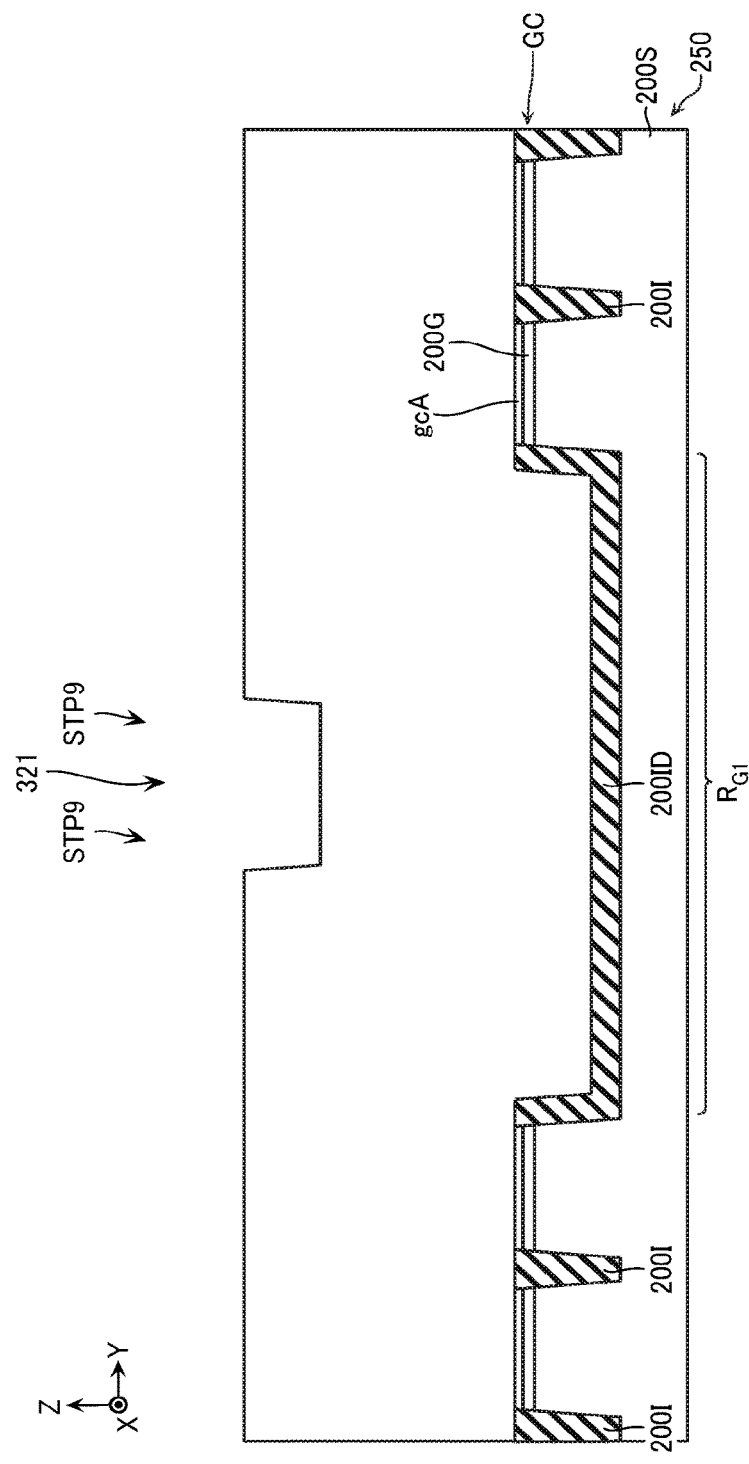
FIG. 71 is a schematic cross-sectional view illustrating a structure in a film thickness measurement region $R_{G1}$ of a wafer $W_P$.
Figure 72:
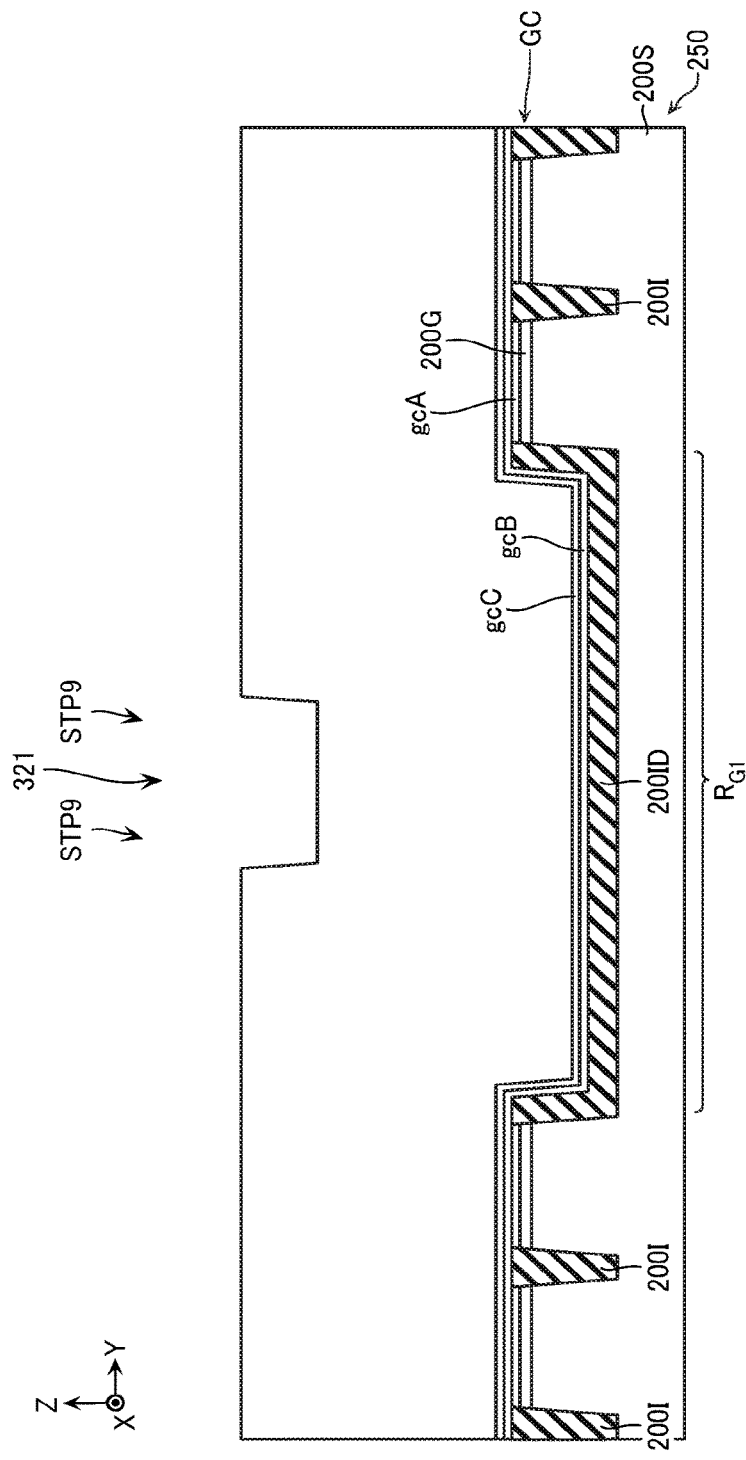
FIG. 72 is a schematic cross-sectional view illustrating the structure in the film thickness measurement region $R_{G1}$ of the wafer $W_P$.

FIG. 71 and FIG. 72 are schematic cross-sectional views illustrating a structure in the film thickness measurement region $R_{G1}$. The film thickness measurement region $R_{G1}$ is, as described with reference to FIG. 49, usable for measuring the film thickness of the insulating layer 2001C during the manufacturing process of the semiconductor memory device. As illustrated in FIG. 71 and FIG. 72, in the film thickness measurement region $R_{G1}$, the height position of the surface of the semiconductor substrate 250 is lower than the height position in other regions. In the film thickness measurement region $R_{G1}$, on the surface of the semiconductor substrate 250, the insulating layer 200ID is disposed. The insulating layer 200ID is a portion disposed in the opening 200IB of the insulating layer 2001C described with reference to FIG. 49. On the surface of the wafer $W_P$, a step STP9 is formed, and the region surrounded by this step STP9 is a recessed portion 321. Note that, in the film thickness measurement region $R_{G1}$, as illustrated in FIG. 71, the conductive layer gcB or the insulating layer gcC is not necessarily disposed, or, as illustrated in FIG. 72, the conductive layer gcB and the insulating layer gcC may be disposed. The film thickness measurement region $R_{G1}$ may include at least one of the wirings d0, d1, d2 or does not necessarily include at least one of the wirings d0, d1, d2.

Figure 73:
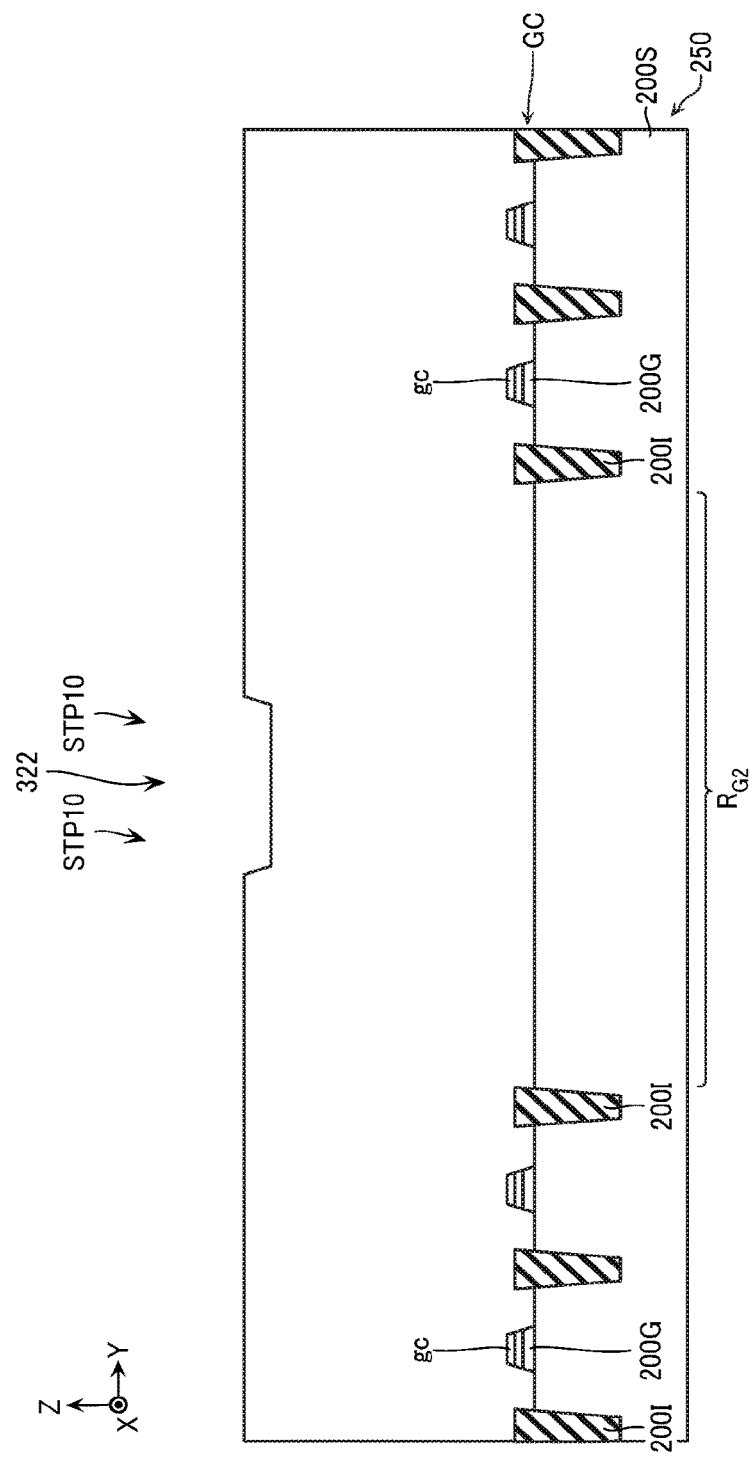
FIG. 73 is a schematic cross-sectional view illustrating a structure in a film thickness measurement region $R_{G2}$ of the wafer $W_P$.

FIG. 73 is a schematic cross-sectional view illustrating a structure in the film thickness measurement region $R_{G2}$ of the wafer $W_P$. The film thickness measurement region $R_{G2}$ is, as described with reference to FIG. 55, usable for measuring the film thickness of the insulating layer 203 during the manufacturing process of the semiconductor memory device. In the film thickness measurement region $R_{G2}$, the height position of the surface of the semiconductor substrate 250 corresponds to the height positions in the other regions. In the film thickness measurement region $R_{G2}$, the electrodes gc are not disposed. On the surface of the wafer $W_P$, a step STP10 is formed, and the region surrounded by this step STP10 is a recessed portion 322. Note that the film thickness measurement region $R_{G2}$ may include at least one of the wirings d0, d1, d2 or does not necessarily include at least one of the wirings d0, d1, d2.

Here, in the process described with reference to FIG. 56, a part of the insulating layer 203 is removed by means, such as CMP, to planarize the surface of the structure illustrated in FIG. 54 and FIG. 55. In such a process, a recessed portion is formed on the surface of the insulating layer 203 by an effect of erosion in some cases. This forms the recessed portion 322 in the film thickness measurement region $R_{G2}$ in some cases.

[Projecting Portion of Wafer $W_P$]

Figure 74:
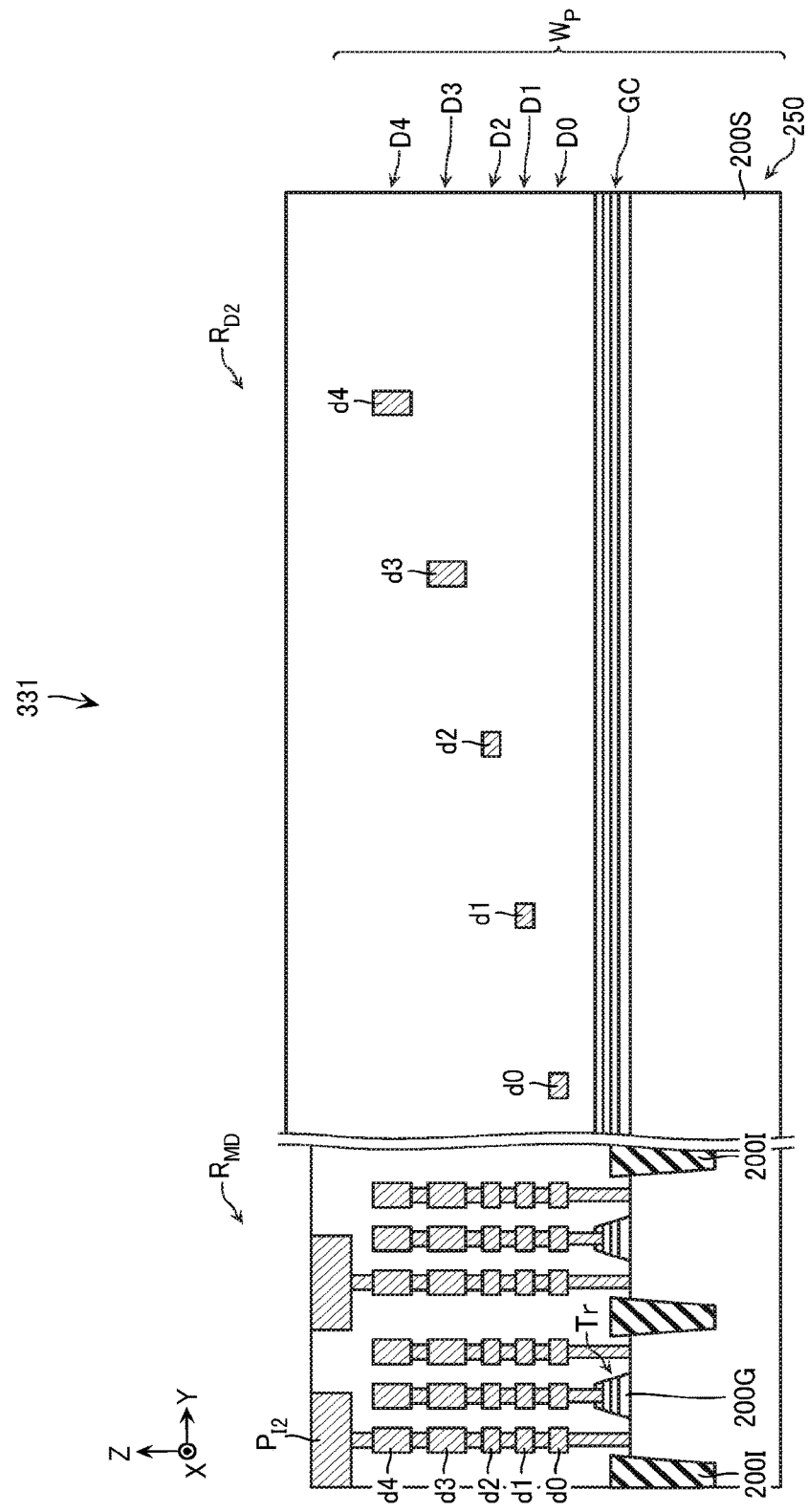
FIG. 74 is a schematic cross-sectional view illustrating a structure in a wiring marked region $R_{D2}$ of the wafer $W_P$.

FIG. 74 is a schematic cross-sectional view illustrating a structure in the wiring marked region $R_{D2}$. As illustrated, the wirings d0, d1, d2, d3, d4 (conductive members) disposed in the wiring marked region $R_{D2}$ are disposed at positions where they do not overlap with one another viewing from the Z-direction. The wirings d0, d1, d2, d3, d4 (conductive members) disposed in the wiring marked region $R_{D2}$ are disposed at positions where they do not overlap with any wirings in the wiring layers D0, D1, D2, D3, D4, DB viewing from the Z-direction.

As described with reference to FIG. 57 to FIG. 61, the configuration (conductive member) in the wiring marked region $R_{D2}$ is usable for positioning the wiring layers D1, D2, D3, D4, DB.

In the wiring marked region $R_{D2}$, a projecting portion 331 is formed in some cases for a reason similar to that of the wiring marked region $R_{D1}$ (FIG. 69).

Note that, in the wiring marked region $R_{D2}$, in the process described with reference to FIG. 47, the opening 2001B is not formed. Therefore, the step STP6 as described with reference to FIG. 47 is not formed in the wiring marked region $R_{D2}$. In the wiring marked region $R_{D2}$, at least parts of the insulating layer gcC, the conductive layers gcB, gcA, and the insulating layer 200G remain in the process described with reference to FIG. 53, and the erosion or the like does not occur in the process described with reference to FIG. 56. In the example in FIG. 74, the insulating layer gcC, the conductive layers gcB, gcA, and the insulating layer 200G are not removed in the wiring marked region $R_{D2}$.

[Configuration of Wafers $W_M$, $W_P$ after Bonding]

Figure 75:
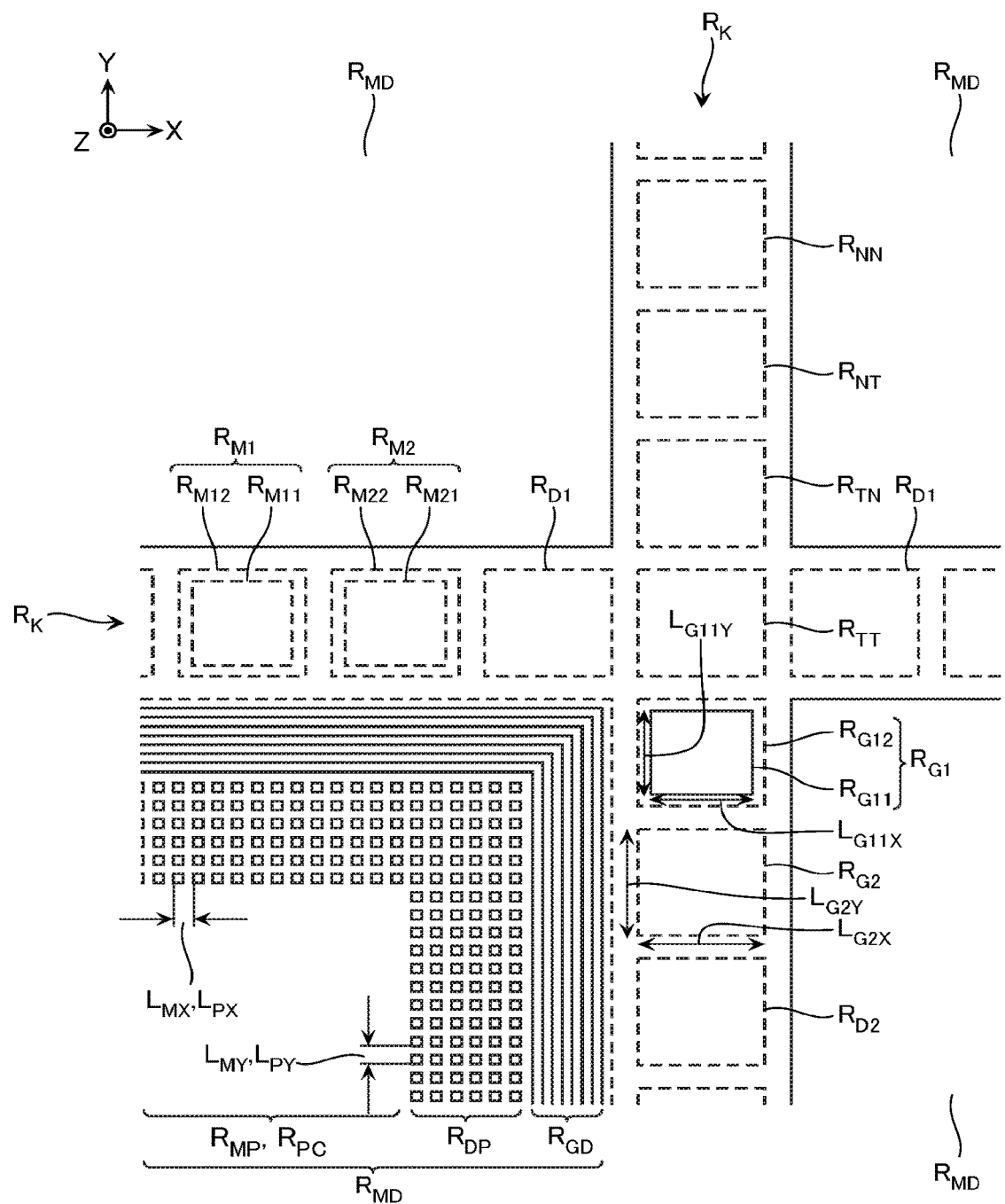
FIG. 75 is a schematic plan view exemplary illustrating configurations of parts of the wafers $W_M$, $W_P$ after bonding.

Next, with reference to FIG. 75 to FIG. 85, configurations in the wafers $W_M$, $W_P$ after bonding are exemplary illustrated. FIG. 75 is a schematic plan view exemplary illustrating the configurations of parts of the wafers $W_M$, $W_P$ after bonding. FIG. 76 to FIG. 85 are schematic cross-sectional views exemplary illustrating the configurations of the parts of the wafers $W_M$, $W_P$ after bonding.

As described above, in the embodiment, the layouts on the wafers $W_M$, $W_P$ are adjusted such that the recessed portion of the wafer $W_M$ does not overlap with the recessed portion of the wafer $W_P$. For example, in the example in FIG. 75, the marked regions $R_{M1}$, $R_{M2}$ corresponding to the recessed portion of the wafer $W_M$ are disposed at positions where they do not overlap with the film thickness measurement regions $R_{G1}$, $R_{G2}$ corresponding to the recessed portion of the wafer $W_P$ viewing from the Z-direction.

As described above, in the embodiment, the layouts on the wafers $W_M$, $W_P$ are adjusted such that the projecting portion of the wafer $W_M$ does not overlap with the projecting portion of the wafer $W_P$. For example, in the example in FIG. 75, the wiring marked region $R_{D1}$ and the regions $R_{NN}$, $R_{NT}$, $R_{TN}$ corresponding to the projecting portion of the wafer $W_M$ are disposed at positions where they do not overlap with the wiring marked region $R_{D2}$ corresponding to the projecting portion of the wafer $W_P$ viewing from the Z-direction.

Figure 76:
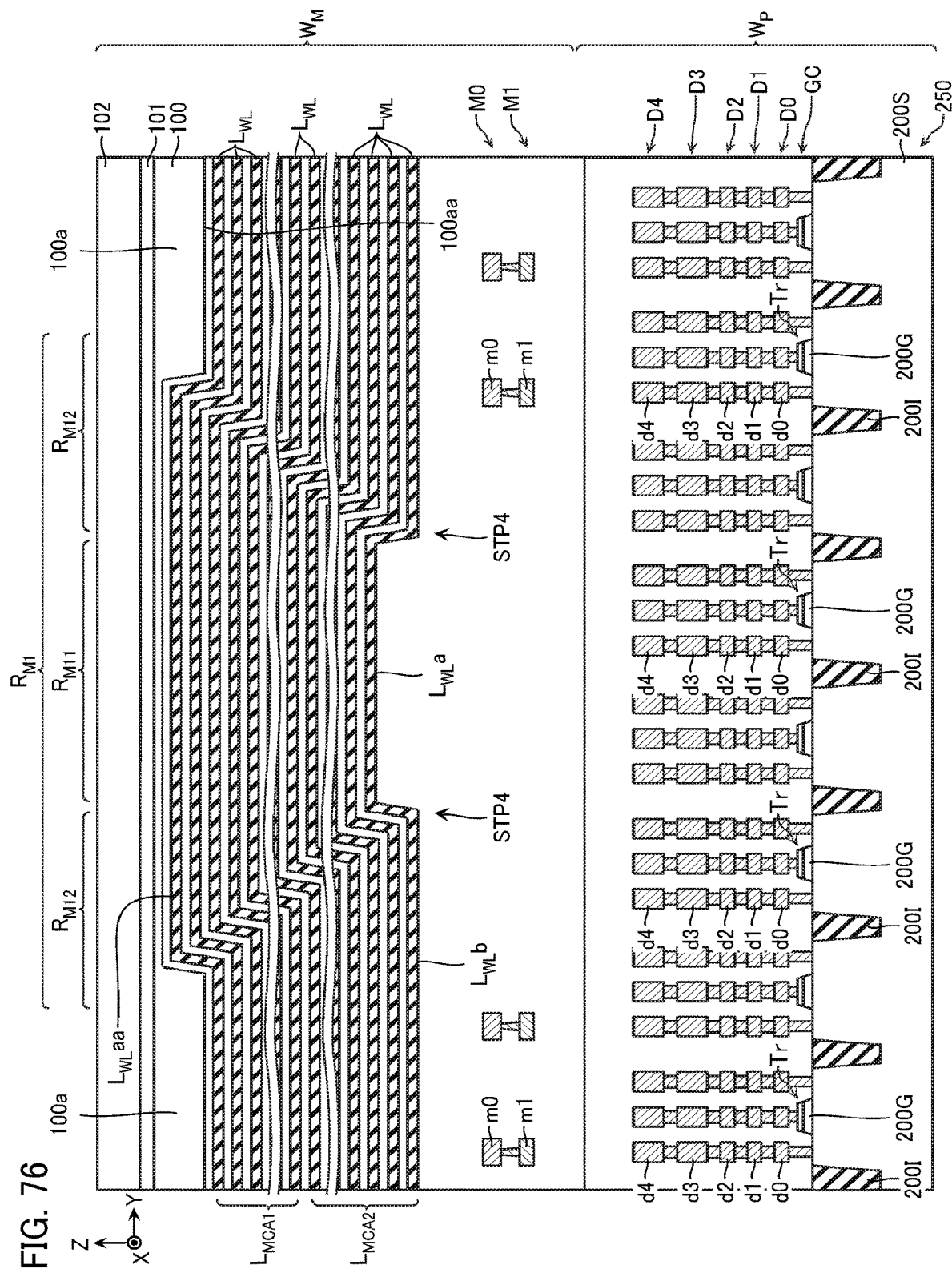
FIG. 76 is a schematic cross-sectional view exemplary illustrating the configurations of parts of the wafers $W_M$, $W_P$ after bonding.

FIG. 76 exemplary illustrates a configuration of a part of the marked region $R_{M1}$ in the wafers $W_M$, $W_P$ after bonding. FIG. 76 illustrates regions $R_{M11}$, $R_{M12}$ in the marked region $R_{M1}$. As illustrated in FIG. 75, the region $R_{M12}$ surrounds the region $R_{M11}$ viewing from the Z-direction.

The region $R_{M11}$ includes, as illustrated in FIG. 76, portions $L_{WL}a$ of the word line layers $L_{WL}$. This portion $L_{WL}a$ is surrounded by a portion $L_{WL}b$ viewing from the Z-direction. The portion $L_{WL}a$ is disposed above the portion $L_{WL}b$ (that is, is farther from the wafer $W_P$ than the portion $L_{WL}b$). The region $R_{M12}$ includes a step disposed between the portion $L_{WL}a$ and the portion $L_{WL}b$. Here, the step disposed on the word line layer $L_{WL}$ as the lowermost layer corresponds to the step STP4 described with reference to FIG. 21.

Note that, as described above, after bonding the wafers $W_M$, $W_P$ in the process described with reference to FIG. 63, the semiconductor substrate 150 of the wafer $W_M$ is removed. In the example in FIG. 76, a part of the conductive layer 100 in the marked region $R_{M1}$ is removed in this process. In this process, the conductive layer 100 may remain in the region $R_{M11}$ or the conductive layer 100 does not necessarily remain in the region $R_{M11}$.

FIG. 76 illustrates a portion 100a surrounding the marked region $R_{M1}$ viewing from the Z-direction, of the conductive layer 100. The portion 100a is included in the same layer (wiring layer) as the conductive layer 100 functioning as the source line of the NAND flash memory and arranged with the portion functioning as the source line of the NAND flash memory in a direction (for example, the Y-direction) along the surface of the semiconductor substrate 250. The portion 100a overlaps with the portion $L_{WL}b$ of the word line layer $L_{WL}$ viewing from the Z-direction. In the example in FIG. 76, an upper surface $L_{WL}aa$ of the portion $L_{WL}a$ included in the word line layer $L_{WL}$ as the uppermost layer is disposed above a lower surface 100aa of the portion 100a of the conductive layer 100 (that is, is farther from the wafer $W_P$ than the lower surface 100aa).

Figure 77:
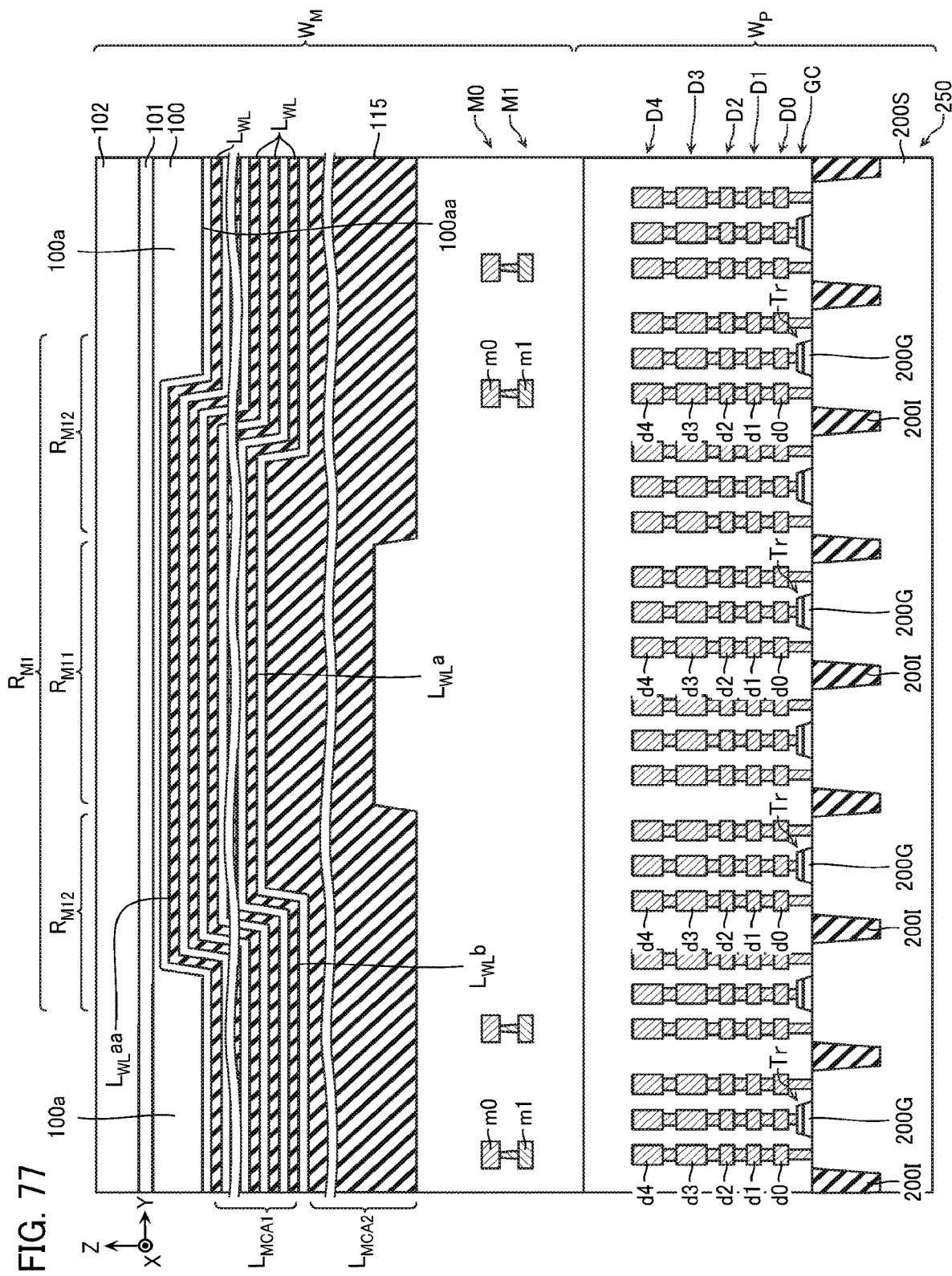
FIG. 77 is a schematic cross-sectional view exemplary illustrating the configurations of the parts of the wafers $W_M$, $W_P$ after bonding.

FIG. 77 exemplary illustrates a configuration of another marked region $R_{M1}$ in the wafers $W_M$, $W_P$ after bonding. The configuration exemplary illustrated in FIG. 77 is basically configured similarly to the configuration described with reference to FIG. 76. However, in the example in FIG. 77, the word line layers $L_{WL}$ corresponding to the memory cell array layer $L_{MCA2}$ are not disposed in the marked region $R_{M1}$, the insulating layer 115 of, for example, silicon oxide (SiO$_2$) is formed.

Figure 78:
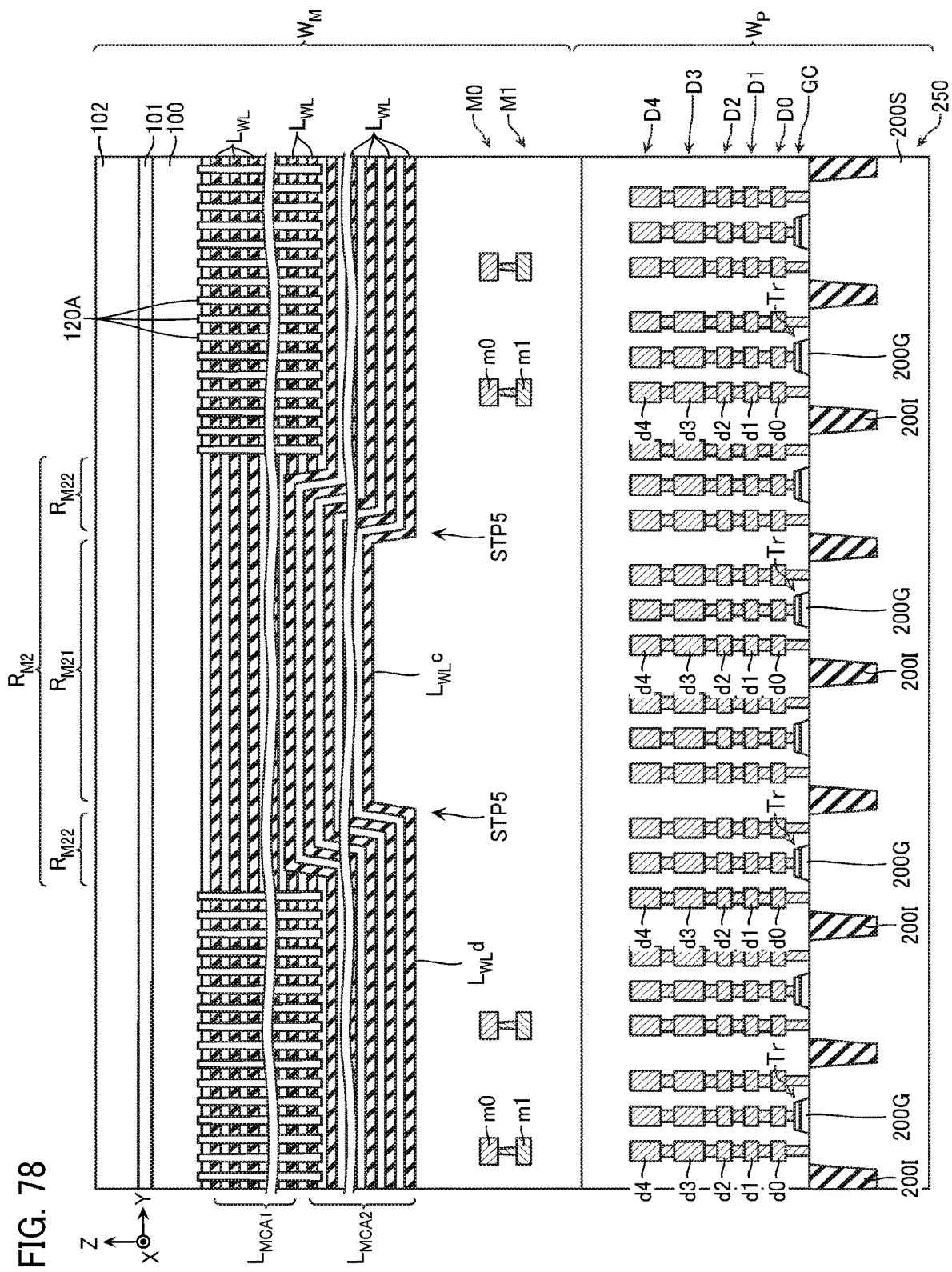
FIG. 78 is a schematic cross-sectional view exemplary illustrating the configurations of the parts of the wafers $W_M$, $W_P$ after bonding.

FIG. 78 exemplary illustrates a configuration of the marked region $R_{M2}$ in the wafers $W_M$, $W_P$ after bonding. FIG. 78 illustrates regions $R_{M21}$, $R_{M22}$ in the marked region $R_{M2}$. As illustrated in FIG. 75, the region $R_{M22}$ surrounds the region $R_{M21}$ viewing from the Z-direction.

In the marked region $R_{M2}$, a step is not disposed on the word line layers $L_{WL}$ themselves in the memory cell array layer $L_{MCA1}$. However, in the process described with reference to FIG. 17, parts of the word line layers $L_{WL}$ are removed in the region $R_{M21}$, which forms the step STP3 on the surface of the structure illustrated in FIG. 17. As described with reference to FIG. 22, the word line layers $L_{WL}$ in the memory cell array layer $L_{MCA2}$ are formed along this step STP3.

As illustrated in FIG. 78, a step is disposed on the word line layers $L_{WL}$ in the memory cell array layer $L_{MCA2}$ in the marked region $R_{M2}$. That is, the region $R_{M21}$ includes portions $L_{WL}c$ of the word line layers $L_{WL}$ in the memory cell array layer $L_{MCA2}$. This portion $L_{WL}c$ is surrounded by a portion $L_{WL}d$ viewing from the Z-direction. The portion $L_{WL}c$ is disposed above the portion $L_{WL}d$ (that is, is farther from the wafer $W_P$ than the portion $L_{WL}d$). The region $R_{M22}$ includes a step disposed between the portion $L_{WL}c$ and the portion $L_{WL}d$. Note that the step disposed on the word line layer $L_{WL}$ as the lowermost layer corresponds to the step STP5 described with reference to FIG. 22. Upper surfaces and lower surfaces of the portions $L_{WL}c$, $L_{WL}d$ of the respective word line layers $L_{WL}$ are each approximately flat and do not have a step. In each of the word line layers $L_{WL}$, a length (film thickness) in the Z-direction of the portion $L_{WL}c$ is approximately equal to a length (film thickness) in the Z-direction of the portion $L_{WL}d$.

Figure 79:
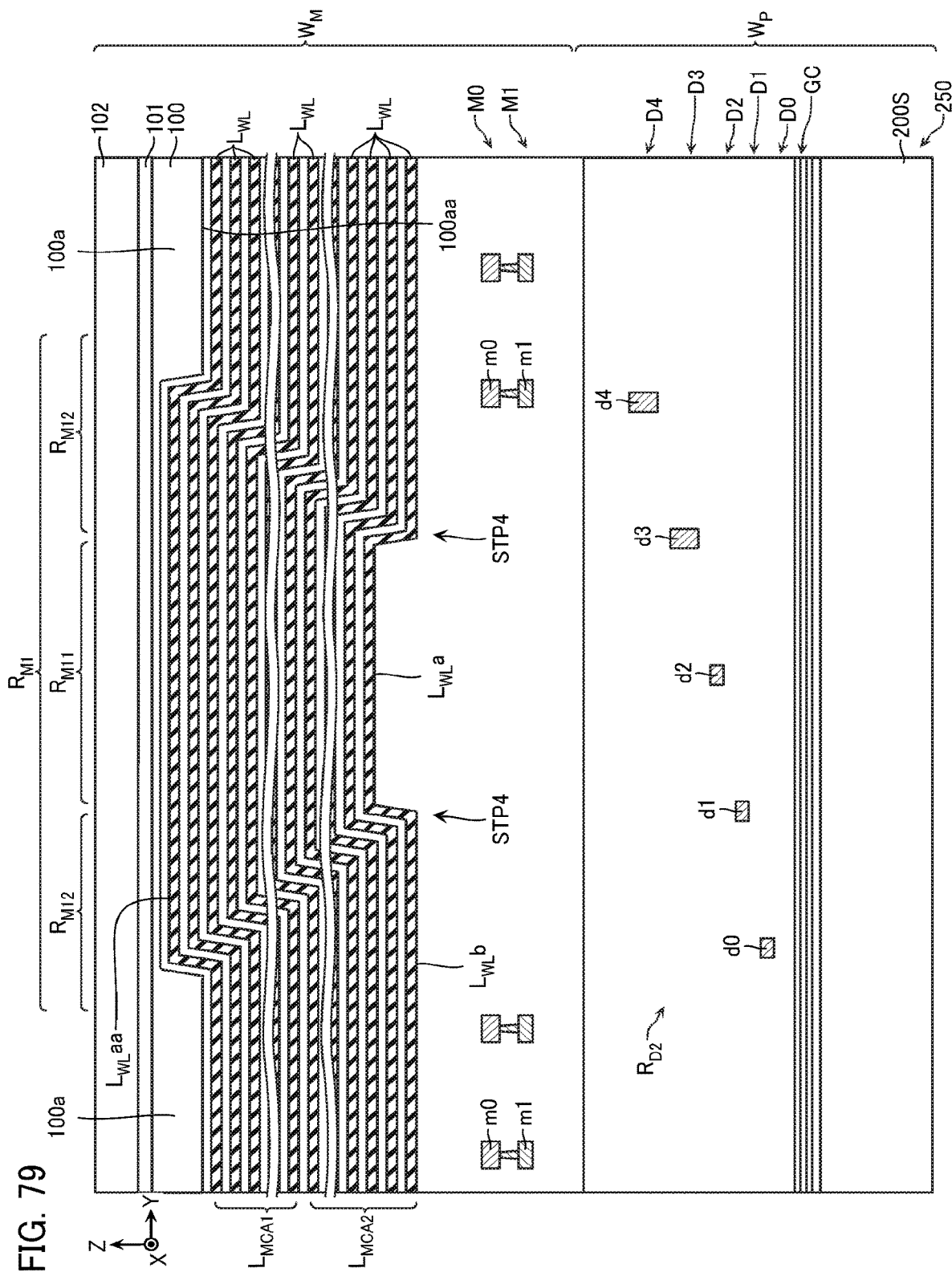
FIG. 79 is a schematic cross-sectional view exemplary illustrating the configurations of the parts of the wafers $W_M$, $W_P$ after bonding.

Note that, in the example in FIG. 76 to FIG. 78, the recessed portion of the wafer $W_M$ is disposed at a position where it overlaps with a portion that is neither the recessed portion nor the projecting portion of the wafer $W_P$ viewing from the Z-direction. However, the recessed portion of the wafer $W_M$ may be disposed at a position where it overlaps with the projecting portion of the wafer $W_P$ viewing from the Z-direction. FIG. 79 exemplary illustrates configurations in such wafers $W_M$, $W_P$ after bonding. In the example in FIG. 79, the marked region $R_{M1}$ corresponding to the recessed portion of the wafer $W_M$ and the wiring marked region $R_{D2}$ corresponding to the projecting portion of the wafer $W_P$ are disposed at positions where they overlap with one another.

While in the example in FIG. 79, the marked region $R_{M1}$ corresponding to FIG. 76 is exemplary illustrated as the recessed portion of the wafer $W_M$, the region overlapping with the projecting portion of the wafer $W_P$ may be the marked region $R_{M1}$ corresponding to FIG. 77 or may be the marked region $R_{M2}$ corresponding to FIG. 78.

Figure 80:
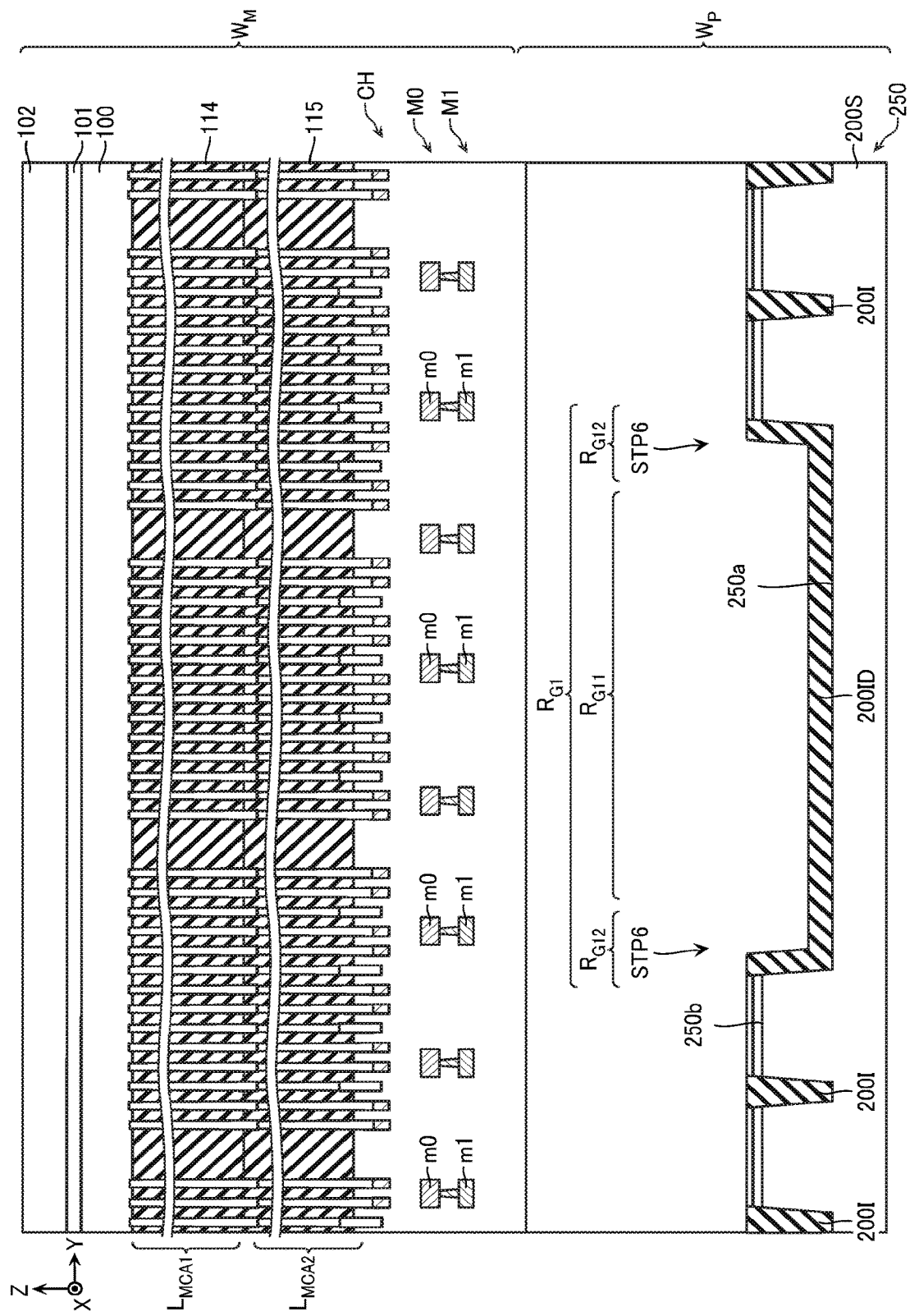
FIG. 80 is a schematic cross-sectional view exemplary illustrating the configurations of the parts of the wafers $W_M$, $W_P$ after bonding.

FIG. 80 exemplary illustrates a configuration of a portion where the region $R_{TT}$ overlaps with the film thickness measurement region $R_{G1}$ in the wafers $W_M$, $W_P$ after bonding. FIG. 80 illustrates the regions $R_{G11}$, $R_{G12}$ in the film thickness measurement region $R_{G1}$. As illustrated in FIG. 75, the region $R_{G12}$ surrounds the region $R_{G11}$ viewing from the Z-direction.

The region $R_{G11}$ includes, as illustrated in FIG. 80, a portion 250*a* on the surface of the semiconductor substrate 250. This portion 250*a* is surrounded by a portion 250*b* viewing from the Z-direction. The portion 250*a* is disposed below the portion 250*b* (that is, is farther from the wafer $W_M$ than the portion 250*b*). The region $R_{G12}$ includes a step disposed between the portion 250*a* and the portion 250*b*. Note that this step corresponds to the step STP6 described with reference to FIG. 47.

Figure 81:
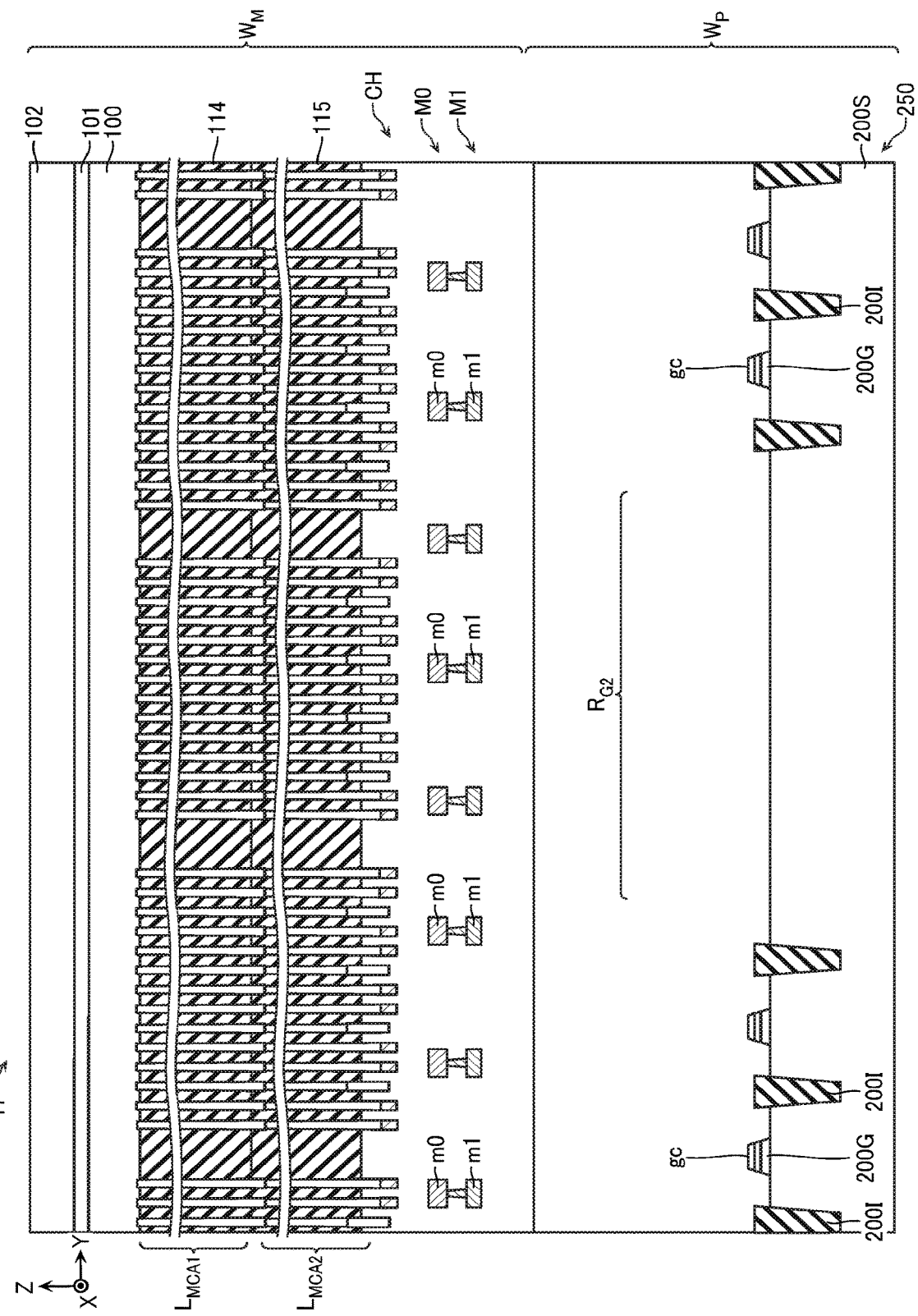
FIG. 81 is a schematic cross-sectional view exemplary illustrating the configurations of the parts of the wafers $W_M$, $W_P$ after bonding.
Figure 82:
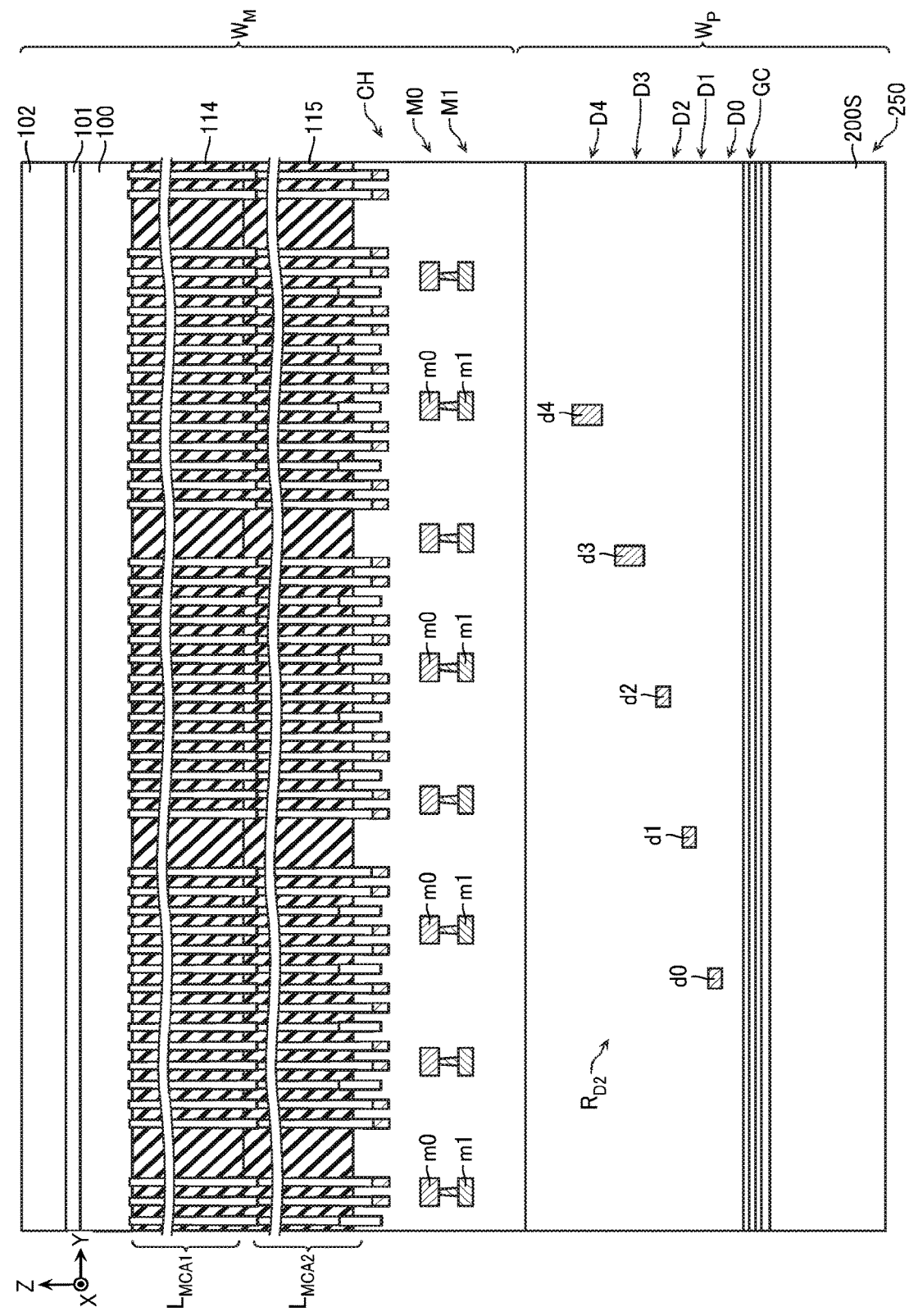
FIG. 82 is a schematic cross-sectional view exemplary illustrating the configurations of the parts of the wafers $W_M$, $W_P$ after bonding.

FIG. 81 exemplary illustrates a configuration of a portion where the region $R_{TT}$ overlaps with the film thickness measurement region $R_{G2}$ in the wafers $W_M$, $W_P$ after bonding.

Note that, as illustrated in FIG. 75, the region $R_{G11}$ has a length $L_{G11X}$ in the X-direction and the film thickness measurement region $R_{G2}$ has a length $L_{G2X}$ in the X-direction that are larger than the pitches $L_{MX}$, $L_{PX}$ in the X-direction of the dummy pattern described with reference to FIG. 4 and FIG. 6. Similarly, the region $R_{G11}$ has a length $L_{G11Y}$ in the Y-direction and the film thickness measurement region $R_{G2}$ has a length $L_{G2Y}$ in the Y-direction that are larger than the pitches $L_{MY}$, $L_{PY}$ in the Y-direction of the dummy pattern described with reference to FIG. 4 and FIG. 6. The length $L_{G11X}$ in the X-direction and the length $L_{G11Y}$ in the Y-direction of the region $R_{G11}$, and the length $L_{G2X}$ in the X-direction and the length $L_{G2Y}$ in the Y-direction of the film thickness measurement region $R_{G2}$ may, for example, be 5 μm or more.

In the examples in FIG. 80 and FIG. 81, a portion that is neither the recessed portion nor the projecting portion of the wafer $W_M$ is disposed at a position where it overlaps with the recessed portion of the wafer $W_P$ viewing from the Z-direction. However, the portion that is neither the recessed portion nor the projecting portion of the wafer $W_M$ may be disposed at a position where it overlaps with the projecting portion of the wafer $W_P$ viewing from the Z-direction or may be disposed at a position where it overlaps with a portion that is neither the recessed portion nor the projecting portion of the wafer $W_P$. For example, in the example in FIG. 82, the region $R_{TT}$ corresponding to the portion that is neither the recessed portion nor the projecting portion of the wafer $W_M$ and the wiring marked region $R_{D12}$ corresponding to the projecting portion of the wafer $W_P$ are disposed at a position where they overlap with one another.

Note that the examples in FIG. 80 and FIG. 81 exemplary illustrate the film thickness measurement region $R_{G1}$ corresponding to FIG. 71 and the film thickness measurement region $R_{G2}$ corresponding to FIG. 73, respectively, as the recessed portion of the wafer $W_P$. However, the recessed portion in the example in FIG. 80 or FIG. 81 may be the film thickness measurement region $R_{G1}$ corresponding to FIG. 72.

Figure 83:
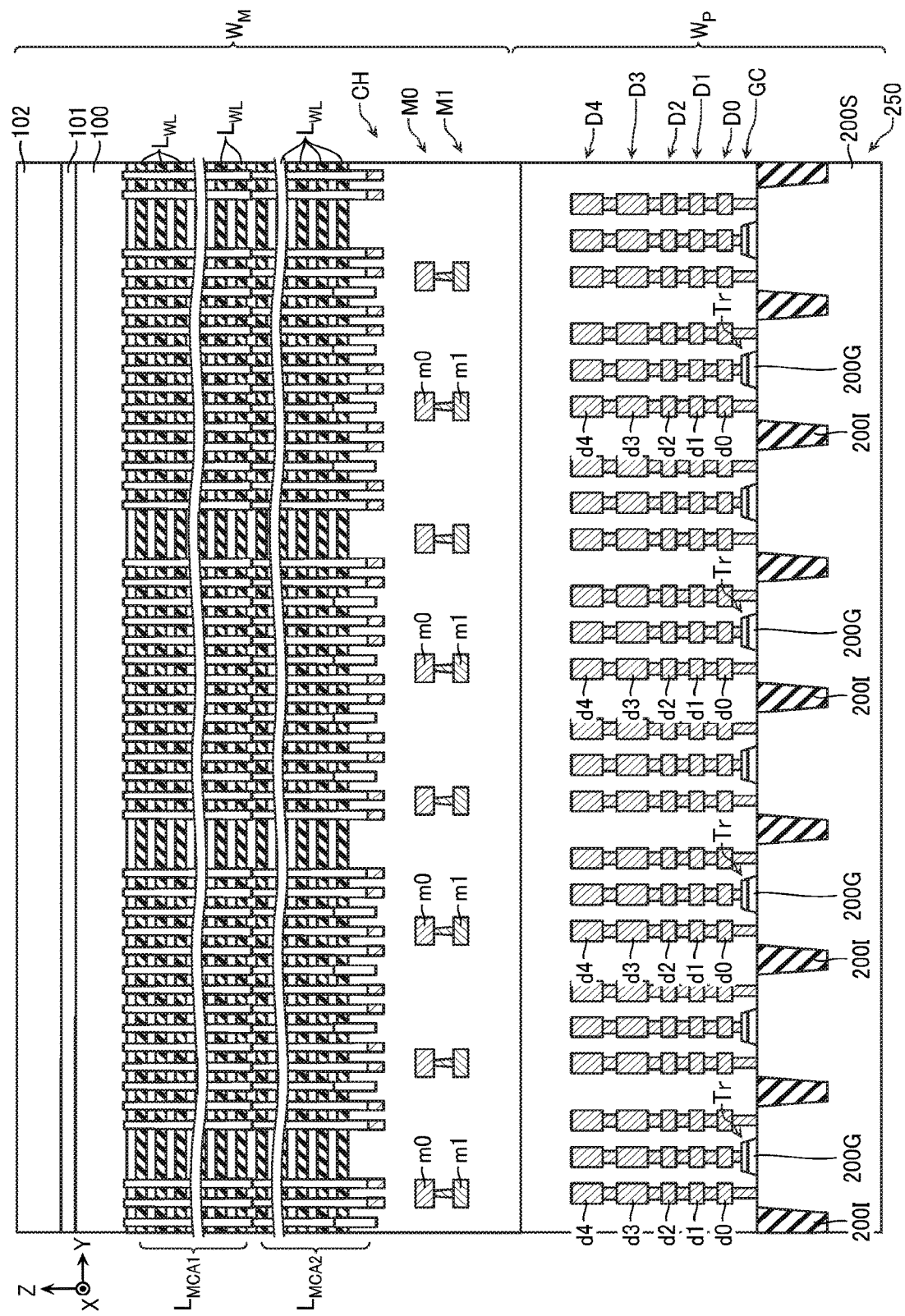
FIG. 83 is a schematic cross-sectional view exemplary illustrating the configurations of the parts of the wafers $W_M$, $W_P$ after bonding.

FIG. 83 exemplary illustrates a configuration of the region $R_N$ in the wafers $W_M$, $W_P$ after bonding.

Figure 84:
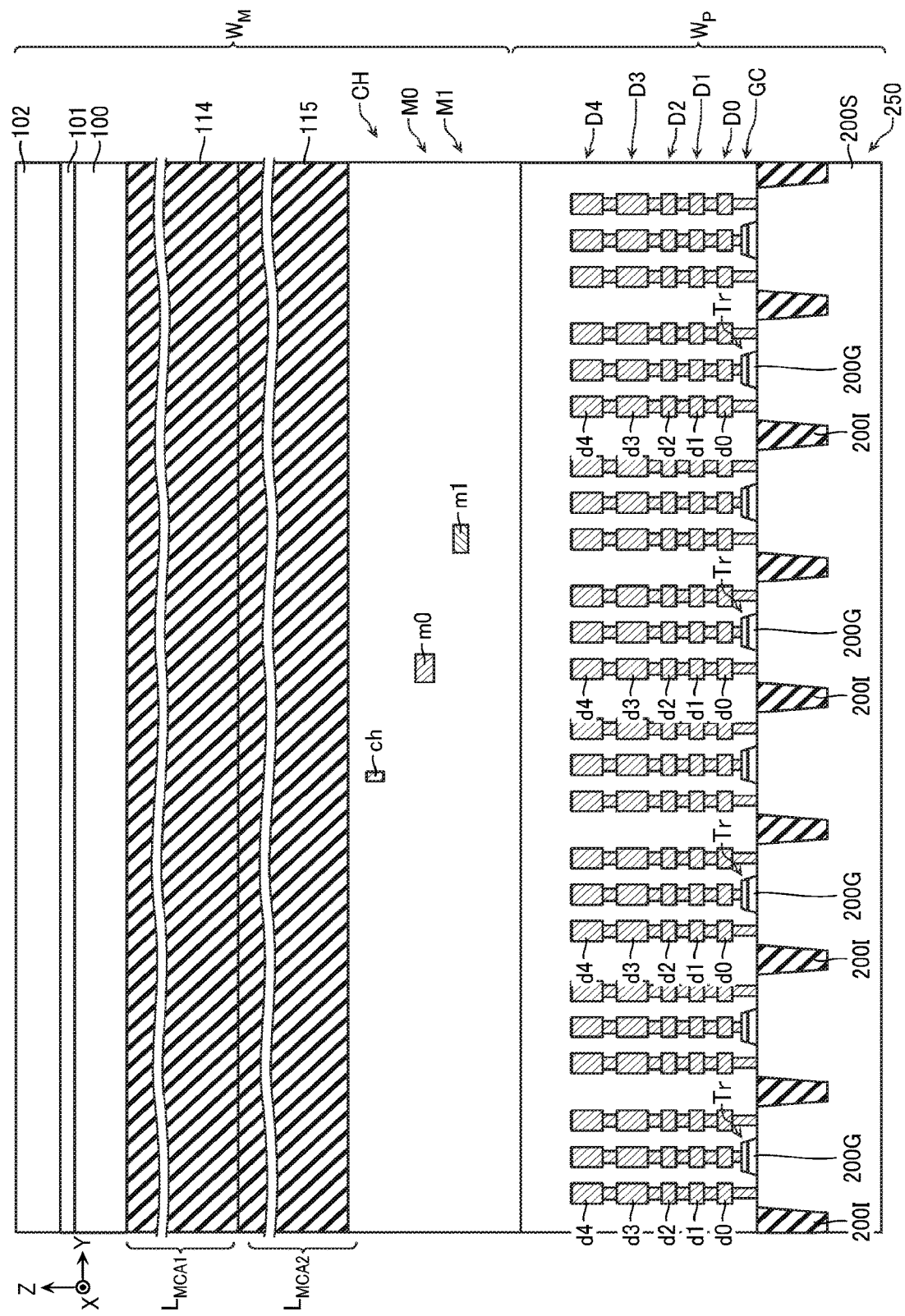
FIG. 84 is a schematic cross-sectional view exemplary illustrating the configurations of the parts of the wafers $W_M$, $W_P$ after bonding.

FIG. 84 exemplary illustrates a configuration of the wiring marked region $R_{D1}$ in the wafers $W_M$, $W_P$ after bonding.

Figure 85:
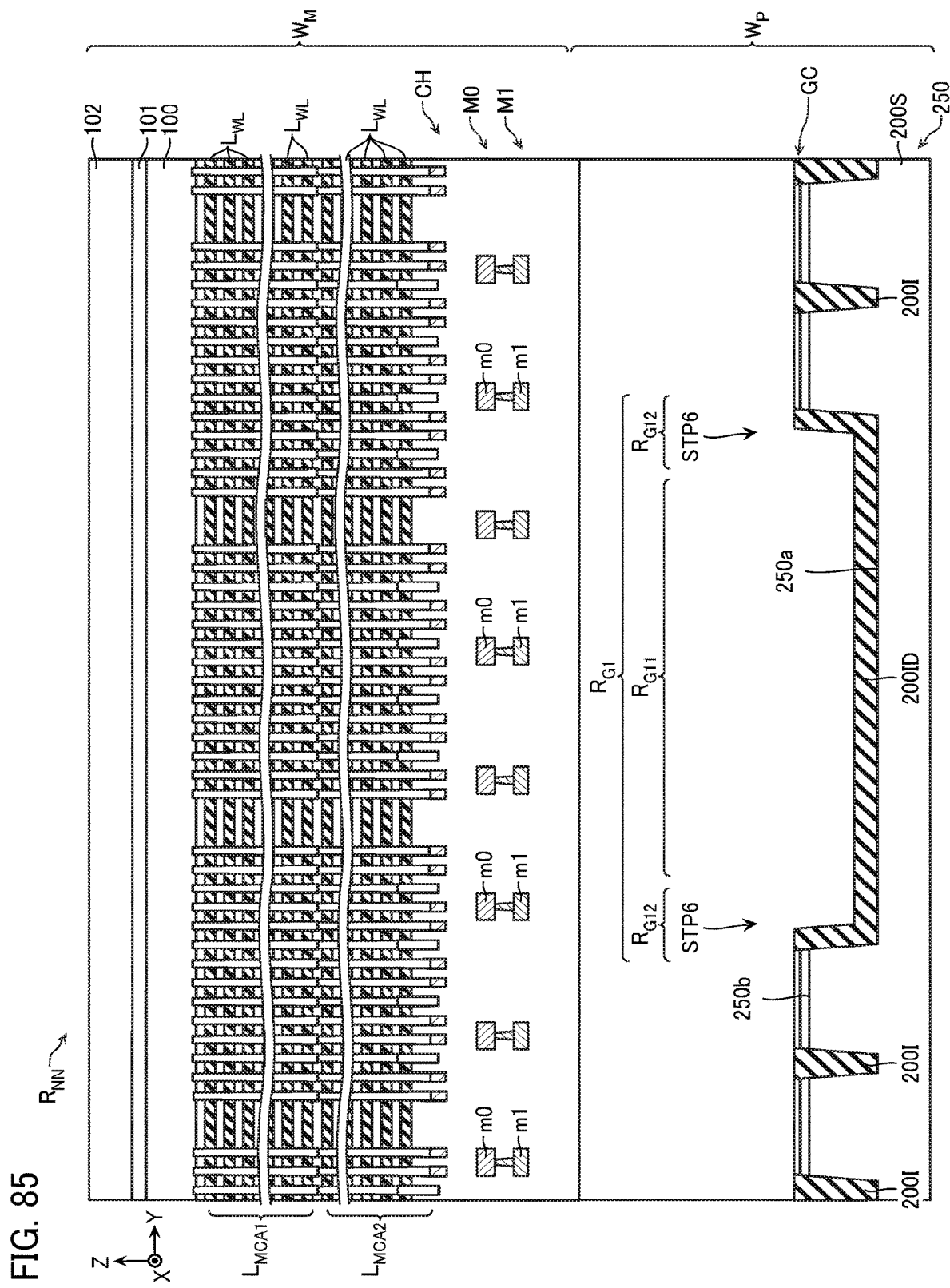
FIG. 85 is a schematic cross-sectional view exemplary illustrating the configurations of the parts of the wafers $W_M$, $W_P$ after bonding.

In the examples in FIG. 83 and FIG. 84, the projecting portion of the wafer $W_M$ is disposed at a position where it overlaps with a portion that is neither the recessed portion nor the projecting portion of the wafer $W_P$. However, the projecting portion of the wafer $W_M$ may be disposed at a position where it overlaps with the recessed portion of the wafer $W_P$ viewing from the Z-direction. FIG. 85 exemplary illustrates a configuration in such wafers $W_M$, $W_P$ after bonding. For example, in the example in FIG. 85, the region $R_{NN}$ corresponding to the projecting portion of the wafer $W_M$ and the film thickness measurement region $R_{G1}$ corresponding to the recessed portion of the wafer $W_P$ are disposed in a position where they overlap with one another viewing from the Z-direction.

The respective examples in FIG. 83 to FIG. 85 exemplary illustrate the region $R_{NN}$ and the wiring marked region $R_{D1}$ as the projecting portion of the wafer $W_M$. However, the projecting portions in the examples in FIG. 83 to FIG. 85 may be the regions $R_{NT}$, $R_{TN}$ corresponding to FIG. 70.

The example in FIG. 85 exemplary illustrates the film thickness measurement region $R_{G1}$ corresponding to FIG. 71 as the recessed portion of the wafer $W_P$. However, the recessed portion in the example in FIG. 85 may be the film thickness measurement region $R_{G1}$ corresponding to FIG. 72 or may be the film thickness measurement region $R_{G2}$ corresponding to FIG. 73.

Note that the configurations described with reference to FIG. 75 to FIG. 85 are merely examples. In the wafers $W_M$, $W_P$ after bonding, each region may be disposed in a layout pattern different from that in FIG. 75. The wafers $W_M$, $W_P$ after bonding do not necessarily include all the configurations as exemplary illustrated in FIG. 76 to FIG. 85.

Second Embodiment

Next, a semiconductor memory device according to a second embodiment will be described. The semiconductor memory device according to the second embodiment is basically configured similarly to the semiconductor memory device according to the first embodiment. However, in the kerf regions $R_K$ of the wafer $W_M$ of the semiconductor memory device according to the second embodiment, a marked region $R_{M3}$ is disposed instead of the marked region $R_{M2}$ described with reference to FIG. 68, FIG. 75, and the like.

FIG. 86 to FIG. 90 are schematic cross-sectional views for describing a method for manufacturing the semiconductor memory device according to the second embodiment.

The semiconductor memory device according to the second embodiment is basically manufactured similarly to the semiconductor memory device according to the first embodiment.

Figure 86:
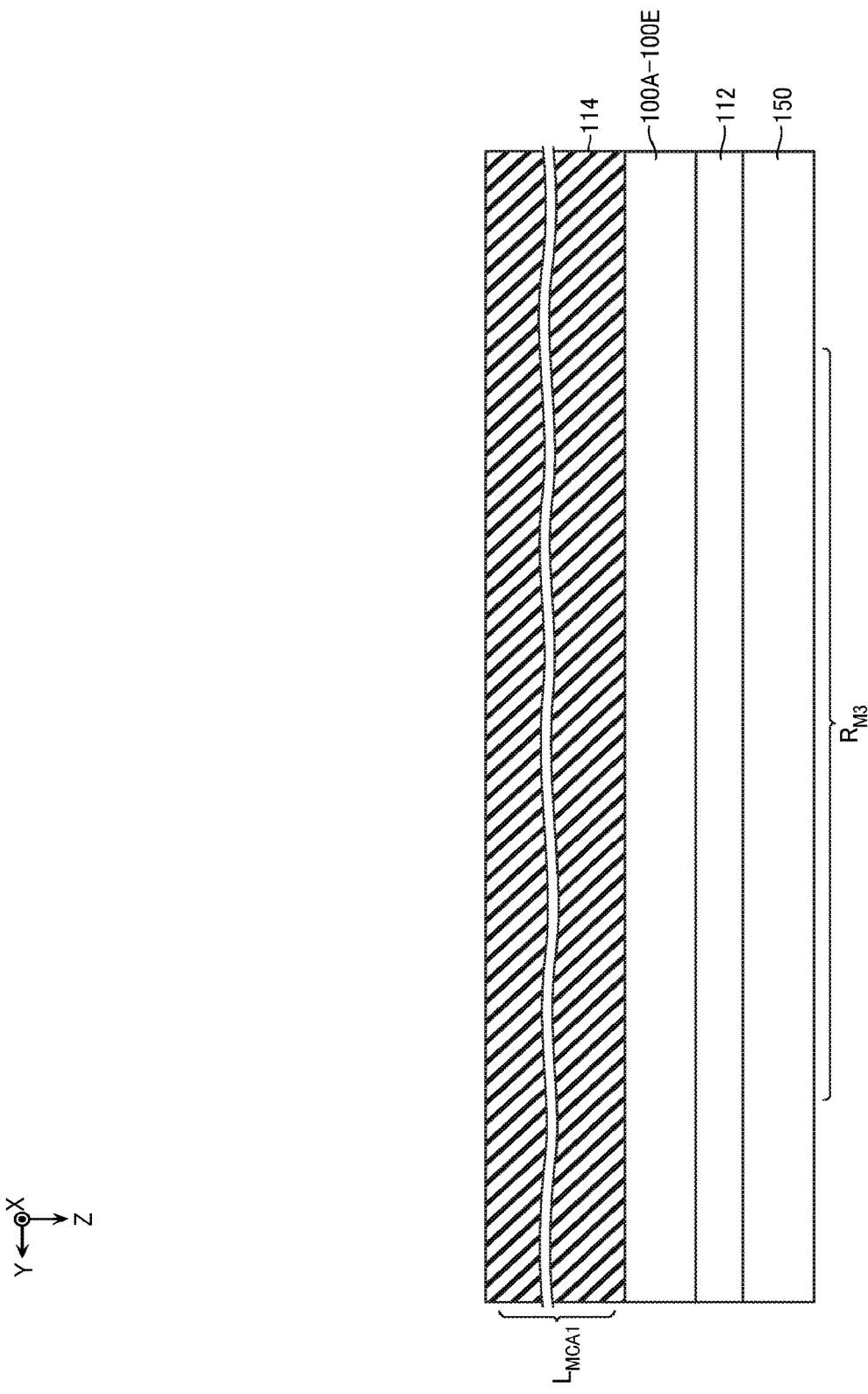
FIG. 86 is a schematic cross-sectional view for describing a method for manufacturing a semiconductor memory device according to a second embodiment.

However, in the method for manufacturing the semiconductor memory device according to the second embodiment, after performing the process described with reference to FIG. 15, and before performing the process described with reference to FIG. 16 and FIG. 17, the plurality of inter-layer insulating layers 111 and sacrifice layers 110A are removed in the marked region $R_{M3}$ and at the proximity thereof, and thus, the insulating layer 114 of, for example, silicon oxide ($SiO_2$) is formed as illustrated in FIG. 86.

Figure 87:
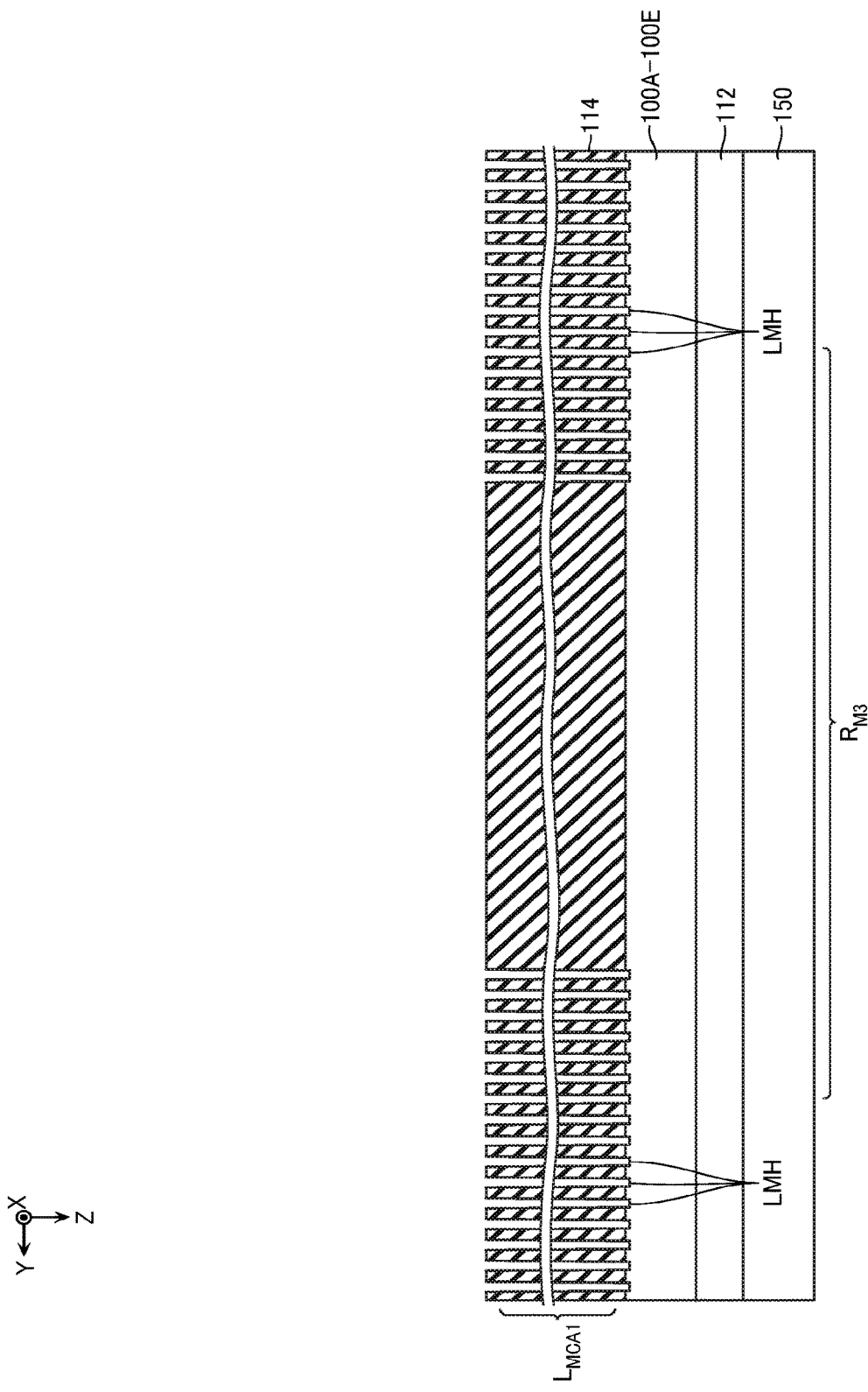
FIG. 87 is a schematic cross-sectional view for describing the same manufacturing method.

In the process described with reference to FIG. 16 and FIG. 17, as illustrated in FIG. 87, the memory holes LMH are not formed in the proximity of the center of the marked region $R_{M3}$ viewing from the Z-direction, and the plurality of memory holes LMH are formed in the proximity of an outer edge of the marked region $R_{M3}$ viewing from the Z-direction. Note that, in this process, the opening LMHA as described with reference to FIG. 17 is not formed.

Figure 88:
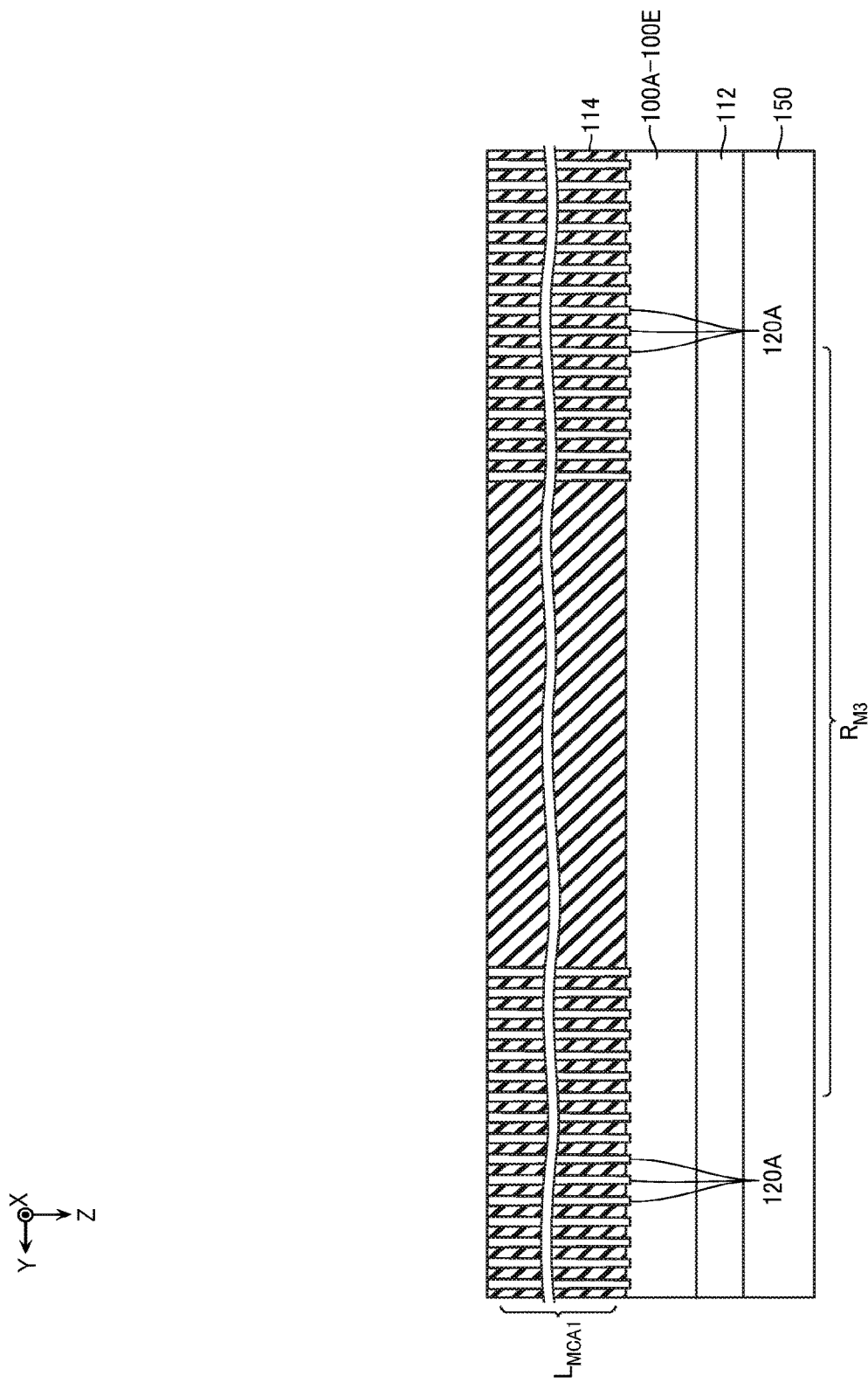
FIG. 88 is a schematic cross-sectional view for describing the same manufacturing method.

In the process described with reference to FIG. 18, as illustrated in FIG. 88, the amorphous silicon films 120A are formed also in the plurality of memory holes LMH disposed in the proximity of the outer edge of the marked region $R_{M3}$.

Figure 89:
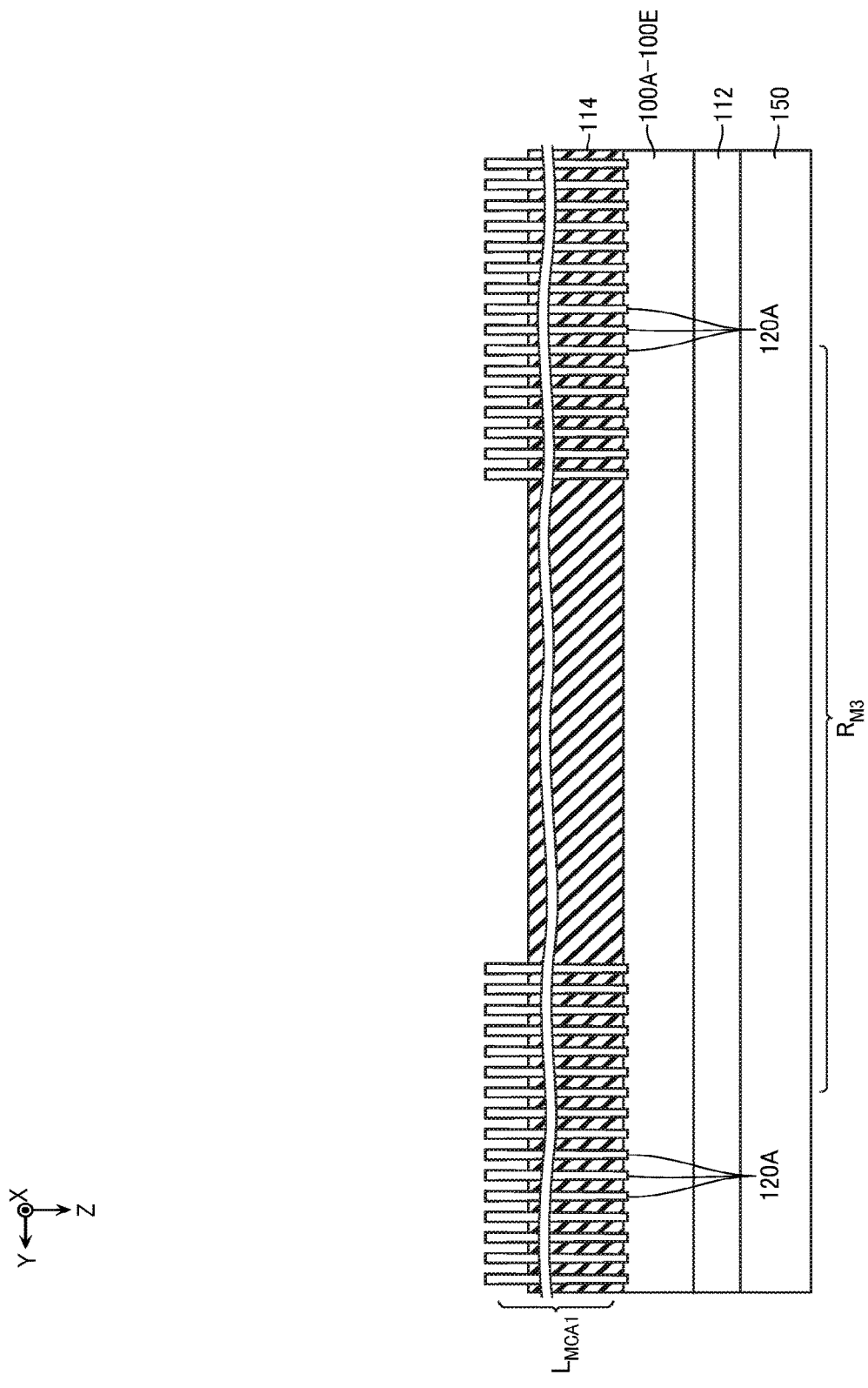
FIG. 89 is a schematic cross-sectional view for describing the same manufacturing method.

After performing the process described with reference to FIG. 19, and before performing the process described with reference to FIG. 20, as illustrated in FIG. 89, parts of the insulating layers 114 are removed inside the marked region $R_{M3}$ and at the proximity of the marked region $R_{M3}$, and thus, outer peripheral surfaces of parts of the plurality of amorphous silicon films 120A are exposed.

Figure 90:
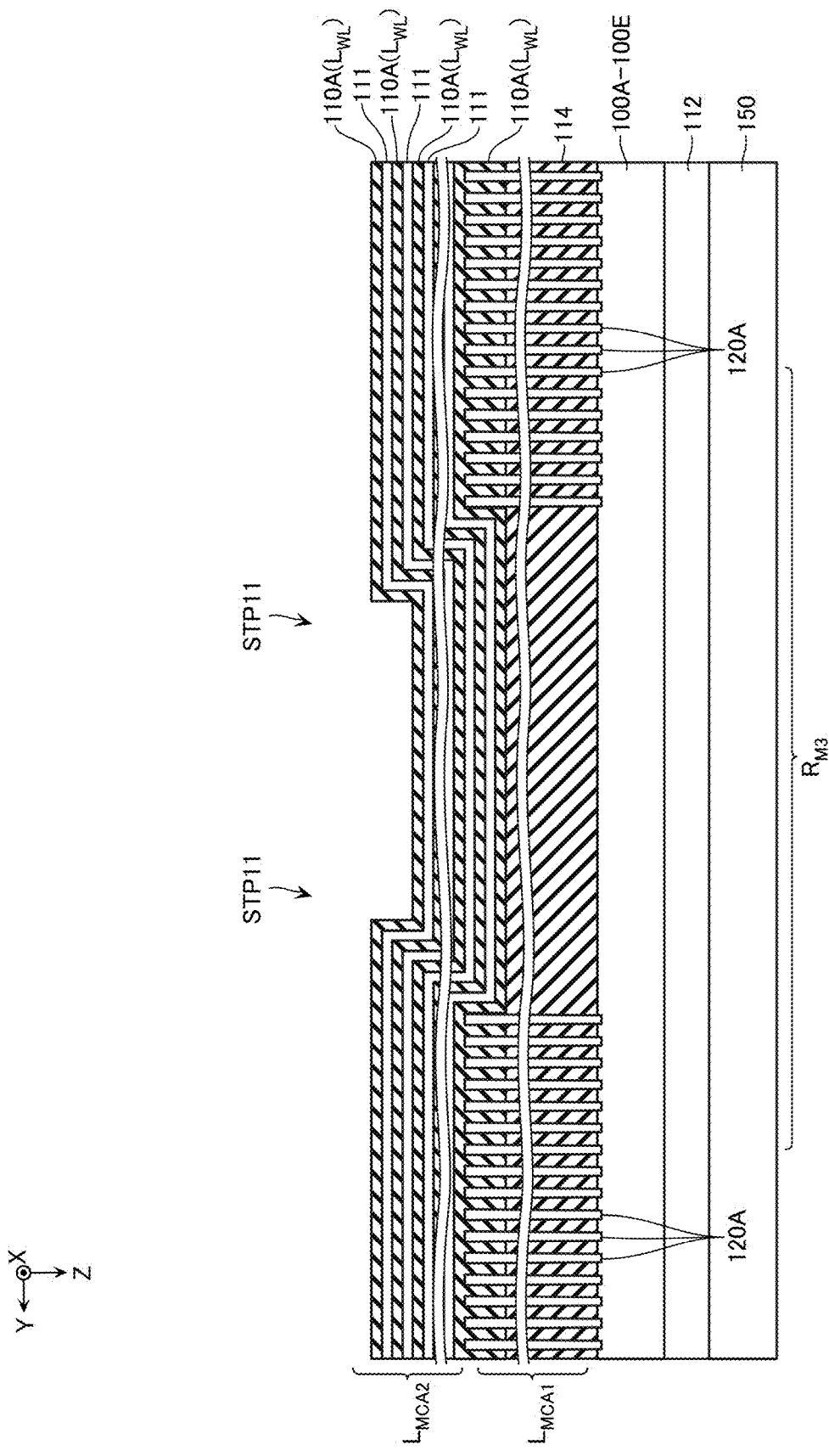
FIG. 90 is a schematic cross-sectional view for describing the same manufacturing method.

In the process described with reference to FIG. 20, as illustrated in FIG. 90, in the marked region $R_{M3}$, the plurality of inter-layer insulating layers 111 and the plurality of sacrifice layers 110A are formed. In this process, the regions between the amorphous silicon films 120A near the outer edge of the marked region $R_{M3}$ are filled with at least one of parts of the inter-layer insulating layers 111 and parts of the sacrifice layers 110A. This forms a step STP11 on a surface of the configuration in the marked region $R_{M3}$.

In the process described with reference to FIG. 23, the memory hole UMH is positioned with the step STP11 described with reference to FIG. 90 as a reference. Here, a position of the step STP11 corresponds to a position of the memory hole LMH (FIG. 87). Therefore, using the step STP11 as a reference ensures preferably positioning the memory hole UMH with respect to the memory hole LMH.

In the process described with reference to FIG. 26, the trench STA is positioned with the step STP11 described with reference to FIG. 90 as a reference.

Figure 91:
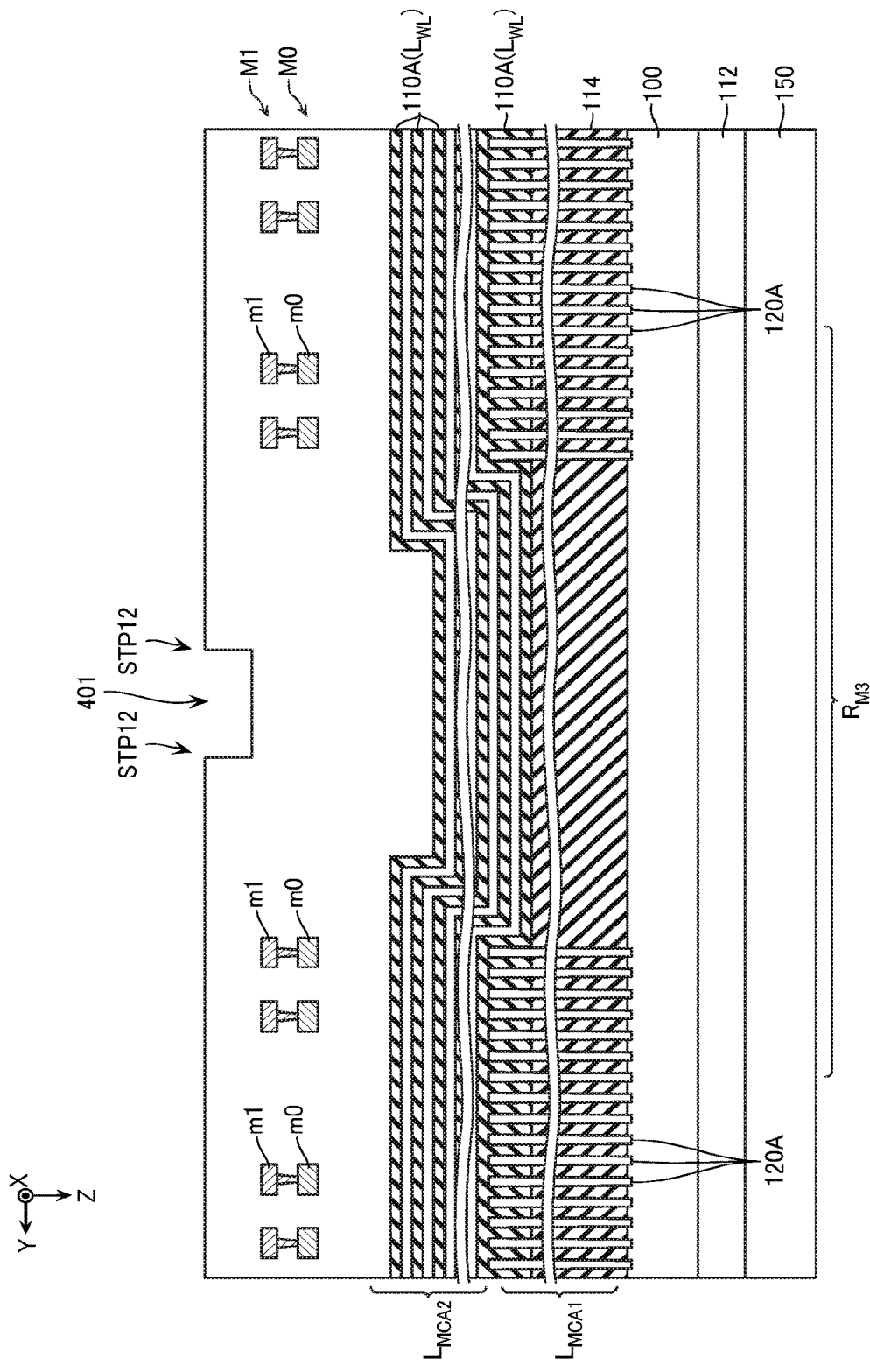
FIG. 91 is a schematic cross-sectional view illustrating a structure in a marked region $R_{M3}$ of the wafer $W_M$.

FIG. 91 is a schematic cross-sectional view illustrating a structure in the marked region $R_{M3}$ of the wafer $W_M$. The marked region $R_{M3}$ is, as described above, usable for positioning the memory hole UMH and the trench STA during the manufacturing process of the semiconductor memory device.

In the marked region $R_{M3}$, the word line layers $L_{WL}$ are not disposed at the height position corresponding to the memory cell array layer $L_{MCA1}$. At the height position corresponding to the memory cell array layer $L_{MCA1}$ in the marked region $R_{M3}$, the insulating layers 114 of, for example, silicon oxide ($SiO_2$) are disposed. In the example in FIG. 91, the amorphous silicon films 120A (columnar structure) are disposed in the proximity of the outer edge of the marked region $R_{M3}$ and the amorphous silicon films 120A are not disposed in the proximity of the center of the marked region $R_{M3}$.

In the marked region $R_{M3}$ and at the proximity thereof, parts of the insulating layers 114 are removed. This forms the step STP11 as described with reference to FIG. 90 in the marked region $R_{M3}$ exemplary illustrated in FIG. 91. In the marked region $R_{M3}$ exemplary illustrated in FIG. 91, the wiring layers M0, M1, and the like are formed along this step. This forms a step STP12 on the surface of the wafer $W_M$. The region surrounded by this step STP12 is a recessed portion 401.

Note that, in the marked region $R_{M3}$ exemplary illustrated in FIG. 91, the plurality of word line layers $L_{WL}$ arranged in the Z-direction each include the sacrifice layer 110A, not the conductive layer 110. In the example in FIG. 91, it is also possible to dispose the plurality of word line layers $L_{WL}$, not the insulating layers 114, in the memory cell array layer $L_{MCA1}$ of the marked region $R_{M3}$. In the example in FIG. 91, it is also possible to form an insulating layer of, for example, silicon oxide ($SiO_2$), not the plurality of word line layers $L_{WL}$, in the memory cell array layer $L_{MCA2}$ of the marked region $R_{M3}$.

Figure 92:
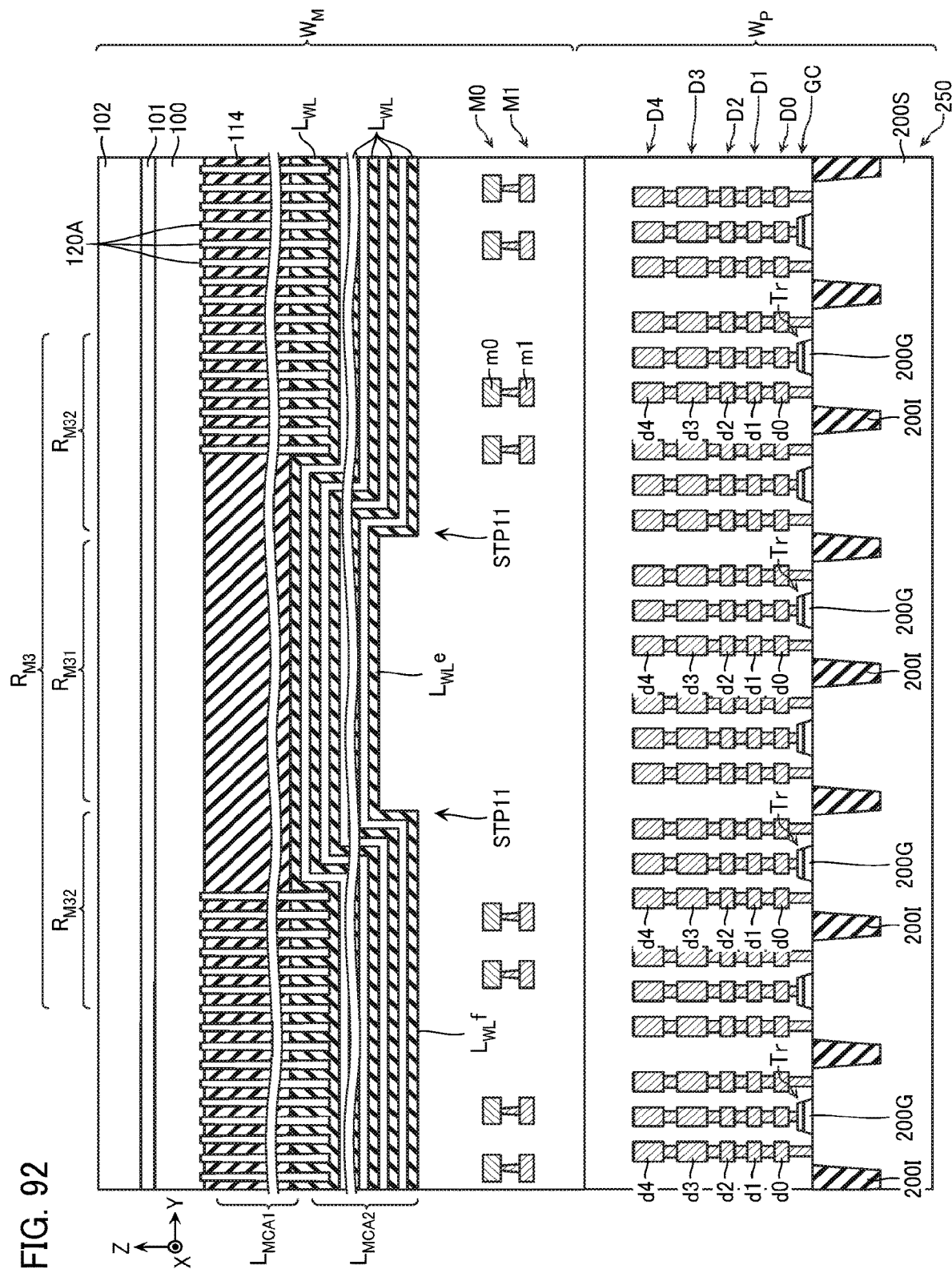
FIG. 92 is a schematic cross-sectional view exemplary illustrating the configurations of parts of the wafers $W_M$, $W_P$ after bonding according to the second embodiment.

Next, with reference to FIG. 92, the configurations in the wafers $W_M$, $W_P$ after bonding are exemplary illustrated. FIG. 92 is a schematic cross-sectional view exemplary illustrating the configurations of parts of the wafers $W_M$, $W_P$ after bonding.

FIG. 92 exemplary illustrates a configuration of the marked region $R_{M3}$ in the wafers $W_M$, $W_P$ after bonding. FIG. 92 illustrates regions $R_{M31}$, $R_{M32}$ in the marked region $R_{M3}$. The region $R_{M32}$ surrounds the region $R_{M31}$ viewing from the Z-direction.

The configuration in the marked region $R_{M3}$ is basically configured similarly to the configuration in the marked region $R_{M2}$ described with reference to FIG. 78.

However, in the example in FIG. 92, in the marked region $R_{M3}$, the word line layers $L_{WL}$ are not disposed in the memory cell array layer $L_{MCA1}$, and instead, the insulating layer 114 is formed.

The region $R_{M31}$ includes portions $L_{WL}e$ of the word line layers $L_{WL}$ in the memory cell array layer $L_{MCA2}$. This portion $L_{WL}e$ is surrounded by a portion $L_{WL}f$ viewing from the Z-direction. The portion $L_{WL}e$ is disposed above the portion $L_{WL}f$ (that is, is farther from the wafer $W_P$ than the portion $L_{WL}f$). The region $R_{M32}$ includes a step disposed between the portion $L_{WL}e$ and the portion $L_{WL}f$. Note that the step disposed on the word line layer $L_{WL}$ as the lowermost layer corresponds to the step STP11 described with reference to FIG. 90.

Here, in FIG. 92, the word line layer $L_{WL}$ as the uppermost layer in the memory cell array layer $L_{MCA2}$ is illustrated as a word line layer $L_{WL}'$. As described above, in the process described with reference to FIG. 90, at least the parts of the regions between the amorphous silicon films 120A near the outer edge of the marked region $R_{M3}$ are filled with the sacrifice layer 110A corresponding to the word line layer $L_{WL}'$. Therefore, the portion $L_{WL}f$ of the word line layer $L_{WL}'$ includes portions extending in the Z-direction along outer peripheral surfaces of the plurality of amorphous silicon films 120A. Therefore, in the word line layer $L_{WL}'$, the portion $L_{WL}f$ has a length in the Z-direction (a distance between a position in the Z-direction on an upper surface of the portion $L_{WL}f$ and a position in the Z-direction on a lower surface of the portion $L_{WL}f$) larger than a length in the Z-direction of the portion $L_{WL}e$ (a distance between a position in the Z-direction on an upper surface of the portion $L_{WL}e$ and a position in the Z-direction on a lower surface of the portion $L_{WL}e$).

Note that, in the example in FIG. 92, the recessed portion of the wafer $W_M$ is disposed at a position where it overlaps with a portion that is neither the recessed portion nor the projecting portion of the wafer $W_P$ viewing from the Z-direction. However, as described above, the recessed portion of the wafer $W_M$ may be disposed at a position where it overlaps with the projecting portion of the wafer $W_P$ viewing from the Z-direction. For example, the marked region $R_{M3}$ corresponding to the recessed portion of the wafer $W_M$ and the wiring marked region $R_{D2}$ corresponding to the projecting portion of the wafer $W_P$ may be disposed at a position where they overlap with one another.

Also in the semiconductor memory device according to the second embodiment, the layouts on the wafers $W_M$, $W_P$ are adjusted such that the recessed portion of the wafer $W_M$ does not overlap with the recessed portion of the wafer $W_P$. Similarly, the layouts on the wafers $W_M$, $W_P$ are adjusted such that the projecting portion of the wafer $W_M$ does not overlap with the projecting portion of the wafer $W_P$. Such a method ensures reducing a generation of a void by keeping the sizes of unevenness between the wafers $W_M$ and $W_P$ in a range of permissible amount.

Other Embodiments

The semiconductor memory devices according to the first embodiment and the second embodiment have been described above. However, the above-described semiconductor memory devices are merely examples, and the specific configuration and the like are appropriately adjustable. For example, the plurality of configurations exemplary illustrated as the recessed portions and the projecting portions of the wafers $W_M$, $W_P$ may be appropriately omitted. For example, in the semiconductor memory devices according to the first embodiment and the second embodiment, one of the two marked regions $R_{M1}$ exemplary illustrated with reference to FIG. 66 and FIG. 67 can be omitted. Another region can also be omitted.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising
a first wafer and a second wafer bonded via a plurality of bonding electrodes, wherein
the first wafer and the second wafer include:
  a plurality of memory regions including a plurality of memory cell arrays or a plurality of peripheral circuits connected to the plurality of memory cell arrays; and
  a plurality of kerf regions, a kerf region of the plurality of kerf regions being disposed between each two of the plurality of memory regions, the plurality of kerf regions in the first wafer including a first region, the plurality of kerf regions in the second wafer including a second region, the first region and the second region being not used for inputting/outputting a voltage or a signal to/from the memory cell array,
the first wafer includes:
  a semiconductor substrate; and
  an electrode layer including a plurality of electrodes disposed in one of the plurality of memory regions, the plurality of electrodes being disposed between the semiconductor substrate and the second wafer in a first direction intersecting with a surface of the semiconductor substrate facing the second wafer,
the plurality of electrodes are not disposed in the first region, or the surface of the semiconductor substrate facing the second wafer includes a first portion disposed in the first region and a second portion surrounding the first portion when viewed in the first direction, the first portion is farther from the second wafer than the second portion, and a step is disposed between the first portion and the second portion,
the second wafer includes:
  a plurality of layers arranged in the first direction, the plurality of layers including a plurality of first conductive layers disposed in one memory region of the plurality of memory regions; and
  a plurality of semiconductor columns disposed in the one memory region, the plurality of semiconductor columns extending in the first direction and penetrating the plurality of first conductive layers,
a plurality of first layers as at least parts of the plurality of layers each include a third portion disposed in the second region and a fourth portion surrounding the third portion when viewed in the first direction, the third portion is farther from the first wafer than the fourth portion, and a step is disposed between the third portion and the fourth portion, and
the first region and the second region are disposed at positions where the first region and the second region do not overlap when viewed in the first direction.

2. The semiconductor memory device according to claim 1, wherein
the one of the plurality of memory regions of the first wafer includes:
  a peripheral circuit region where one of the plurality of peripheral circuits is disposed; and
  a pattern region disposed between the peripheral circuit region and one of the plurality of kerf regions nearest to the peripheral circuit region,
in the pattern region, the semiconductor substrate includes a plurality of patterns arranged at a first pitch in a second direction intersecting with the first direction and arranged at a second pitch in a third direction intersecting with the first direction and the second direction, and
the first region has lengths in the second direction and the third direction larger than the first pitch and the second pitch, respectively.

3. The semiconductor memory device according to claim 1, wherein
the plurality of electrodes are not disposed in the first region, and the surface of the semiconductor substrate facing the second wafer includes the first portion and the second portion.

4. The semiconductor memory device according to claim 1, wherein
the second wafer further includes a wiring layer farther from the first wafer than the plurality of layers,
the wiring layer includes:
  a second conductive layer disposed in the one memory region, the second conductive layer being connected to the plurality of semiconductor columns; and
  a third conductive layer arranged with the second conductive layer in a direction along the surface of the semiconductor substrate, the third conductive layer including a fifth portion overlapping with the fourth portion of the plurality of first layers when viewed in the first direction, and
a surface of the third portion included in one of the plurality of first layers facing away from the first wafer is disposed farther from the first wafer than a surface of the fifth portion facing the first wafer.

5. The semiconductor memory device according to claim 1, wherein
the plurality of semiconductor columns each include a first semiconductor region and a second semiconductor region disposed between the first semiconductor region and the first wafer,
a width in a second direction intersecting with the first direction of an end portion of the first semiconductor region facing away from the semiconductor substrate in the first direction is a first width,
a width in the second direction of an end portion of the first semiconductor region facing toward a side of the semiconductor substrate in the first direction is a second width,
a width in the second direction of an end portion of the second semiconductor region facing away from the semiconductor substrate in the first direction is a third width, and
a width in the second direction of an end portion of the second semiconductor region facing toward a side of the semiconductor substrate in the first direction is a fourth width,
the first width and the third width are smaller than the second width and the fourth width, respectively.

6. The semiconductor memory device according to claim 5, wherein
the first conductive layers included in the plurality of first layers are each penetrated by the second semiconductor region.

7. The semiconductor memory device according to claim 6, wherein
one of the plurality of first layers farthest from the first wafer among the plurality of first layers is a second layer,
in the second layer, the fourth portion has a length in the first direction approximately equal to a length in the first direction of the third portion.

8. The semiconductor memory device according to claim 6, wherein
the second wafer further includes a plurality of columnar structures disposed in a part of a region corresponding to the fourth portion, the plurality of first layers are disposed between the plurality of columnar structures and the semiconductor substrate,
one of the plurality of first layers farthest from the first wafer among the plurality of first layers is a second layer,
in the second layer, the fourth portion has a length in the first direction larger than a length in the first direction of the third portion.

9. A semiconductor memory device comprising
a first wafer and a second wafer bonded via a plurality of bonding electrodes, wherein
the first wafer and the second wafer include:
a plurality of memory regions including a plurality of memory cell arrays or a plurality of peripheral circuits connected to the plurality of memory cell arrays; and
a plurality of kerf regions, a kerf region of the plurality of kerf regions being disposed between each two of the plurality of memory regions, the plurality of kerf regions in the first wafer including a first region, the plurality of kerf regions in the second wafer including a second region, the first region and the second region being not used for inputting/outputting a voltage or a signal to/from the memory cell array,
the first wafer includes:
a semiconductor substrate;
an electrode layer including a plurality of electrodes disposed in one of the plurality of memory regions, the plurality of electrodes being disposed between the semiconductor substrate and the second wafer in a first direction intersecting with a surface of the semiconductor substrate facing the second wafer; and
a first wiring layer disposed between the electrode layer and the second wafer, the first wiring layer including a plurality of first wirings,
the one of the plurality of memory regions of the first wafer includes:
a peripheral circuit region in which one of the plurality of peripheral circuits is disposed; and
a first pattern region disposed between the peripheral circuit region and one of the plurality of kerf regions nearest to the peripheral circuit region,
in the first pattern region, the first wiring layer includes a plurality of first patterns arranged at a first pitch in a second direction intersecting with the first direction and arranged at a second pitch in a third direction intersecting with the first direction and the second direction,
the first region does not include the plurality of first patterns,
the second wafer includes:
a plurality of layers arranged in the first direction, the plurality of layers including a plurality of first conductive layers disposed in one memory region of the plurality of memory regions;
a plurality of semiconductor columns disposed in the one memory region, the plurality of semiconductor columns extending in the first direction and penetrating the plurality of first conductive layers; and
a second wiring layer disposed between the plurality of layers and the first wafer, the second wiring layer including a plurality of second wirings,
the one memory region of the second wafer includes:
a memory cell array region in which one of the plurality of memory cell arrays is disposed; and
a second pattern region disposed between the memory cell array region and one of the plurality of kerf regions nearest to the memory cell array region,
in the second pattern region, the second wiring layer includes a plurality of second patterns arranged at a third pitch in the second direction and arranged at a fourth pitch in the third direction,
the second region does not include the plurality of second patterns, and
the first region and the second region are disposed at positions where the first region and the second region do not overlap when viewed in the first direction.

10. The semiconductor memory device according to claim 9, wherein
the plurality of first wirings and the plurality of second wirings contain tungsten (W).

11. The semiconductor memory device according to claim 9, wherein
the plurality of second wirings are via-contact electrodes connected to end portions of the plurality of semiconductor columns facing toward a side of the semiconductor substrate in the first direction.

12. The semiconductor memory device according to claim 9, wherein
the second wafer includes
a third wiring layer disposed between the second wiring layer and the plurality of layers, the third wiring layer including a plurality of bit lines electrically connected to the plurality of semiconductor columns.

13. The semiconductor memory device according to claim 9, wherein
the first wafer further includes a fourth wiring layer disposed between the electrode layer and the second wafer, the fourth wiring layer having a level different from a level of the first wiring layer in the first direction,
the first wiring layer includes a first conductive member disposed in the first region,
the fourth wiring layer includes a second conductive member disposed in the first region,
the first conductive member is disposed at a position where the first conductive member does not overlap with the second conductive member or any wiring in the fourth wiring layer when viewed in the first direction, and
the second conductive member is disposed at a position where the second conductive member does not overlap with the first conductive member or any wiring in the first wiring layer when viewed in the first direction.

14. The semiconductor memory device according to claim 9, wherein
the second wafer further includes a fifth wiring layer disposed between the plurality of layers and the first wafer, the fifth wiring layer having a level different from a level of the second wiring layer in the first direction,
the second wiring layer includes a third conductive member disposed in the second region,
the fifth wiring layer includes a fourth conductive member disposed in the second region,
the third conductive member is disposed at a position where the third conductive member does not overlap with the fourth conductive member or any wiring in the fifth wiring layer when viewed in the first direction, and
the fourth conductive member is disposed at a position where the fourth conductive member does not overlap with the third conductive member or any wiring in the second wiring layer when viewed in the first direction.

15. A semiconductor memory device comprising
a first wafer and a second wafer bonded via a plurality of bonding electrodes, wherein
the first wafer and the second wafer include:
a plurality of memory regions including a plurality of memory cell arrays or a plurality of peripheral circuits connected to the plurality of memory cell arrays; and
a plurality of kerf regions, a kerf region of the plurality of kerf regions being disposed between each two of the plurality of memory regions, the plurality of kerf regions in the first wafer including a first region, the plurality of kerf regions in the second wafer including a second region, the first region and the second region being not used for inputting/outputting a voltage or a signal to/from the memory cell array,
the first wafer includes:
a semiconductor substrate;
an electrode layer including a plurality of electrodes disposed in one of the plurality of memory regions, the plurality of electrodes being disposed between the semiconductor substrate and the second wafer in a first direction intersecting with a surface of the semiconductor substrate facing the second wafer; and
a first wiring layer disposed between the electrode layer and the second wafer, the first wiring layer including a plurality of first wirings,
the one of the plurality of memory regions of the first wafer includes:
a peripheral circuit region in which one of the plurality of peripheral circuits is disposed; and
a pattern region disposed between the peripheral circuit region and one of the plurality of kerf regions nearest to the peripheral circuit region,
in the pattern region, the first wiring layer includes a plurality of patterns arranged at a first pitch in a second direction intersecting with the first direction and arranged at a second pitch in a third direction intersecting with the first direction and the second direction
the first region does not include the plurality of patterns,
the second wafer includes:
a plurality of layers arranged in the first direction, the plurality of layers including a plurality of first conductive layers disposed in one memory region of the plurality of memory regions; and
a plurality of semiconductor columns disposed in the one memory region, the plurality of semiconductor columns extending in the first direction and penetrating the plurality of first conductive layers,
at least parts of the plurality of layers each include a portion disposed in an isolated pattern shape in the second region, the portion containing a material different from a material of the first conductive layer, and
the first region and the second region are disposed at positions where the first region and the second region do not overlap when viewed in the first direction.

16. The semiconductor memory device according to claim 15, wherein
the plurality of first wirings contains tungsten (W).

17. The semiconductor memory device according to claim 15, wherein
the plurality of semiconductor columns each include a first semiconductor region and a second semiconductor region disposed between the first semiconductor region and the first wafer,
a width in the second direction of an end portion of the first semiconductor region facing away from the semiconductor substrate in the first direction is a first width,
a width in the second direction of an end portion of the first semiconductor region facing toward a side of the semiconductor substrate in the first direction is a second width,
a width in the second direction of an end portion of the second semiconductor region facing away from the semiconductor substrate in the first direction is a third width, and
a width in the second direction of an end portion of the second semiconductor region facing toward a side of the semiconductor substrate in the first direction is a fourth width,
the first width and the third width are smaller than the second width and the fourth width, respectively.

18. The semiconductor memory device according to claim 17, wherein
the plurality of layers include:
a plurality of first layers including a first part of the plurality of first conductive layers penetrated by one of the first semiconductor region and the second semiconductor region; and
a plurality of second layers including a second part of the plurality of first conductive layers penetrated by the other of the first semiconductor region and the second semiconductor region, and
either or both of the first layers and the second layers includes a portion disposed in the second region.

19. The semiconductor memory device according to claim 15, wherein
the first wafer further includes a wiring layer disposed between the electrode layer and the second wafer, the wiring layer having a different level from a level of the first wiring layer in the first direction,
the first wiring layer includes a first conductive member disposed in the first region, the wiring layer having the different level includes a second conductive member disposed in the first region,
the first conductive member is disposed at a position where the first conductive member does not overlap with the second conductive member or any wiring in the wiring layer having the different level when viewed in the first direction, and
the second conductive member is disposed at a position where the second conductive member does not overlap with the first conductive member or any wiring in the first wiring layer when viewed in the first direction.

* * * * *